US009972657B2

(12) United States Patent
Tajima et al.

(10) Patent No.: US 9,972,657 B2
(45) Date of Patent: May 15, 2018

(54) SEMICONDUCTOR LIGHT EMITTING ELEMENT

(71) Applicant: Kabushiki Kaisha Toshiba, Minato-ku (JP)

(72) Inventors: Jumpei Tajima, Koganei (JP); Hiroshi Ono, Setagaya (JP); Toshihide Ito, Minato (JP); Kenjiro Uesugi, Fuchu (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 15/500,974

(22) PCT Filed: Jul. 28, 2015

(86) PCT No.: PCT/JP2015/003770
§ 371 (c)(1),
(2) Date: Feb. 1, 2017

(87) PCT Pub. No.: WO2016/021146
PCT Pub. Date: Feb. 11, 2016

(65) Prior Publication Data
US 2017/0221962 A1    Aug. 3, 2017

(30) Foreign Application Priority Data

Aug. 7, 2014  (JP) .................................. 2014-161208
Feb. 16, 2015 (JP) .................................. 2015-027958

(51) Int. Cl.
*H01L 33/38*      (2010.01)
*H01L 27/15*      (2006.01)
(Continued)

(52) U.S. Cl.
CPC ............ *H01L 27/156* (2013.01); *H01L 33/08* (2013.01); *H01L 33/22* (2013.01); *H01L 33/387* (2013.01);
(Continued)

(58) Field of Classification Search
CPC .................................................... H01L 25/167
See application file for complete search history.

(56) References Cited

U.S. PATENT DOCUMENTS 8,258,533 B2    9/2012  Seo et al.
9,324,691 B2 *  4/2016  Jing .................... H01L 25/0753
(Continued)

FOREIGN PATENT DOCUMENTS

JP    2010-87515 A    4/2010
JP    2011-139038 A   7/2011
(Continued)

OTHER PUBLICATIONS

International Search Report and Written Opinion dated Dec. 3, 2015, in PCT/JP2015/003770 filed Jul. 28, 2015.

*Primary Examiner* — Thao P Le
(74) *Attorney, Agent, or Firm* — Oblon, McClelland, Maier & Neustadt, L.L.P.

(57) ABSTRACT

According to one embodiment, a semiconductor light emitting element (110) includes a metal layer (40), a first to a fourth semiconductor layers (10a, 20a, 10b, 20b), a first and a second light emitting layers (30a, 30b), a first to a sixth electrodes (e1-e6), and a first inter-element interconnect section (12). The first semiconductor layer (10a) includes a first to a third regions (r1-r3). The second semiconductor layer (20a) is provided between the first region (r1) and the metal layer (40) and between the second region (r2) and the metal layer (40). The third semiconductor layer (10b) includes a fourth to a sixth regions (r4-r6). The fourth
(Continued)

semiconductor layer (20b) is provided between the fourth region (r4) and the metal layer (40) and between the fifth region (r5) and the metal layer (40). The first inter-element interconnect section (12) is provided between the second electrode (e2) and the metal layer (40) and between the sixth electrode (e6) and the metal layer (40).

20 Claims, 38 Drawing Sheets

(51) Int. Cl.
  *H01L 33/22* (2010.01)
  *H01L 33/40* (2010.01)
  *H01L 33/08* (2010.01)
  *H01L 33/62* (2010.01)
  *H01L 33/20* (2010.01)
(52) U.S. Cl.
  CPC ............ *H01L 33/405* (2013.01); *H01L 33/62* (2013.01); *H01L 33/20* (2013.01); *H01L 33/38* (2013.01)

(56) References Cited

U.S. PATENT DOCUMENTS

| | | |
|---|---|---|
| 2001/0032985 A1 | 10/2001 | Bhat et al. |
| 2006/0154393 A1 | 7/2006 | Doan et al. |
| 2010/0078656 A1 | 4/2010 | Seo et al. |
| 2011/0089442 A1 | 4/2011 | Jing et al. |
| 2011/0156064 A1 | 6/2011 | Seo |
| 2011/0220932 A1 | 9/2011 | Katsuno et al. |
| 2011/0233587 A1 | 9/2011 | Unno |
| 2013/0299867 A1* | 11/2013 | Illek ...................... H01L 27/153 257/99 |

FOREIGN PATENT DOCUMENTS

| | | |
|---|---|---|
| JP | 2011-187873 A | 9/2011 |
| JP | 2011-199221 A | 10/2011 |
| JP | 2012-54422 A | 3/2012 |
| TW | 200707795 A | 2/2007 |
| WO | WO 2015/190025 A1 | 12/2015 |

* cited by examiner

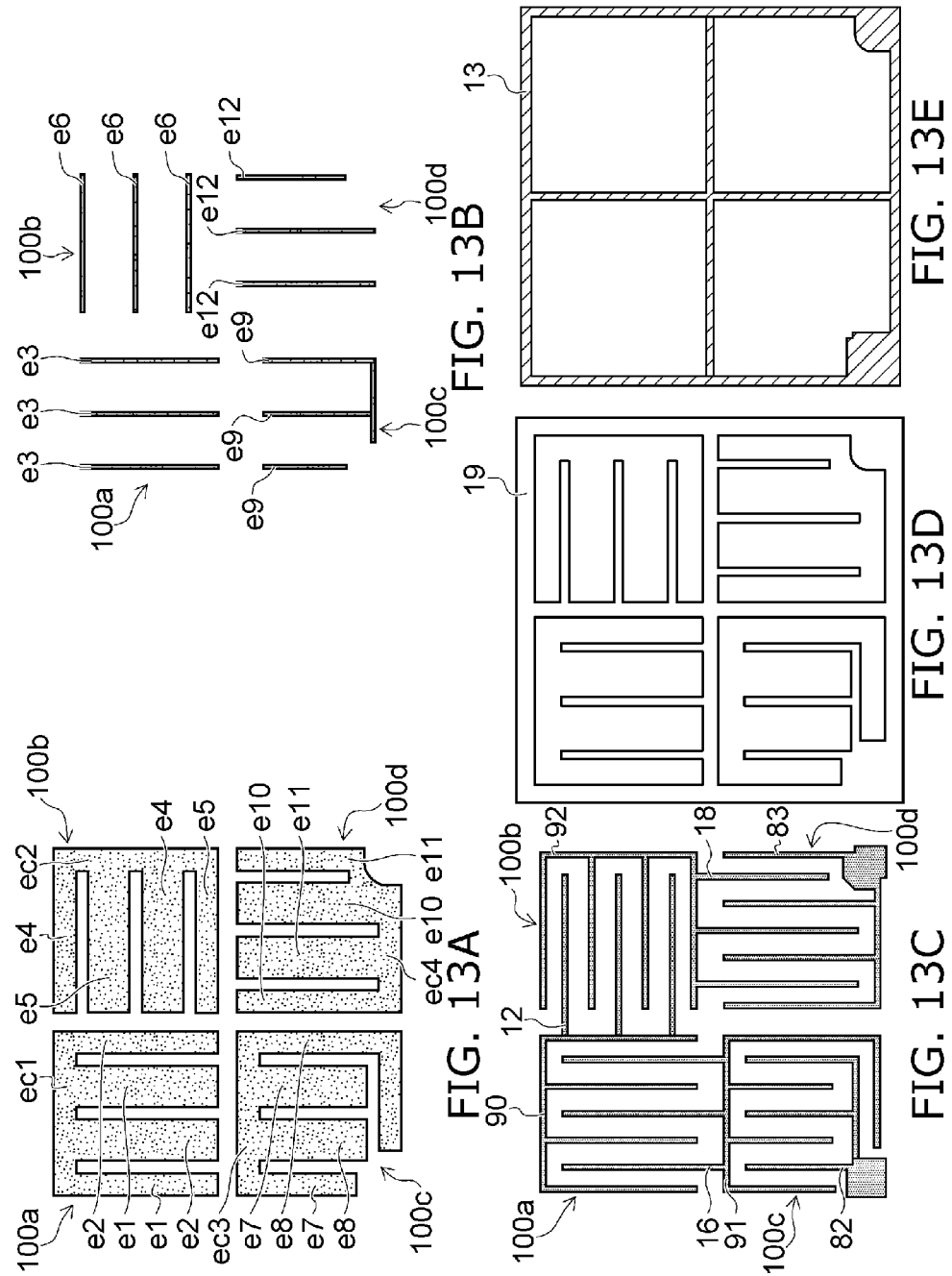

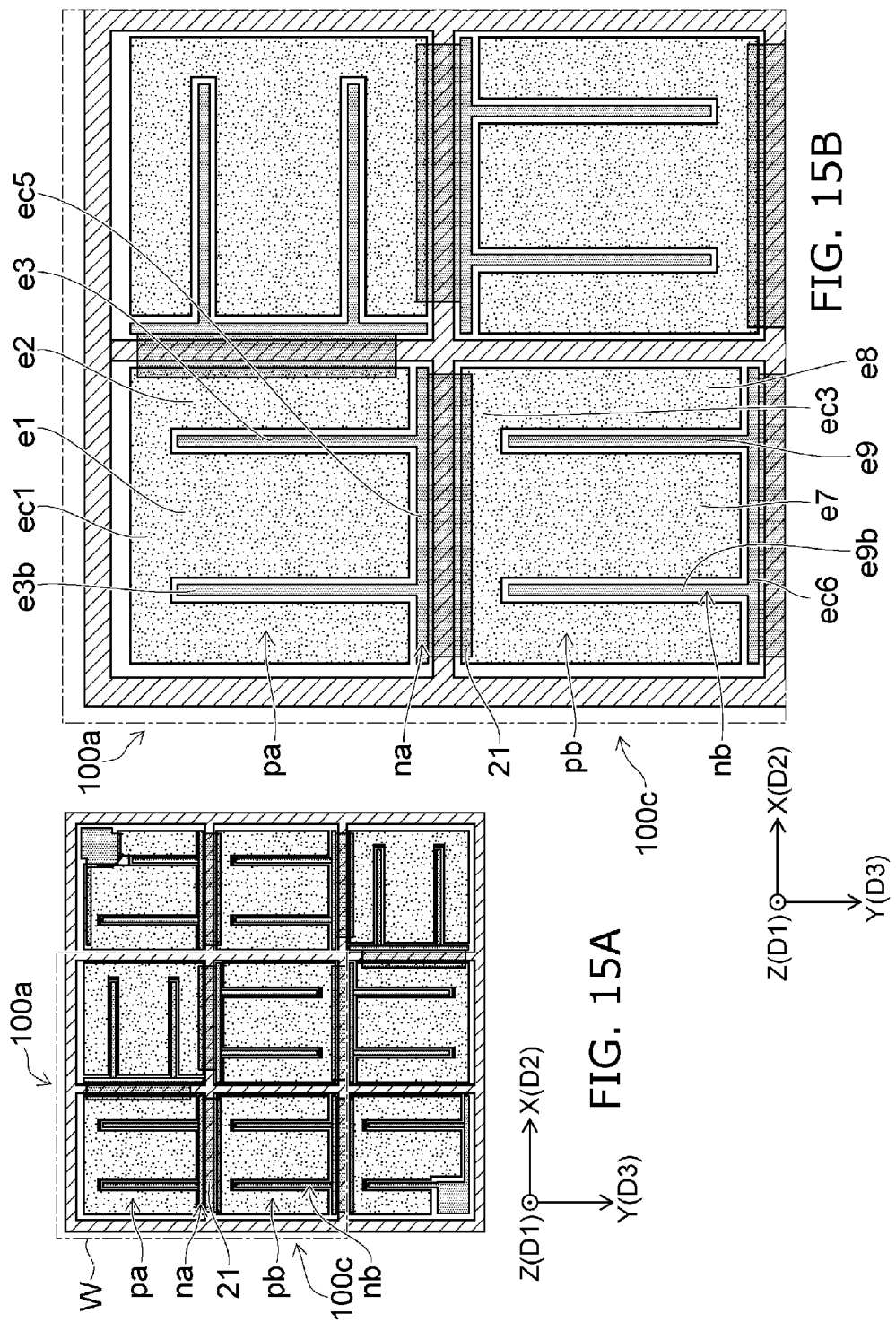

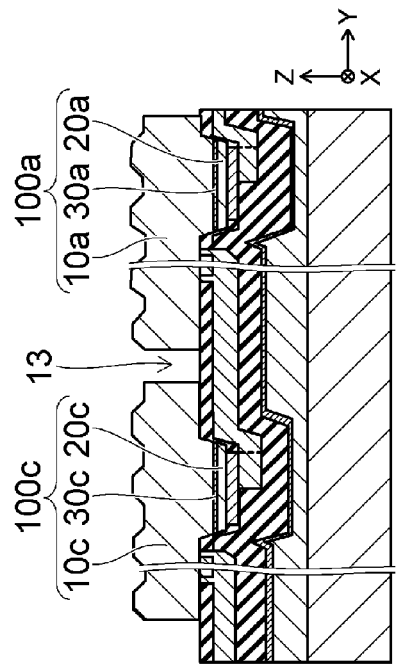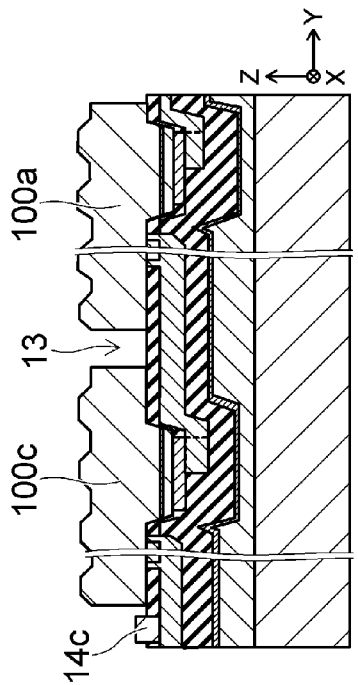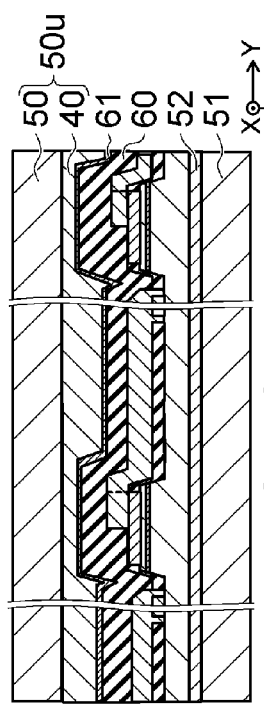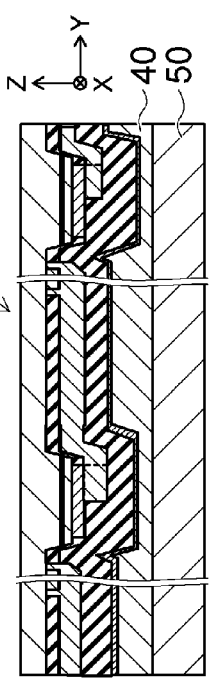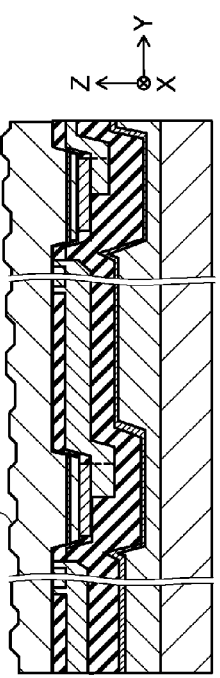

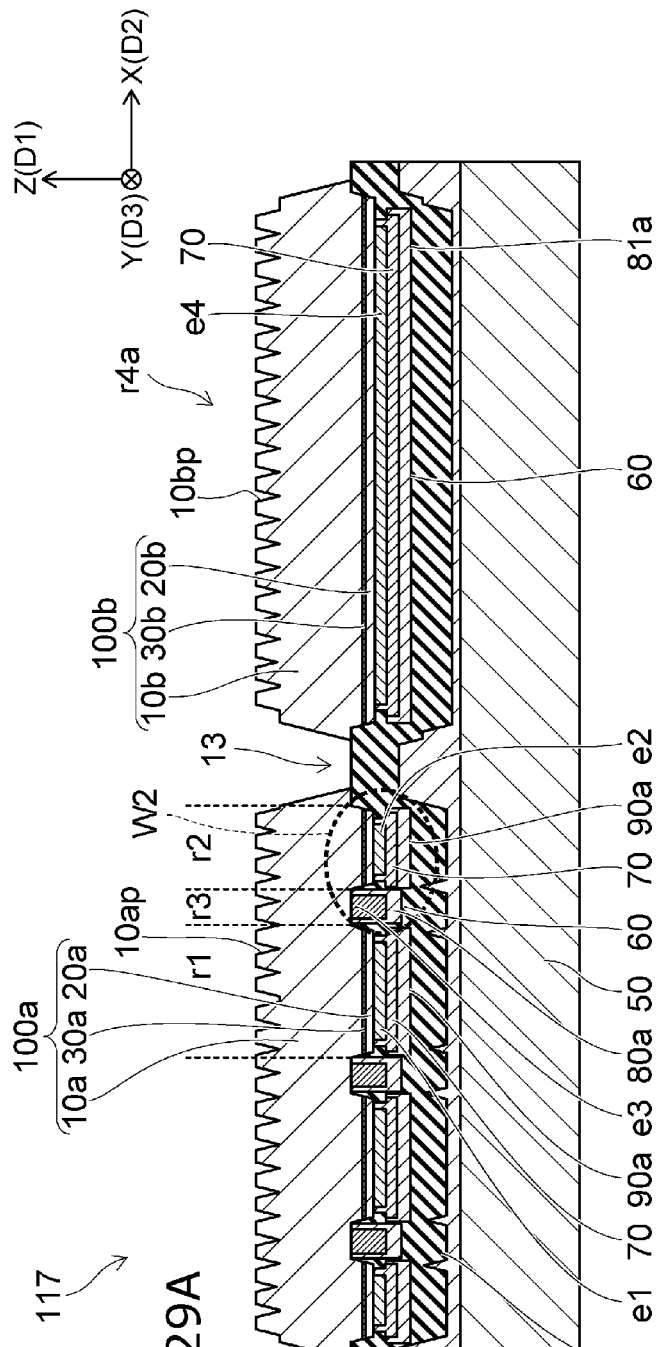
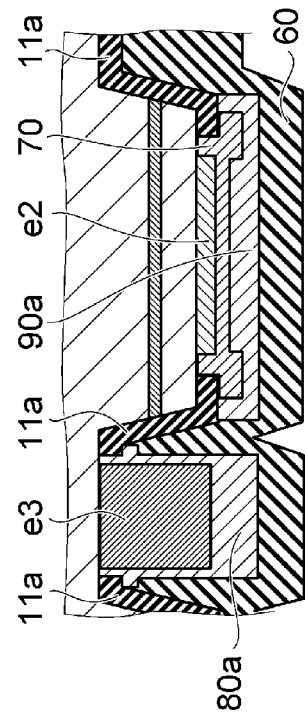
FIG. 29A
FIG. 29B

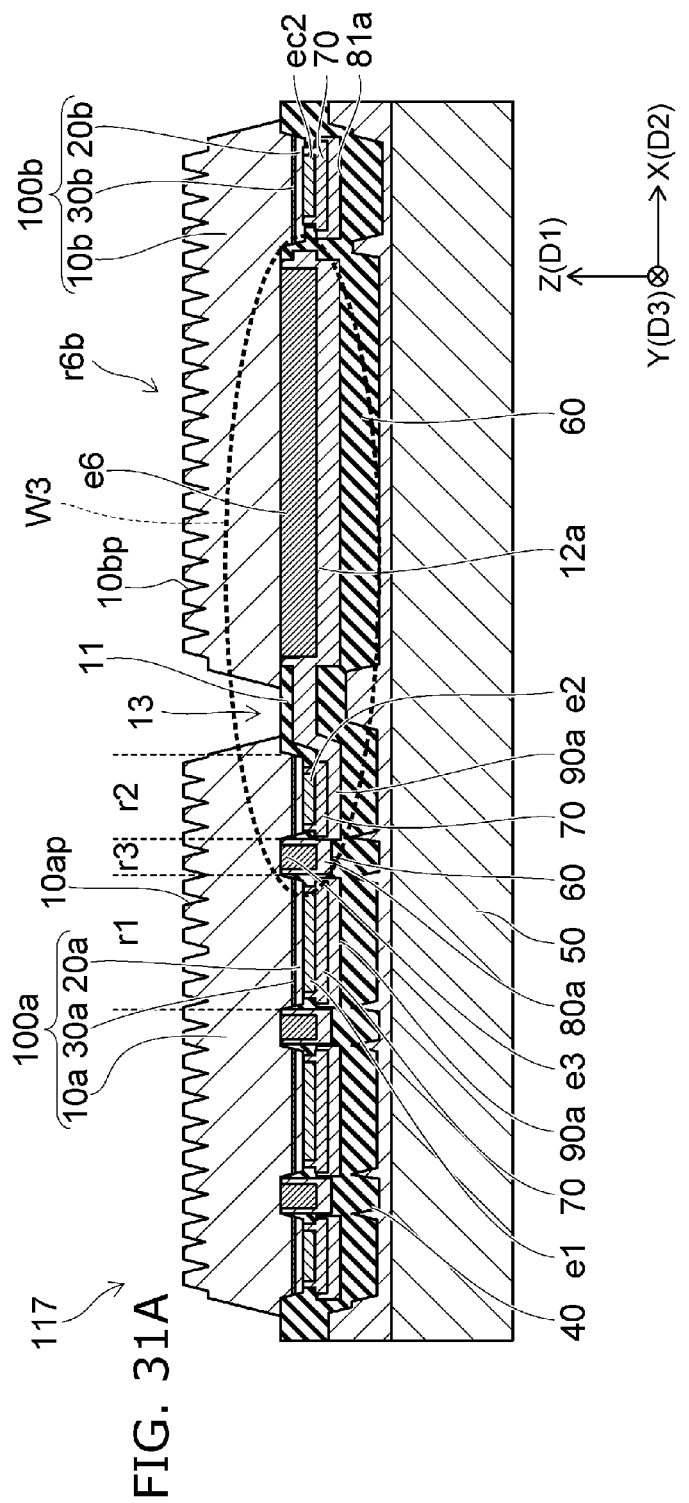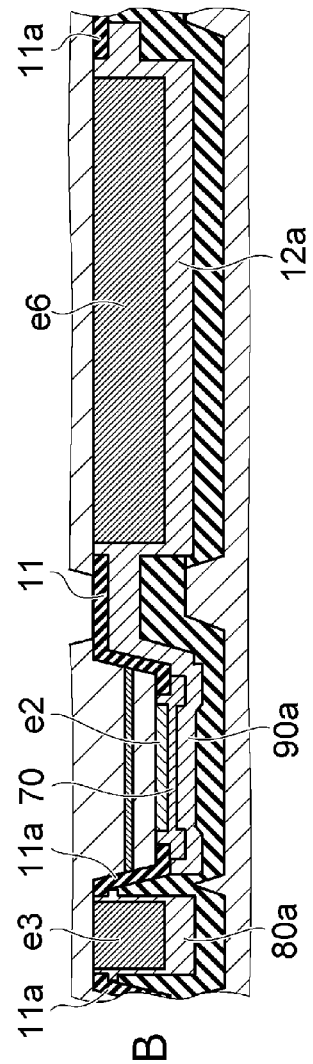
FIG. 31A
FIG. 31B

SEMICONDUCTOR LIGHT EMITTING ELEMENT

CROSS-REFERENCE TO RELATED APPLICATIONS

The present application is a National Stage application of International Application No. PCT/JP2015/003770, filed on Jul. 28, 2015. The present application also claims foreign priority to Japanese Application Nos. 2014-161208, filed Aug. 7, 2014, and 2015-027958, filed Feb. 16, 2015, respectively.

TECHNICAL FIELD

Embodiments of the invention described herein relate to a semiconductor light emitting element.

BACKGROUND ART

It is desirable to increase the efficiency of semiconductor light emitting elements such as light emitting diodes (LEDs: Light Emitting Diodes), etc.

SUMMARY OF INVENTION

Technical Problem

Embodiments of the invention provide a highly efficient semiconductor light emitting element.

Solution to Problem

According to one embodiment of the invention, a semiconductor light emitting element includes a metal layer, a first semiconductor layer of a first conductivity type, a second semiconductor layer of a second conductivity type, a first light emitting layer, a third semiconductor layer of the first conductivity, a fourth semiconductor layer of the second conductivity, a second light emitting layer, a first to a sixth electrodes and a first inter-element interconnect section. The first semiconductor layer is separated from the metal layer in the first direction. The first semiconductor layer includes a first region, a second region, and a third region. The second region is separated from the first region in a second direction intersecting the first direction. The first region, the second region, and the third region extend in a third direction intersecting the first direction and the second direction. The third region is provided between the first region and the second region. The second semiconductor layer is provided between the first region and the metal layer and between the second region and the metal layer. The first light emitting layer is provided between the first region and the second semiconductor layer and between the second region and the second semiconductor layer. The third semiconductor layer is separated from the metal layer in the first direction and arranged with the first semiconductor layer in the second direction. The third semiconductor layer includes a fourth region, a fifth region, and a sixth region. The fifth region is separated from the fourth region in the third direction. The fourth region, the fifth region, and the sixth region extend in the second direction. The sixth region is provided between the fourth region and the fifth region. The fourth semiconductor layer is provided between the fourth region and the metal layer and between the fifth region and the metal layer. The second light emitting layer is provided between the fourth region and the fourth semiconductor layer and between the fifth region and the fourth semiconductor layer. The first electrode is provided between the second semiconductor layer and the metal layer in the first region and electrically connected to the second semiconductor layer. The second electrode is provided between the second semiconductor layer and the metal layer in the second region and electrically connected to the second semiconductor layer. The third electrode is provided between the third region and the metal layer and electrically connected to the third region. The fourth electrode is provided between the fourth semiconductor layer and the metal layer in the fourth region and electrically connected to the fourth semiconductor layer. The fifth electrode is provided between the fourth semiconductor layer and the metal layer in the fifth region and electrically connected to the fourth semiconductor layer. The sixth electrode is provided between the sixth region and the metal layer and electrically connected to the sixth region. The first inter-element interconnect section is provided between the second electrode and the metal layer and between the sixth electrode and the metal layer. The first inter-element interconnect section electrically connects the second electrode to the sixth electrode.

BRIEF DESCRIPTION OF DRAWINGS

FIG. 13A to FIG. 13E are schematic plan views showing electrodes and interconnects of the semiconductor light emitting element according to the embodiment.

FIG. 15A and FIG. 15B are schematic plan views showing the interconnect structure of another semiconductor light emitting element according to the embodiment.

FIG. 18A to FIG. 18E are schematic cross-sectional views showing a method for manufacturing the semiconductor light emitting element according to the embodiment.

FIG. 29A and FIG. 29B are schematic cross-sectional views showing the semiconductor light emitting element according to the eighth embodiment.

FIG. 31A and FIG. 31B are schematic cross-sectional views showing the semiconductor light emitting element according to the eighth embodiment.

DESCRIPTION OF EMBODIMENTS

Figure 1:
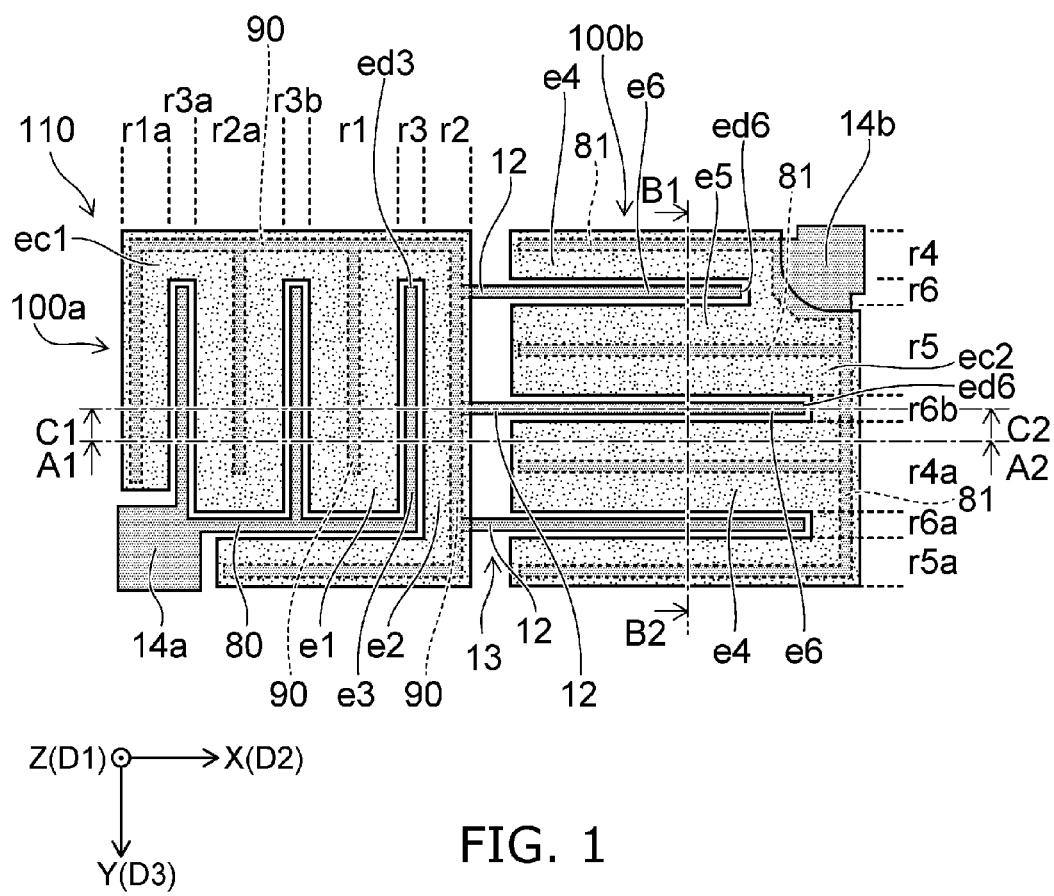
FIG. 1 is a schematic perspective plan view showing a semiconductor light emitting element according to a first embodiment.

Various embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

(First Embodiment)

FIG. 1 is a schematic perspective plan view showing a semiconductor light emitting element according to a first embodiment.

Figure 2:
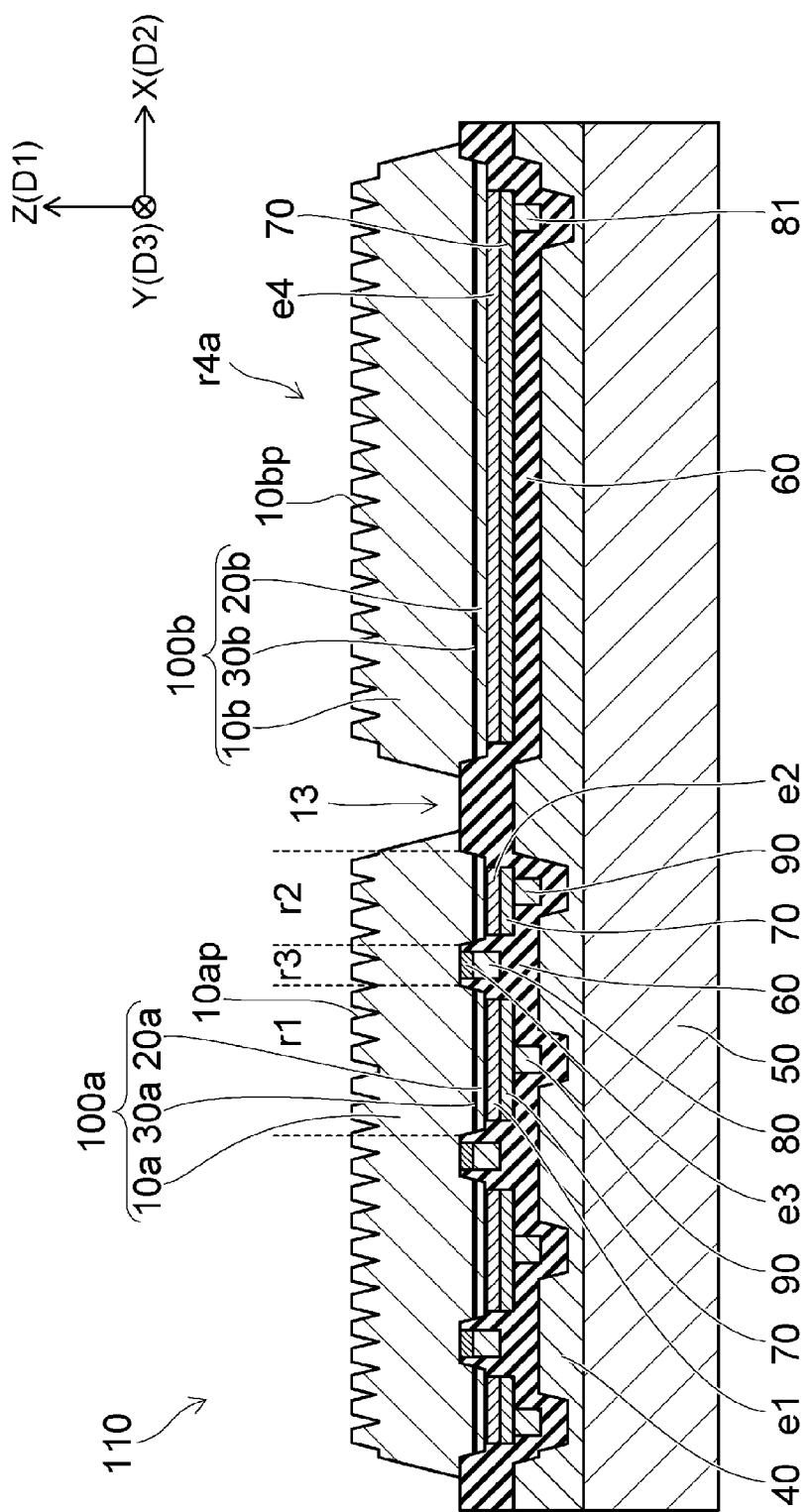
FIG. 2 is a schematic cross-sectional view showing the semiconductor light emitting element according to the first embodiment.
Figure 3:
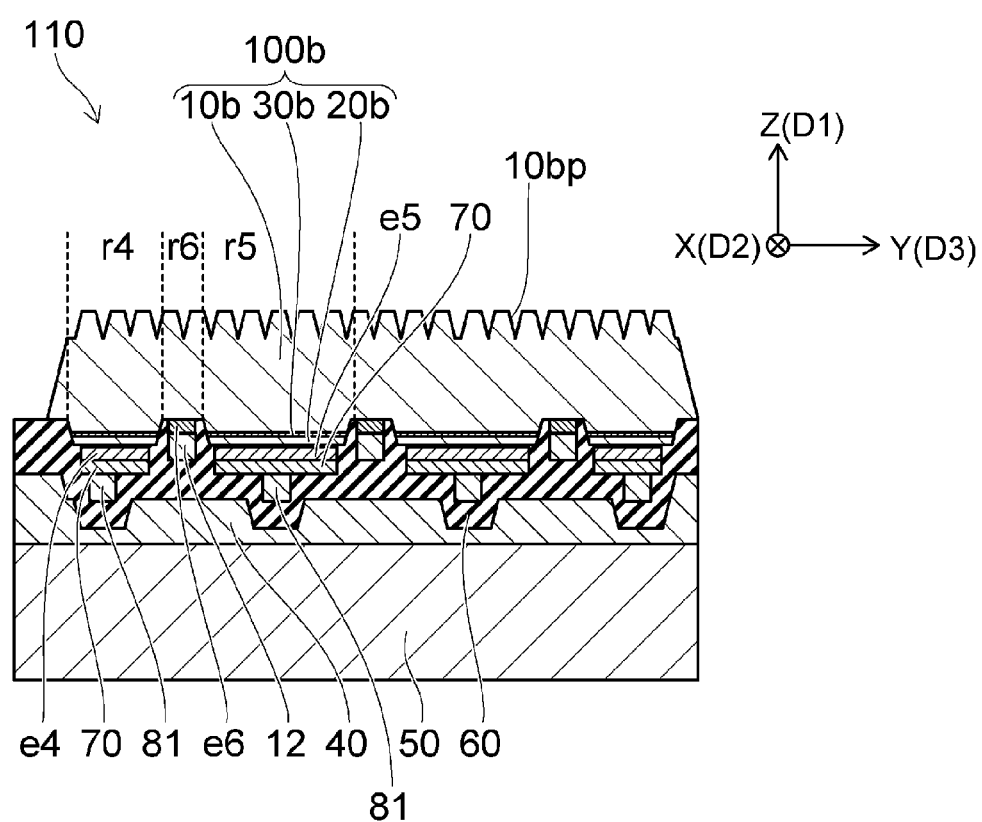
FIG. 3 is a schematic cross-sectional view showing the semiconductor light emitting element according to the first embodiment.
Figure 4:
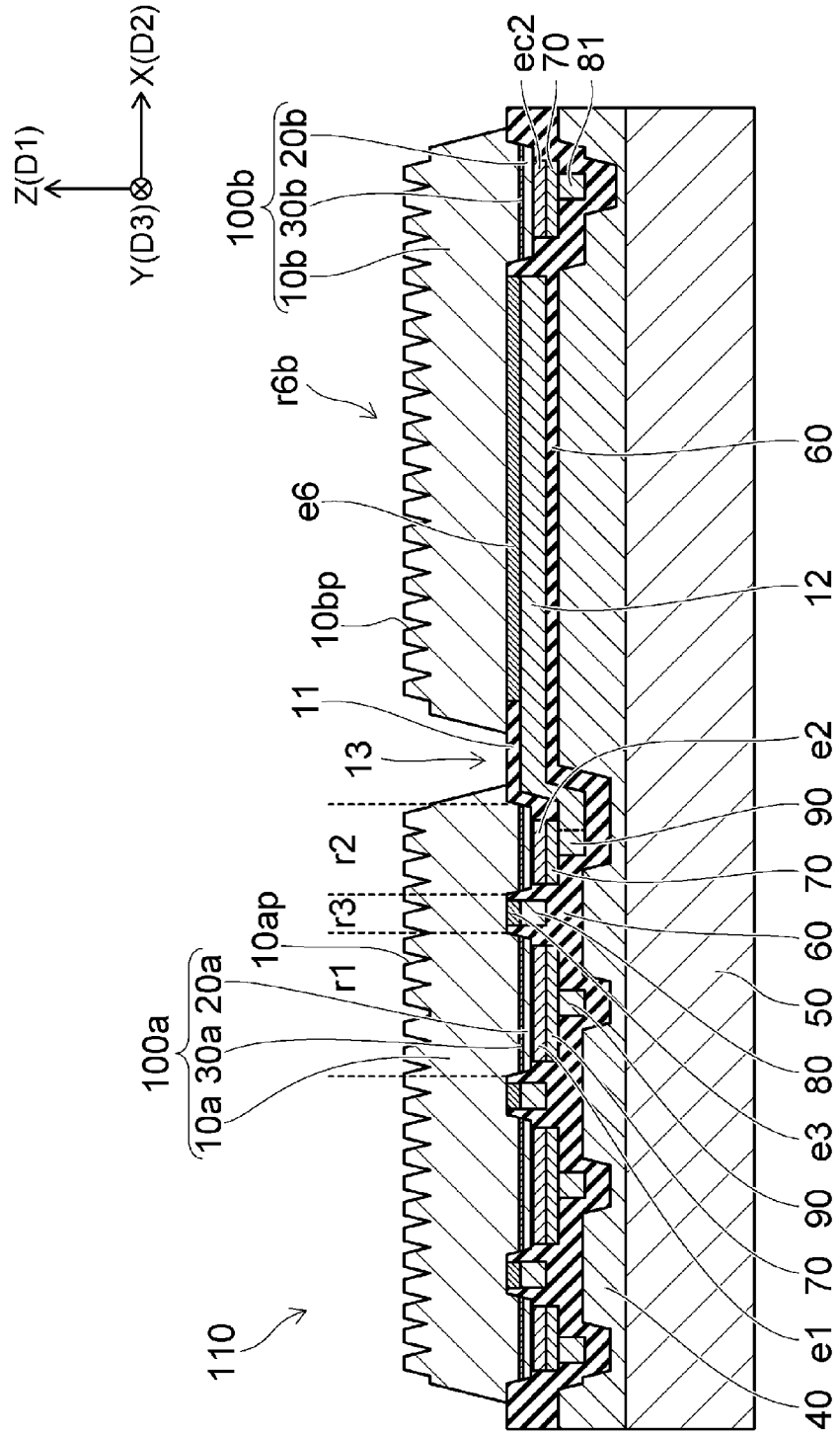
FIG. 4 is a schematic cross-sectional view showing the semiconductor light emitting element according to the first embodiment.

FIG. 2 to FIG. 4 are schematic cross-sectional views showing the semiconductor light emitting element according to the first embodiment.

FIG. 2 shows an A1-A2 cross section of FIG. 1.

FIG. 3 shows a B1-B2 cross section of FIG. 1.

FIG. 4 shows a C1-C2 cross section of FIG. 1.

Some of the components shown in the cross-sectional views of FIG. 2 to FIG. 4 are not shown in the perspective plan view of FIG. 1 for easier viewing of the drawing.

The semiconductor light emitting element 110 according to the embodiment includes a metal layer 40, a first semiconductor layer 10a, a second semiconductor layer 20a, a first light emitting layer 30a, a third semiconductor layer 10b, a fourth semiconductor layer 20b, a second light emitting layer 30b, first to sixth electrodes e1 to e6, and a first inter-element interconnect section 12.

The first semiconductor layer 10a is separated from the metal layer 40 in a first direction D1.

The first direction D1 from the metal layer 40 toward the first semiconductor layer 10a is parallel to a Z-axis direction. One direction perpendicular to the Z-axis direction is taken as an X-axis direction. A direction perpendicular to the Z-axis direction and the X-axis direction is taken as a Y-axis direction.

A first stacked body 100a includes the first semiconductor layer 10a, the second semiconductor layer 20a, and the first light emitting layer 30a. The first semiconductor layer 10a includes a first region r1, a second region r2, and a third region r3. The second region r2 is separated from the first region r1 in a second direction D2. The second direction D2 intersects the first direction D1. In the example, the second direction D2 is aligned with the X-axis direction. The third region r3 is provided between the first region r1 and the second region r2. The first semiconductor layer 10a has a first conductivity type. The first region r1, the second region r2, and the third region r3 extend in a third direction D3. The third direction D3 intersects the first direction D1 and the second direction D2. In the example, the third direction D3 is the Y-axis direction.

The second semiconductor layer 20a is provided between the first region r1 and the metal layer 40 and between the second region r2 and the metal layer 40. The second semiconductor layer 20a has a second conductivity type. The first light emitting layer 30a is provided between the first region r1 and the second semiconductor layer 20a and between the second region r2 and the second semiconductor layer 20a.

For example, the first conductivity type is an n-type. The second conductivity type is a p-type. The first conductivity type may be the p-type; and the second conductivity type may be the n-type. Hereinbelow, the case is described where the first conductivity type is the n-type and the second conductivity type is the p-type.

In the example of FIG. 1 to FIG. 4, the first semiconductor layer 10a includes a first region r1a, a second region r2a that is separated from the first region r1a in the second direction D2, a third region r3a that is provided between the first region r1a and the second region r2a, and a third region r3b that is provided between the first region r1 and the second region r2a. These regions also are similar to the first region r1, the second region r2, and the third region r3 recited above.

A second stacked body 100b includes the third semiconductor layer 10b, the fourth semiconductor layer 20b, and the second light emitting layer 30b. The third semiconductor layer 10b is separated from the metal layer 40 in the first direction D1 and arranged with the first semiconductor layer 10a in the second direction D2. In the example, a separation trench 13 is provided between the first semiconductor layer 10a and the third semiconductor layer 10b. The separation trench 13 may not be between the first semiconductor layer 10a and the third semiconductor layer 10b. The third semiconductor layer 10b includes a fourth region r4, a fifth region r5, and a sixth region r6. The fifth region r5 is separated from the fourth region r4 in the third direction D3. The sixth region r6 is provided between the fourth region r4 and the fifth region r5. The third semiconductor layer 10b has the first conductivity type. The fourth region r4, the fifth region r5, and the sixth region r6 extend in the second direction D2.

The fourth semiconductor layer 20b is provided between the fourth region r4 and the metal layer 40 and between the fifth region r5 and the metal layer 40. The fourth semiconductor layer 20b has the second conductivity type. The second light emitting layer 30b is provided between the fourth region r4 and the fourth semiconductor layer 20b and between the fifth region r5 and the fourth semiconductor layer 20b.

In the example, the third semiconductor layer 10b includes a fourth region r4a, a fifth region r5a that is separated from the fourth region r4a in the third direction D3, a sixth region r6a that is provided between the fourth region r4a and the fifth region r5a, and a sixth region r6b that is provided between the fourth region r4a and the fifth region r5a. These regions also are similar to the fourth region r4, the fifth region r5, and the sixth region r6 recited above.

The first electrode e1 is provided between the second semiconductor layer 20a and the metal layer 40 in the first region r1 and is electrically connected to the second semiconductor layer 20a. The second electrode e2 is provided between the second semiconductor layer 20a and the metal layer 40 in the second region r2 and is electrically connected to the second semiconductor layer 20a. The third electrode e3 is provided between the third region r3 and the metal layer 40 and is electrically connected to the third region r3. The first electrode e1 and the second electrode e2 are, for example, p-electrodes. The third electrode e3 is, for example, an n-electrode.

The fourth electrode e4 is provided between the fourth semiconductor layer 20b and the metal layer 40 in the fourth region r4 and is electrically connected to the fourth semiconductor layer 20b. The fifth electrode e5 is provided between the fourth semiconductor layer 20b and the metal layer 40 in the fifth region r5 and is electrically connected to the fourth semiconductor layer 20b. The sixth electrode e6 is provided between the sixth region r6 and the metal layer 40 and is electrically connected to the sixth region r6. The fourth electrode e4 and the fifth electrode e5 are, for example, p-electrodes. The sixth electrode e6 is, for example, an n-electrode. The arrangement direction of the fourth to sixth electrodes e4 to e6 is different from that of the first to third electrodes e1 to e3 recited above.

In the specification of the application, the "state of being electrically connected" includes the state of multiple conductors being in direct contact. The "state of being electrically connected" includes the state in which another conductor is disposed between multiple conductors and a current flows between the multiple conductors.

The first inter-element interconnect section 12 is provided between the second electrode e2 and the metal layer 40 and between the sixth electrode e6 and the metal layer 40 and electrically connects the second electrode e2 to the sixth electrode e6.

The semiconductor light emitting element 110 further includes a first linking electrode ec1. The first linking electrode ec1 is provided between the second semiconductor layer 20a and the metal layer 40 and links the first electrode e1 to the second electrode e2. Similarly to the first electrode e1 and the second electrode e2, the first linking electrode ec1 is electrically connected to the second semiconductor layer 20a. Similarly to the first electrode e1 and the second electrode e2, the first linking electrode ec1 is, for example, a p-electrode.

The semiconductor light emitting element 110 further includes a first supplemental interconnect section 90. The first supplemental interconnect section 90 is provided between the first electrode e1 and the metal layer 40, between the second electrode e2 and the metal layer 40, and between the first linking electrode ec1 and the metal layer 40 and is electrically connected to the first electrode e1, the second electrode e2, and the first linking electrode ec1. Further, the first supplemental interconnect section 90 is electrically connected to the first inter-element interconnect section 12. The current diffusion can be promoted by providing the first supplemental interconnect section 90 for these electrodes. The current diffusion can be promoted by the first supplemental interconnect section 90 without changing the contact resistance between the second semiconductor layer 20a and the first electrode e1 and between the second semiconductor layer 20a and the second electrode e2. The current diffusion can be promoted by the first supplemental interconnect section 90 without changing the thicknesses of the first electrode e1 and the second electrode e2 which effect the emitted light reflectance.

A protective metal layer (also called a barrier metal) 70 may be provided for the first electrode e1 and the second electrode e2. Similarly, the protective metal layer 70 may be provided for the fourth electrode e4 and the fifth electrode e5.

As shown in FIG. 1 to FIG. 4, the semiconductor light emitting element 110 further includes a first pad section 14a and a first pad interconnect section 80. The first pad section 14a overlaps the metal layer 40 and does not overlap the first semiconductor layer 10a when projected onto a plane perpendicular to the first direction D1. The first pad interconnect section 80 electrically connects the first pad section 14a to the third electrode e3. The first pad section 14a is, for example, an n-side pad.

The semiconductor light emitting element 110 further includes a second linking electrode ec2. The second linking electrode ec2 is provided between the fourth semiconductor layer 20b and the metal layer 40 and links the fourth electrode e4 to the fifth electrode e5. Similarly to the fourth electrode e4 and the fifth electrode e5, the second linking electrode ec2 is electrically connected to the fourth semiconductor layer 20b. Similarly to the fourth electrode e4 and the fifth electrode e5, the second linking electrode ec2 is, for example, a p-electrode.

The semiconductor light emitting element 110 further includes a second pad section 14b and a second pad interconnect section 81. The second pad section 14b overlaps the metal layer 40 and does not overlap the third semiconductor layer 10b when projected onto the plane perpendicular to the first direction D1. The second pad interconnect section 81 electrically connects the second pad section 14b to the fourth electrode e4, the second pad section 14b to the fifth electrode e5, and the second pad section 14b to the second linking electrode ec2. The second pad section 14b is, for example, a p-side pad.

For example, a voltage is applied between the first pad section 14a and the second pad section 14b. A current flows in the first stacked body 100a and the second stacked body 100b via the first pad interconnect section 80, the first supplemental interconnect section 90, the first inter-element interconnect section 12, and the second pad interconnect section 81. Light is emitted from the first light emitting layer 30a and the second light emitting layer 30b due to the current. In the example, the emitted light is emitted from the first semiconductor layer 10a and third semiconductor layer 10b side.

In the example, an unevenness 10ap is provided in the front surface (the light emitting surface) of the first semiconductor layer 10a; and an unevenness 10bp is provided in the front surface (the light emitting surface) of the third semiconductor layer 10b. In other words, an unevenness is provided in the light emitting surface. The light is emitted efficiently to the outside due to the unevenness.

As shown in FIG. 1, the first electrode e1, the second electrode e2, and the third electrode e3 are provided to extend in the third direction D3. The third electrode e3 is provided between the first electrode e1 and the second electrode e2. The first linking electrode ec1 is provided to extend in the second direction D2. The first linking electrode ec1 is linked to the first electrode e1 and the second electrode e2. The first linking electrode ec1 is disposed to oppose an open end ed3 of the third electrode e3. The first electrode e1, the second electrode e2, and the third electrode e3 are provided between the first pad section 14a and the first linking electrode ec1.

Multiple first electrodes e1 and multiple second electrodes e2 are provided in the example. The multiple first electrodes e1 and the multiple second electrodes e2 are linked in a comb-shaped configuration by the first linking electrode ec1. Multiple third electrodes e3 are provided; and each of the multiple third electrodes e3 is disposed between the first electrode e1 and the second electrode e2. The multiple third electrodes e3 are linked in a comb-shaped configuration by the first pad interconnect section 80.

The fourth electrode e4, the fifth electrode e5, and the sixth electrode e6 are provided to extend in the second direction D2. The sixth electrode e6 is provided between the fourth electrode e4 and the fifth electrode e5. The second linking electrode ec2 is provided to extend in the third direction D3. The second linking electrode ec2 is linked to the fourth electrode e4 and the fifth electrode e5. The second linking electrode ec2 is disposed to oppose an open end ed6 of the sixth electrode e6. The fourth electrode e4, the fifth electrode e5, and the sixth electrode e6 are provided between the second pad section 14b and the second electrode e2. The first inter-element interconnect section 12 is provided between the second electrode e2 and the fourth to sixth electrodes e4 to e6.

In the example, multiple fourth electrodes e4 and multiple fifth electrodes e5 are provided. The multiple fourth electrodes e4 and the multiple fifth electrodes e5 are linked in a comb-shaped configuration by the second linking electrode ec2. Multiple sixth electrodes e6 are provided. Each of the multiple sixth electrodes e6 is disposed between the fourth electrode e4 and the fifth electrode e5. Multiple first inter-element interconnect sections 12 are provided. The multiple first inter-element interconnect sections 12 are connected respectively to the multiple sixth electrodes e6.

Here, the third electrode e3 and the sixth electrode e6 (the n-electrodes) are formable as single bodies with the interconnect sections, i.e., the first inter-element interconnect section 12, the first supplemental interconnect section 90, the first pad interconnect section 80, and the second pad interconnect section 81.

The semiconductor light emitting element 110 further includes a base body 50, and an insulating layer 60 that is provided between the metal layer 40 and the first inter-element interconnect section 12. The metal layer 40 is provided between the base body 50 and the insulating layer 60.

The semiconductor light emitting element 110 further includes a first inter-element insulation layer 11. The first inter-element insulation layer 11 is provided between the first inter-element interconnect section 12 and a portion of the first semiconductor layer 10a.

In the description recited above, the first to sixth electrodes e1 to e6 and the first to second linking electrodes ec1 to ec2 include light-reflective materials. For example, these electrodes include at least one of aluminum (Al), silver (Ag), nickel (Ni), gold, or rhodium. Thereby, a high light reflectance is obtained. The first electrode e1, the second electrode e2, the fourth electrode e4, the fifth electrode e5, the first linking electrode ec1, and the second linking electrode ec2 that are illustrated as p-electrodes include, for example, Ag, Ni, a Ag alloy, or a stacked structure of these substances. The third electrode e3 and the sixth electrode e6 that are illustrated as n-electrodes include, for example, Al or an Al alloy.

For example, the first electrode e1, the second electrode e2, and the first linking electrode ec1 are formed by performing heat treatment in an oxygen atmosphere at not less than 250 degrees and not more than 400 degrees (e.g., 300 degrees) for not less than 0.5 minutes and not more than 2 minutes (e.g., 1 minute). The concentration of oxygen of the oxygen atmosphere is, for example, 50% or more. The concentration of nitrogen of the oxygen atmosphere is, for example, 50% or less.

Heat treatment may be performed in an oxygen atmosphere at not less than 250 degrees and not more than 400 degrees (e.g., 300 degrees) for not less than 0.5 minutes and not more than 2 minutes (e.g., 1 minute) after performing heat treatment in a nitrogen atmosphere at not less than 250 degrees and not more than 400 degrees (e.g., 300 degrees) for not less than 0.5 minutes and not more than 2 minutes (e.g., 1 minute). For example, the reflectance becomes high;

and the contact properties improve. The materials and heat treatment recited above are applicable to the embodiments described below as well.

Good ohmic characteristics with the second semiconductor layer 20a are obtained by applying the configuration recited above to the first electrode e1, the second electrode e2, and the first linking electrode ec1. Low contact resistance with the second semiconductor layer 20a is obtained. Good electrical characteristics and a high light reflectance are obtained. Similar configurations and materials are applicable to the fourth electrode e4, the fifth electrode e5, and the second linking electrode ec2 as well.

For example, the third electrode e3 is formed by performing heat treatment in a nitrogen atmosphere at not less than 300 degrees and not more than 600 degrees (e.g., 400 degrees) for not less than 0.5 minutes and not more than 10 minutes (e.g., 1 minute). The concentration of nitrogen of the nitrogen atmosphere is, for example, 90% or more. An inert gas such as argon, etc., may be used instead of nitrogen. The heat treatment may be at reduced pressure. The heat treatment recited above is applicable to the embodiments described below as well.

Good ohmic characteristics with the first semiconductor layer 10a are obtained by applying the configuration recited above to the third electrode e3. Low contact resistance with the first semiconductor layer 10a is obtained. Good electrical characteristics and a high light reflectance are obtained. Similar configurations and materials are applicable to the sixth electrode e6 as well.

The first inter-element interconnect section 12 also includes a light-reflective material. It is favorable for the light reflectance of the first inter-element interconnect section 12 to be higher than the light reflectance of the metal layer 40. For example, the first inter-element interconnect section 12 includes at least one of aluminum, silver, gold, or rhodium. The metal layer 40 includes, for example, tin and at least one of gold or nickel. In other words, by considering the bondability, the metal layer 40 includes metals such as AuSn, NiSn, etc. Thereby, good bondability is obtained.

Further, the first supplemental interconnect section 90, the first pad interconnect section 80, and the second pad interconnect section 81 also include light-reflective materials. At least one of the first supplemental interconnect section 90, the first pad interconnect section 80, or the second pad interconnect section 81 includes, for example, at least one of aluminum, silver, gold, or rhodium.

The light that is emitted from the light emitting layers (the first light emitting layer 30a and the second light emitting layer 30b) is reflected efficiently by these electrodes, interconnect sections, etc. The light that is reflected is emitted efficiently to the outside from the light emitting surface. Thereby, a high light extraction efficiency is obtained.

On the other hand, the heat that is generated by the stacked body is dissipated efficiently by the base body 50. The base body 50 includes a material having high thermal conductivity and good heat dissipation. The base body 50 includes, for example, aluminum nitride, silicon, germanium, copper, etc. Thereby, good heat dissipation is obtained; and an excessive increase of the temperature of the stacked body is suppressed. Thereby, a high luminous efficiency is obtained. These materials are applicable to the embodiments described below as well.

The peak wavelength of the light (the emitted light) that is emitted from the light emitting layer is, for example, not less than 400 nm and not more than 650 nm. However, the peak wavelength is arbitrary in the embodiment.

The first semiconductor layer 10a includes, for example, a GaN layer including an n-type impurity. The n-type impurity can include at least one of Si, Ge, Te, or Sn. The first semiconductor layer 10a includes, for example, an n-side contact layer. This is similar for the third semiconductor layer 10b as well.

The second semiconductor layer 20a includes, for example, a GaN layer including a p-type impurity. The p-type impurity can include at least one of Mg, Zn, or C. The second semiconductor layer 20a includes, for example, a p-side contact layer. This is similar for the fourth semiconductor layer 20b as well.

For example, the first stacked body 100a that includes the first semiconductor layer 10a, the second semiconductor layer 20a, and the first light emitting layer 30a is formed by epitaxial growth. The growth substrate can include, for example, one of Si, sapphire, GaN, SiC, or GaAs. The plane orientation of the growth substrate is arbitrary. This is similar for the second stacked body 100b as well. These materials are applicable to the embodiments described below as well.

The configuration of each of the first pad section 14a and the second pad section 14b is, for example, a polygon (e.g., having five or more sides), a circle, a flattened circle, etc. The width of the pad section is, for example, not less than 50 micrometers (mm) and not more than 200 mm (e.g., 130 mm). For example, a bonding wire is connected to the pad section. A width (size) to which a stable connection can be made is applied.

The insulating layer 60 includes, for example, silicon oxide (Sift, etc.) and/or silicon nitride ($Si_3N_4$, etc.). For example, the insulating layer 60 is formed at a high temperature. Thereby, good insulative properties, good coverage, and good reliability are obtained for the insulating layer 60. The insulating layer 60 may be formed at a low temperature. By using the insulating layer 60, good spreading of the current is obtained; and the effective light emission surface area can be enlarged. The first inter-element insulation layer 11 also includes, for example, silicon oxide ($SiO_2$, etc.). These materials are applicable to the embodiments described below as well.

The protective metal layer 70 includes, for example, at least one of platinum (Pt), nickel (Ni), titanium (Ti), or tungsten (W). These materials are applicable to the embodiments described below as well.

In the example, the side surface of a portion of the first stacked body 100a and the side surface of a portion of the second stacked body 100b are tilted with respect to the Z-axis direction. In other words, a mesa configuration is applicable. The travel direction of the light can be changed by the mesa configuration. The intensity of the light emitted from the light emitting layer is a maximum in the direction of about 30 degrees. The light that travels at the angle where the intensity of the light is a maximum can be changed efficiently.

According to the embodiment, a so-called multijunction structure can be provided in which the operation at a high voltage and a low current is possible in a semiconductor light emitting element having a lateral-conduction thin film structure. In the embodiment, multiple stacked bodies are connected in series. The appropriate operating voltage of one stacked body is within a prescribed range. By connecting the multiple stacked bodies in series, the voltage that is applied to the two ends of the multiple stacked bodies connected in series is divided among the multiple stacked bodies. Thereby, the voltage that is applied to each of the stacked bodies can be within a desirable prescribed range even in the case where the voltage that is applied to the two ends is a high voltage. Driving by a low current that obtains high efficiency is obtained by the voltage within the desirable prescribed range. In other words, the operation at a high voltage and a low current is obtained for the multiple stacked bodies. Thereby, a high efficiency is obtained for the multiple stacked bodies.

According to the embodiment, one n-electrode is interposed between two p-electrodes in one stacked body (element). At least two such stacked bodies are connected in series. Thereby, the light emission uniformity can be increased.

According to the embodiment, high reliability can be obtained because an inter-layer insulating layer is unnecessary between the p-electrode and the n-electrode. According to the embodiment, good heat dissipation can be obtained.

Further, in the example, a light-shielding object such as an interconnect or the like is not provided on the light extraction surface. Thereby, a high light extraction efficiency is obtained. The inter-element interconnect section is provided not on the light extraction surface side but on the base body side. Thereby, a high light extraction efficiency is obtained. High mountability is obtained due to the pad sections.

In the description recited above, the semiconductor light emitting element 110 includes the first stacked body 100a and the second stacked body 100b. For example, as shown in FIG. 1, the sixth electrode e6 (the n-electrode) of the second stacked body 100b is disposed to be orthogonal to the first electrode e1 and the second electrode e2 (the p-electrodes) of the first stacked body 100a. The p-electrode and the n-electrode are connected in series via the first inter-element interconnect section 12 between the first stacked body 100a and the second stacked body 100b. Thereby, unutilized interconnects can be eliminated. The connection between elements can be made easily.

(Second embodiment)

Figure 5:
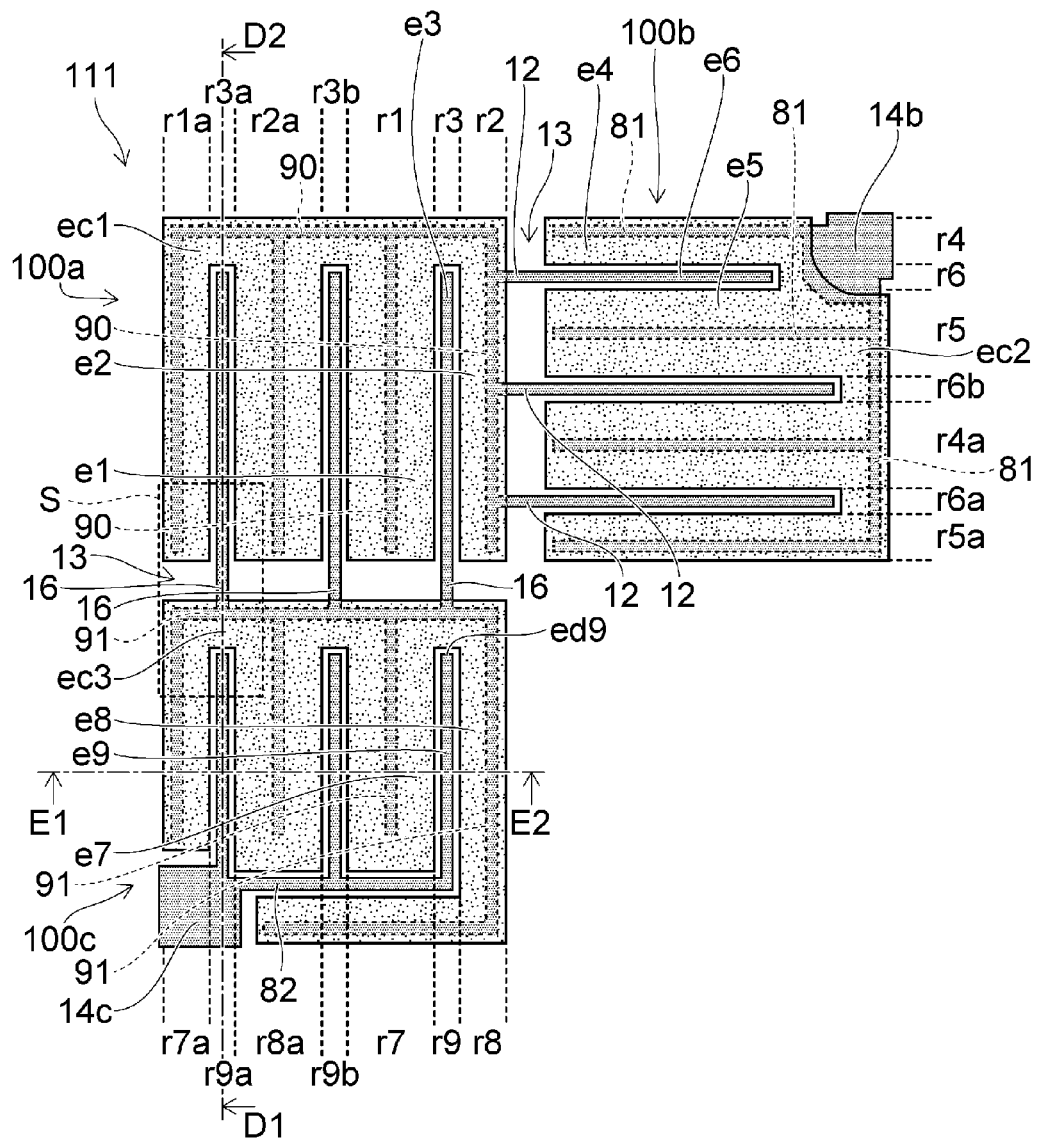
FIG. 5 is a schematic perspective plan view showing a semiconductor light emitting element according to a second embodiment.

FIG. 5 is a schematic perspective plan view showing a semiconductor light emitting element according to a second embodiment.

Figure 6:
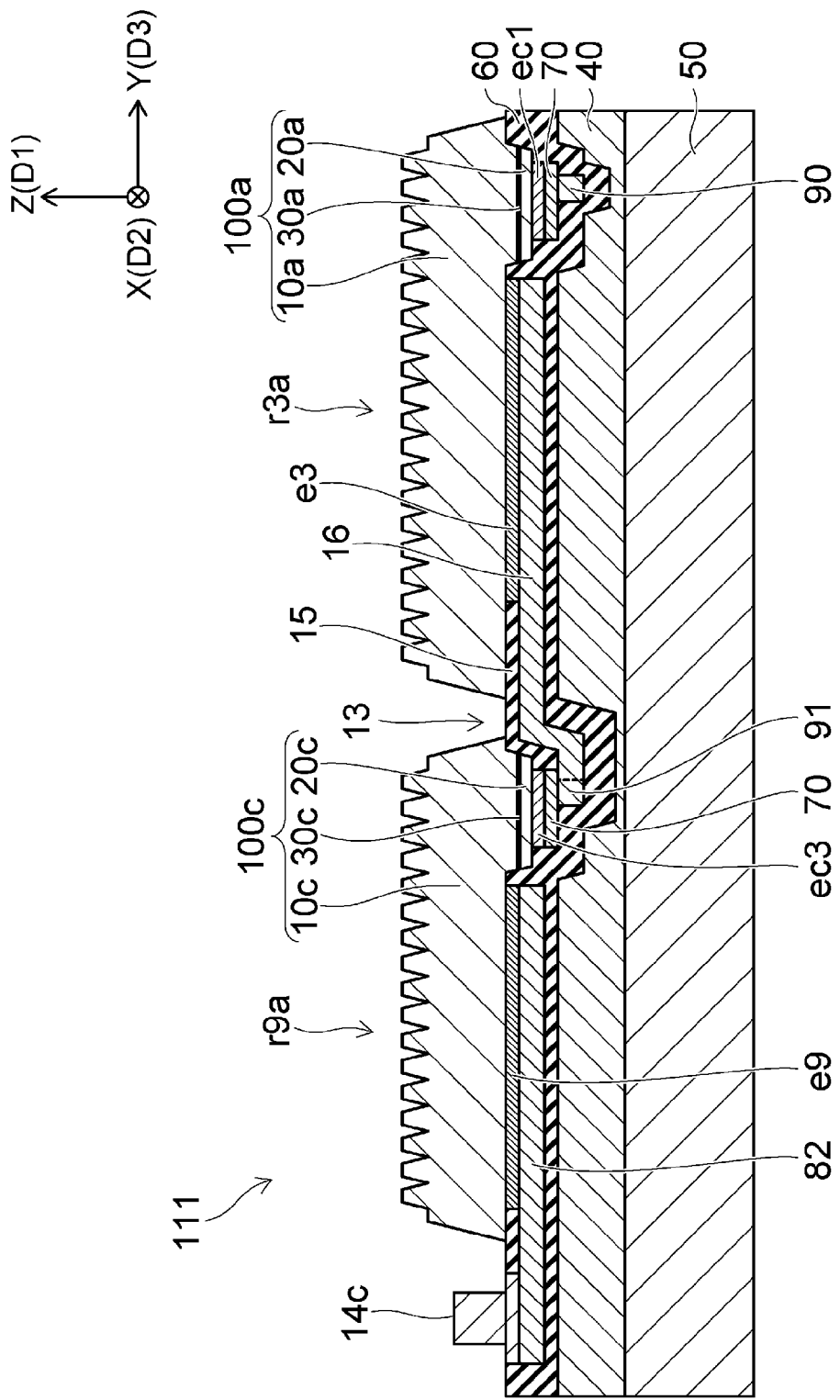
FIG. 6 is a schematic cross-sectional view showing the semiconductor light emitting element according to the second embodiment.
Figure 7:
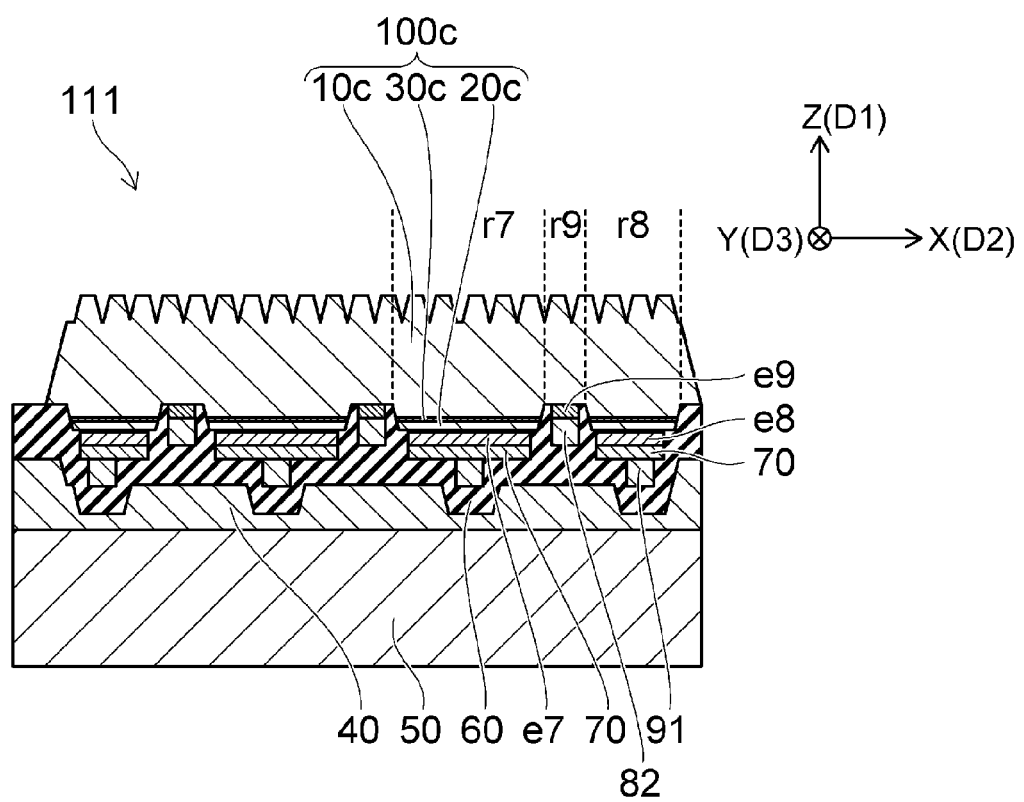
FIG. 7 is a schematic cross-sectional view showing the semiconductor light emitting element according to the second embodiment.

FIG. 6 and FIG. 7 are schematic cross-sectional views showing the semiconductor light emitting element according to the second embodiment.

FIG. 6 shows a D1-D2 cross section of FIG. 5.

FIG. 7 shows an E1-E2 cross section of FIG. 5.

Some of the components shown in the cross-sectional views of FIG. 6 and FIG. 7 are not shown in the perspective plan view of FIG. 5 for easier viewing of the drawing.

The semiconductor light emitting element 111 according to the embodiment includes the metal layer 40, the first semiconductor layer 10a, the second semiconductor layer 20a, the first light emitting layer 30a, the third semiconductor layer 10b, the fourth semiconductor layer 20b, the second light emitting layer 30b, the first to sixth electrodes e1 to e6, and the first inter-element interconnect section 12. The semiconductor light emitting element 111 further includes a fifth semiconductor layer 10c, a sixth semiconductor layer 20c, a third light emitting layer 30c, seventh to ninth electrodes e7 to e9, a third linking electrode ec3, and a second inter-element interconnect section 16.

The fifth semiconductor layer 10c is separated from the metal layer 40 in the first direction D1 and arranged with the first semiconductor layer 10a in the third direction D3. In the example, the separation trench 13 is provided between the first semiconductor layer 10a and the fifth semiconductor layer 10c. The separation trench 13 may not be between the first semiconductor layer 10a and the fifth semiconductor layer 10c.

The first direction D1 from the metal layer 40 toward the fifth semiconductor layer 10c is parallel to the Z-axis direction. One direction perpendicular to the Z-axis direction is taken as the X-axis direction. A direction perpendicular to the Z-axis direction and the X-axis direction is taken as the Y-axis direction.

A third stacked body 100c includes the fifth semiconductor layer 10c, the sixth semiconductor layer 20c, and the third light emitting layer 30c. The fifth semiconductor layer 10c includes a seventh region r7, an eighth region r8, and a ninth region r9. The eighth region r8 is separated from the seventh region r7 in the second direction D2. The second direction D2 intersects the first direction D1. In the example, the second direction D2 is aligned with the X-axis direction. The ninth region r9 is provided between the seventh region r7 and the eighth region r8. The fifth semiconductor layer 10c has the first conductivity type. The seventh region r7, the eighth region r8, and the ninth region r9 extend in the third direction D3. The third direction D3 intersects the first direction D1 and the second direction D2. In the example, the third direction D3 is the Y-axis direction.

The sixth semiconductor layer 20c is provided between the seventh region r7 and the metal layer 40 and between the eighth region r8 and the metal layer 40. The sixth semiconductor layer 20c has the second conductivity type. The third light emitting layer 30c is provided between the seventh region r7 and the sixth semiconductor layer 20c and between the eighth region r8 and the sixth semiconductor layer 20c.

In the example of FIG. 5, the fifth semiconductor layer 10c includes a seventh region r7a, an eighth region r8a that is separated from the seventh region r7a in the second direction D2, a ninth region r9a that is provided between the seventh region r7a and the eighth region r8a, and a ninth region r9b that is provided between the seventh region r7 and the eighth region r8a. These regions also are similar to the seventh region r7, the eighth region r8, and the ninth region r9 recited above.

The seventh electrode e7 is provided between the sixth semiconductor layer 20c and the metal layer 40 in the seventh region r7 and is electrically connected to the sixth semiconductor layer 20c. The eighth electrode e8 is provided between the sixth semiconductor layer 20c and the metal layer 40 in the eighth region r8 and is electrically connected to the sixth semiconductor layer 20c. The ninth electrode e9 is provided between the ninth region r9 and the metal layer 40 and is electrically connected to the ninth region r9. The seventh electrode e7 and the eighth electrode e8 are, for example, p-electrodes. The ninth electrode e9 is, for example, an n-electrode.

The third linking electrode ec3 is provided between the sixth semiconductor layer 20c and the metal layer 40 and links the seventh electrode e7 to the eighth electrode e8. Similarly to the seventh electrode e7 and the eighth electrode e8, the third linking electrode ec3 is electrically connected to the sixth semiconductor layer 20c. Similarly to the seventh electrode e7 and the eighth electrode e8, the third linking electrode ec3 is, for example, a p-electrode.

The second inter-element interconnect section 16 is provided between the third electrode e3 and the metal layer 40 and between the third linking electrode ec3 and the metal layer 40 and electrically connects the third electrode e3 to the third linking electrode ec3.

The semiconductor light emitting element 111 further includes a second supplemental interconnect section 91. The second supplemental interconnect section 91 is provided between the seventh electrode e7 and the metal layer 40, between the eighth electrode e8 and the metal layer 40, and between the third linking electrode ec3 and the metal layer 40 and is electrically connected to the seventh electrode e7, the eighth electrode e8, and the third linking electrode ec3. Further, the second supplemental interconnect section 91 is electrically connected to the second inter-element interconnect section 16.

Similarly to the first electrode e1, the second electrode e2, the fourth electrode e4, and the fifth electrode e5, the protective metal layer 70 may be provided for the seventh electrode e7 and the eighth electrode e8.

As shown in FIG. 5 to FIG. 7, the semiconductor light emitting element 111 further includes a first pad section 14c and a first pad interconnect section 82. The first pad section 14c overlaps the metal layer 40 and does not overlap the fifth semiconductor layer 10c when projected onto the plane perpendicular to the first direction D1. The first pad interconnect section 82 electrically connects the first pad section 14c to the ninth electrode e9. The first pad section 14c is, for example, an n-side pad.

The semiconductor light emitting element 111 further includes the second linking electrode ec2. The second linking electrode ec2 is provided between the fourth semiconductor layer 20b and the metal layer 40 and links the fourth electrode e4 to the fifth electrode e5. Similarly to the fourth electrode e4 and the fifth electrode e5, the second linking electrode ec2 is electrically connected to the fourth semiconductor layer 20b. Similarly to the fourth electrode e4 and the fifth electrode e5, the second linking electrode ec2 is, for example, a p-electrode.

The semiconductor light emitting element 111 further includes the second pad section 14b and the second pad interconnect section 81. The second pad section 14b overlaps the metal layer 40 and does not overlap the third semiconductor layer 10b when projected onto the plane perpendicular to the first direction D1. The second pad interconnect section 81 electrically connects the second pad section 14b to the fourth electrode e4, the second pad section 14b to the fifth electrode e5, and the second pad section 14b to the second linking electrode ec2. The second pad section 14b is, for example, a p-side pad.

As shown in FIG. 5, the seventh electrode e7, the eighth electrode e8, and the ninth electrode e9 are provided to extend in the third direction D3. The ninth electrode e9 is provided between the seventh electrode e7 and the eighth electrode e8. The third linking electrode ec3 is provided to extend in the second direction D2. The third linking electrode ec3 is linked to the seventh electrode e7 and the eighth electrode e8. The third linking electrode ec3 is disposed to oppose an open end ed9 of the ninth electrode e9. The seventh electrode e7, the eighth electrode e8, and the ninth electrode e9 are provided between the first pad section 14c and the third linking electrode ec3. The second inter-element interconnect section 16 is provided between the third linking electrode ec3 and the first to third electrodes e1 to e3.

In the example, multiple seventh electrodes e7 and multiple eighth electrodes e8 are provided. The multiple seventh electrodes e7 and the multiple eighth electrodes e8 are linked in a comb-shaped configuration by the third linking electrode ec3. Multiple ninth electrodes e9 are provided. Each of the multiple ninth electrodes e9 is disposed between the seventh electrode e7 and the eighth electrode e8. The multiple ninth electrodes e9 are linked in a comb-shaped configuration by the first pad interconnect section 82. Multiple second inter-element interconnect sections 16 are provided. The multiple second inter-element interconnect sections 16 are connected respectively to the multiple third electrodes e3.

Here, the third electrode e3, the sixth electrode e6, and the ninth electrode e9 (the n-electrode) are formable as single bodies with the interconnect sections, i.e., the first inter-element interconnect section 12, the second inter-element interconnect section 16, the first supplemental interconnect section 90, the second supplemental interconnect section 91, the first pad interconnect section 82, and the second pad interconnect section 81.

The semiconductor light emitting element 111 further includes the base body 50, and the insulating layer 60 that is provided between the metal layer 40 and the second inter-element interconnect section 16. The metal layer 40 is provided between the base body 50 and the insulating layer 60.

The semiconductor light emitting element 111 further includes a second inter-element insulation layer 15. The second inter-element insulation layer 15 is provided between the second inter-element interconnect section 16 and a portion of the fifth semiconductor layer 10c. The second inter-element insulation layer 15 includes, for example, silicon oxide ($SiO_2$, etc.).

FIG. 8A to FIG. 8D are drawings showing portions of the semiconductor light emitting element according to the second embodiment.

Figure 8:
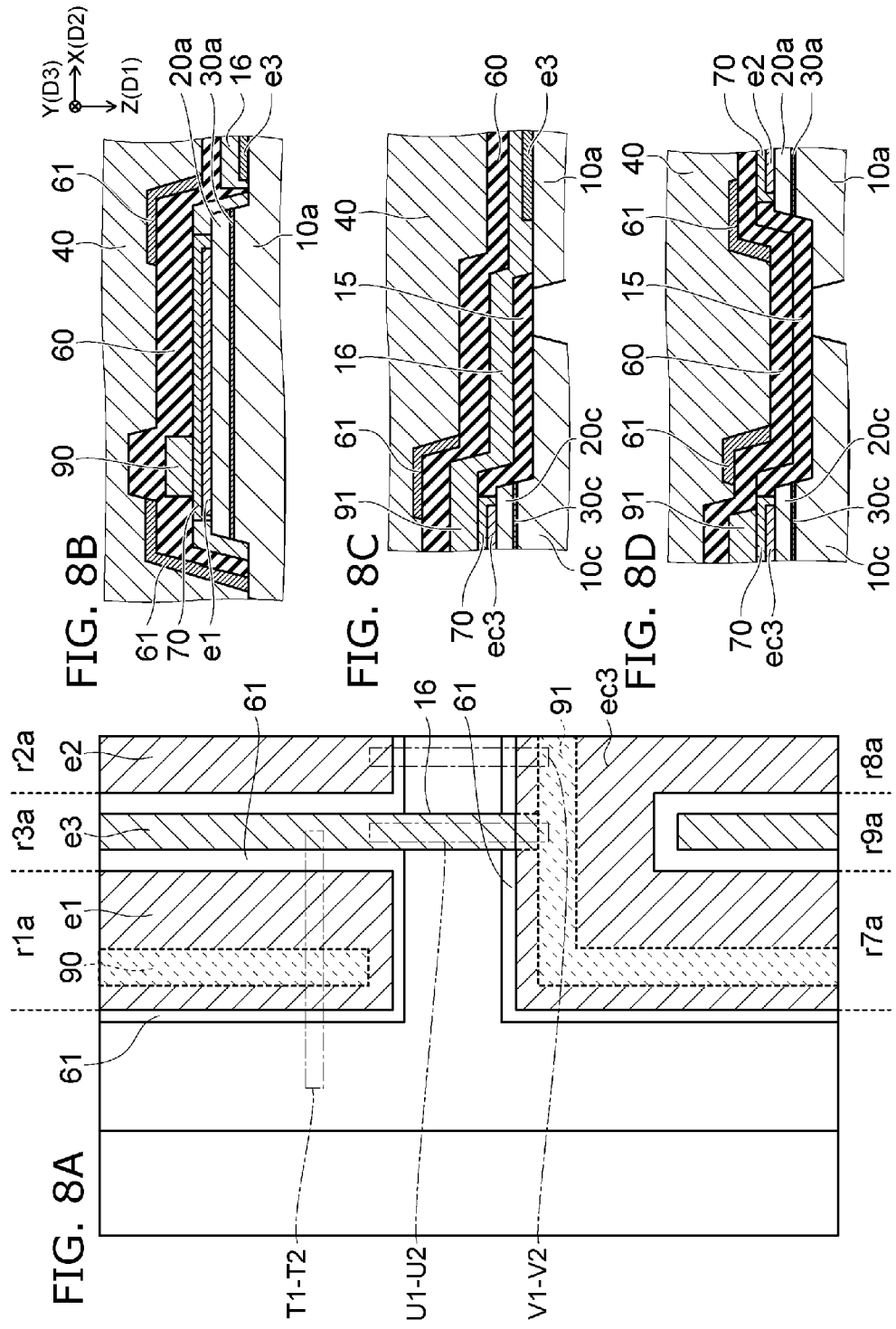
FIG. 8A to FIG. 8D are drawings showing portions of the semiconductor light emitting element according to the second embodiment.

FIG. 8A is a schematic perspective plan view in which portion S of FIG. 5 is enlarged.

FIG. 8B is a schematic cross-sectional view showing a T1-T2 cross section of FIG. 8A.

FIG. 8C is a schematic cross-sectional view showing a U1-U2 cross section of FIG. 8A.

FIG. 8D is a schematic cross-sectional view showing a V1-V2 cross section of FIG. 8A.

As shown in FIG. 8A to FIG. 8D, the semiconductor light emitting element 111 further includes a reflective layer 61. The reflective layer 61 is provided partially between the metal layer 40 and the insulating layer 60. The reflective layer 61 includes, for example, Ag or a Ag alloy. The base body 50 is not shown in the example of FIG. 8A to FIG. 8D.

According to the embodiment, at least three stacked bodies are connected in series. Thereby, high light emission uniformity can be obtained. A high light extraction efficiency can be obtained. Thereby, a highly efficient semiconductor light emitting element can be provided.

In the description recited above, the semiconductor light emitting element 111 includes the first stacked body 100a, the second stacked body 100b, and the third stacked body 100c. For example, as shown in FIG. 5, the sixth electrode e6 (the n-electrode) of the second stacked body 100b is disposed to be orthogonal to the first electrode e1 and the second electrode e2 (the p-electrodes) of the first stacked body 100a; and the seventh electrode e7 and the eighth electrode e8 (the p-electrodes) of the third stacked body 100c are disposed to be parallel to the third electrode e3 (the n-electrode) of the first stacked body 100a. The p-electrode and the n-electrode are connected in series via the first inter-element interconnect section 12 from the first stacked body 100a to the second stacked body 100b. Further, the p-electrode and the n-electrode are connected in series via the second inter-element interconnect section 16 from the third stacked body 100c to the first stacked body 100a. Thereby, unutilized interconnects can be eliminated. The connection between elements can be made easily.

(Third Embodiment)

Figure 9:
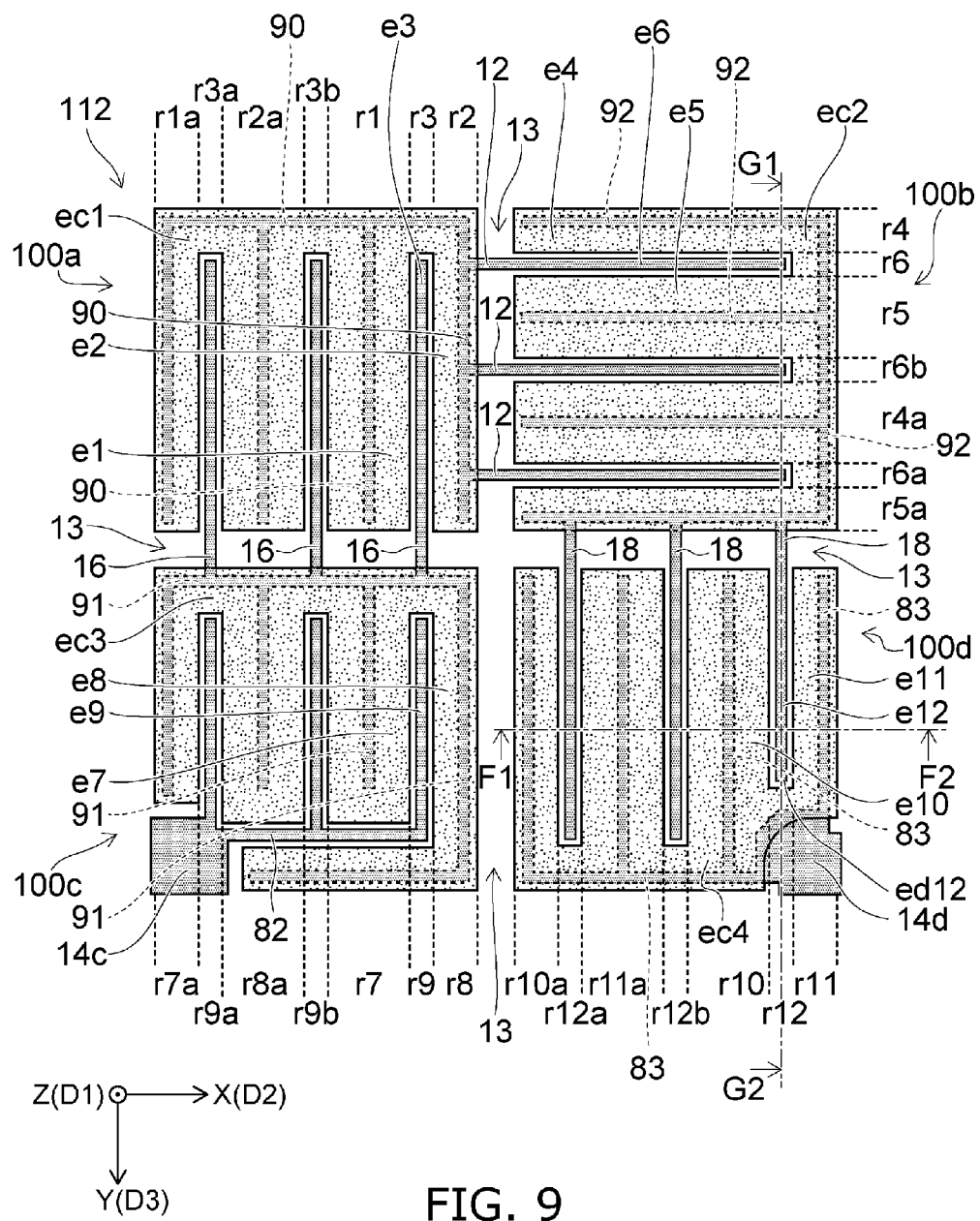
FIG. 9 is a schematic perspective plan view showing a semiconductor light emitting element according to a third embodiment.

FIG. 9 is a schematic perspective plan view showing a semiconductor light emitting element according to a third embodiment.

Figure 10:
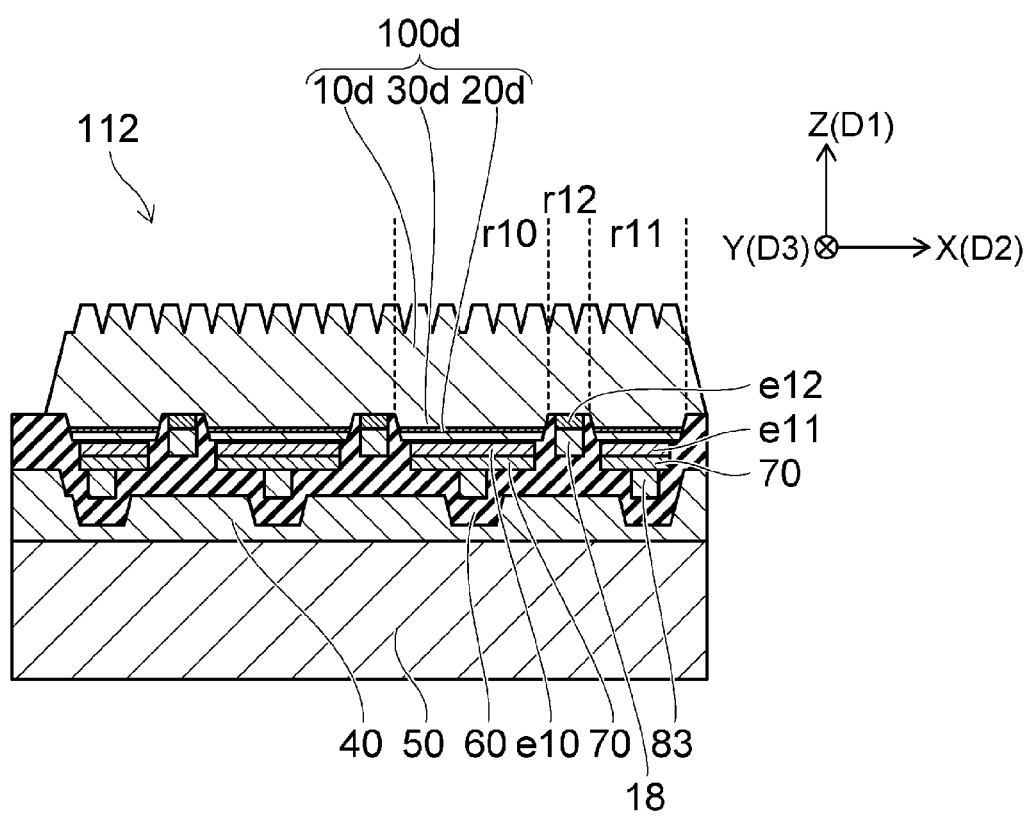
FIG. 10 is a schematic cross-sectional view showing the semiconductor light emitting element according to the third embodiment.
Figure 11:
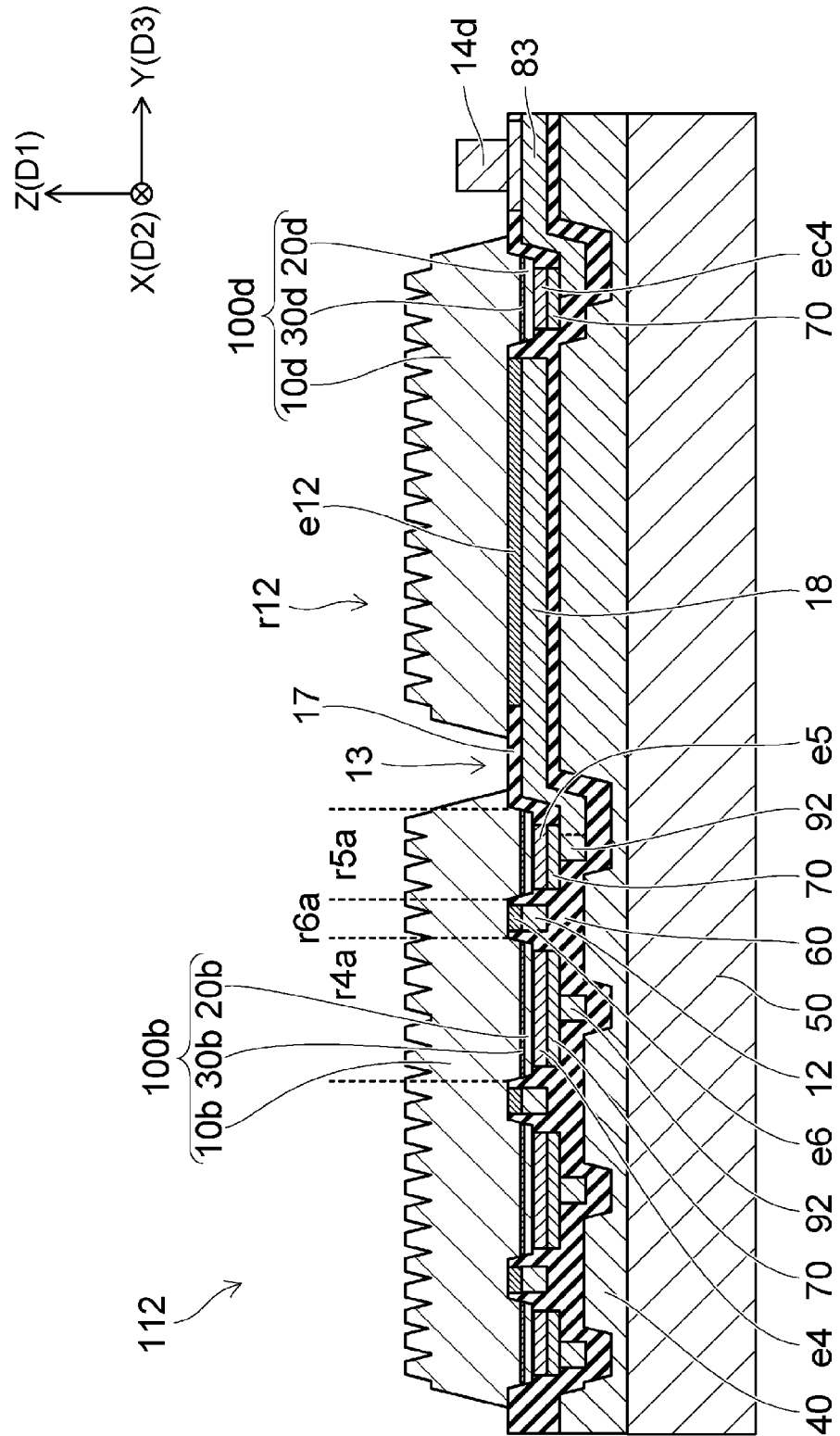
FIG. 11 is a schematic cross-sectional view showing the semiconductor light emitting element according to the third embodiment.

FIG. 10 and FIG. 11 are schematic cross-sectional views showing the semiconductor light emitting element according to the third embodiment.

FIG. 10 shows an F1-F2 cross section of FIG. 9.

FIG. 11 shows a G1-G2 cross section of FIG. 9.

Some of the components shown in the cross-sectional views of FIG. 10 and FIG. 11 are not shown in the perspective plan view of FIG. 9 for easier viewing of the drawing.

The semiconductor light emitting element 112 according to the embodiment includes the metal layer 40, the first semiconductor layer 10a, the second semiconductor layer 20a, the first light emitting layer 30a, the third semiconductor layer 10b, the fourth semiconductor layer 20b, the second light emitting layer 30b, the first to sixth electrodes e1 to e6, the first inter-element interconnect section 12, the fifth semiconductor layer 10c, the sixth semiconductor layer 20c, the third light emitting layer 30c, the seventh to ninth electrodes e7 to e9, the third linking electrode ec3, and the second inter-element interconnect section 16. The semiconductor light emitting element 112 further includes a seventh semiconductor layer 10d, an eighth semiconductor layer 20d, a fourth light emitting layer 30d, tenth to twelfth electrodes e10 to e12, and a third inter-element interconnect section 18.

The seventh semiconductor layer 10d is separated from the metal layer 40 in the first direction D1 and is arranged with the third semiconductor layer 10b in the third direction D3. In the example, the separation trench 13 is provided between the third semiconductor layer 10b and the seventh semiconductor layer 10d. The separation trench 13 may not be between the third semiconductor layer 10b and the seventh semiconductor layer 10d.

The first direction D1 from the metal layer 40 toward the seventh semiconductor layer 10d is parallel to the Z-axis direction. One direction perpendicular to the Z-axis direction is taken as the X-axis direction. A direction perpendicular to the Z-axis direction and the X-axis direction is taken as the Y-axis direction.

A fourth stacked body 100d includes the seventh semiconductor layer 10d, the eighth semiconductor layer 20d, and the fourth light emitting layer 30d. The seventh semiconductor layer 10d includes a tenth region r10, an eleventh region r11, and a twelfth region r12. The eleventh region r11 is separated from the tenth region r10 in the second direction D2. The second direction D2 intersects the first direction D1. In the example, the second direction D2 is aligned with the X-axis direction. The twelfth region r12 is provided between the tenth region r10 and the eleventh region r11. The seventh semiconductor layer 10d has the first conductivity type. The tenth region r10, the eleventh region r11, and the twelfth region r12 extend in the third direction D3. The third direction D3 intersects the first direction D1 and the second direction D2. In the example, the third direction D3 is the Y-axis direction.

The eighth semiconductor layer 20d is provided between the tenth region r10 and the metal layer 40 and between the eleventh region r11 and the metal layer 40. The eighth semiconductor layer 20d has the second conductivity type. The fourth light emitting layer 30d is provided between the tenth region r10 and the eighth semiconductor layer 20d and between the eleventh region r11 and the eighth semiconductor layer 20d.

In the example of FIG. 9, the seventh semiconductor layer 10d includes a tenth region r10a, an eleventh region r11a that is separated from the tenth region r10a in the second direction D2, a twelfth region r12a that is provided between the tenth region r10a and the eleventh region r11a, and a twelfth region r12b that is provided between the tenth region r10 and the eleventh region r11a. These regions also are similar to the tenth region r10, the eleventh region r11, and the twelfth region r12 recited above.

The tenth electrode e10 is provided between the eighth semiconductor layer 20d and the metal layer 40 in the tenth region r10 and is electrically connected to the eighth semiconductor layer 20d. The eleventh electrode e11 is provided between the eighth semiconductor layer 20d and the metal layer 40 in the eleventh region r11 and is electrically connected to the eighth semiconductor layer 20d. The twelfth electrode e12 is provided between the twelfth region r12 and the metal layer 40 and is electrically connected to the twelfth region r12. The tenth electrode e10 and the eleventh electrode e11 are, for example, p-electrodes. The twelfth electrode e12 is, for example, an n-electrode.

The third inter-element interconnect section 18 is provided between the fifth electrode e5 and the metal layer 40 and between the twelfth electrode e12 and the metal layer 40 and electrically connects the fifth electrode e5 to the twelfth electrode e12.

The semiconductor light emitting element 112 further includes the second linking electrode ec2 and a third supplemental interconnect section 92. The second linking electrode ec2 is provided between the fourth semiconductor layer 20b and the metal layer 40 and links the fourth electrode e4 to the fifth electrode e5. Similarly to the fourth electrode e4 and the fifth electrode e5, the second linking electrode ec2 is electrically connected to the fourth semiconductor layer 20b. Similarly to the fourth electrode e4 and the fifth electrode e5, the second linking electrode ec2 is, for example, a p-electrode. The third supplemental interconnect section 92 is provided between the fourth electrode e4 and the metal layer 40, between the fifth electrode e5 and the metal layer 40, and between the second linking electrode ec2 and the metal layer 40 and is electrically connected to the fourth electrode e4, the fifth electrode e5, and the second linking electrode ec2. Further, the third supplemental interconnect section 92 is electrically connected to the third inter-element interconnect section 18.

Similarly to the first electrode e1, the second electrode e2, the fourth electrode e4, the fifth electrode e5, the seventh electrode e7, and the eighth electrode e8, the protective metal layer 70 may be provided for the tenth electrode e10 and the eleventh electrode e11.

As shown in FIG. 9 to FIG. 11, the semiconductor light emitting element 112 further includes the first pad section 14c and the first pad interconnect section 82. The first pad section 14c overlaps the metal layer 40 and does not overlap the fifth semiconductor layer 10c when projected onto the plane perpendicular to the first direction D1 (referring to FIG. 6). The first pad interconnect section 82 electrically connects the first pad section 14c to the ninth electrode e9. The first pad section 14c is, for example, an n-side pad.

The semiconductor light emitting element 112 further includes a second pad section 14d and a second pad interconnect section 83. The second pad section 14d overlaps the metal layer 40 and does not overlap the seventh semiconductor layer 10d when projected onto the plane perpendicular to the first direction D1. The second pad interconnect section 83 electrically connects the second pad section 14d to the tenth electrode e10, the second pad section 14d to the eleventh electrode e11, and the second pad section 14d to a fourth linking electrode ec4. The second pad section 14d is, for example, a p-side pad.

As shown in FIG. 9, the tenth electrode e10, the eleventh electrode e11, and the twelfth electrode e12 are provided to extend in the third direction D3. The twelfth electrode e12 is provided between the tenth electrode e10 and the eleventh electrode e11. The fourth linking electrode ec4 is provided to extend in the second direction D2. The fourth linking electrode ec4 is linked to the tenth electrode e10 and the eleventh electrode e11. The fourth linking electrode ec4 is disposed to oppose an open end ed12 of the twelfth electrode e12. The tenth electrode e10, the eleventh electrode e11, and the twelfth electrode e12 are provided between the second pad section 14d and the fifth electrode e5. The third inter-element interconnect section 18 is provided between the fifth electrode e5 and the tenth to twelfth electrodes e10 to e12.

In the example, multiple tenth electrodes e10 and multiple eleventh electrodes e11 are provided. The multiple tenth electrodes e10 and the multiple eleventh electrodes e11 are linked in a comb-shaped configuration by the fourth linking electrode ec4. Multiple twelfth electrodes e12 are provided. Each of the multiple twelfth electrodes e12 is disposed between the tenth electrode e10 and the eleventh electrode e11. Multiple third inter-element interconnect sections 18 are provided. The multiple third inter-element interconnect sections 18 are connected respectively to the multiple twelfth electrodes e12.

Here, the third electrode e3, the sixth electrode e6, the ninth electrode e9, and the twelfth electrode e12 (the n-electrodes) are formable as single bodies with the interconnect sections, i.e., the first inter-element interconnect section 12, the second inter-element interconnect section 16, the third inter-element interconnect section 18, the first supplemental interconnect section 90, the second supplemental interconnect section 91, the third supplemental interconnect section 92, the first pad interconnect section 82, and the second pad interconnect section 83.

The semiconductor light emitting element 112 further includes the base body 50, and the insulating layer 60 that is provided between the metal layer 40 and the third inter-element interconnect section 18. The metal layer 40 is provided between the base body 50 and the insulating layer 60.

The semiconductor light emitting element 112 further includes a third inter-element insulation layer 17. The third inter-element insulation layer 17 is provided between the third inter-element interconnect section 18 and a portion of the seventh semiconductor layer 10d. The third inter-element insulation layer 17 includes, for example, silicon oxide ($SiO_2$, etc.).

According to the embodiment, at least four stacked bodies are connected in series. Thereby, high light emission uniformity can be obtained. A high light extraction efficiency can be obtained. Thereby, a highly efficient semiconductor light emitting element can be provided.

In the description recited above, the semiconductor light emitting element 112 includes the first stacked body 100a, the second stacked body 100b, the third stacked body 100c, and the fourth stacked body 100d. For example, as shown in FIG. 9, the sixth electrode e6 (the n-electrode) of the second stacked body 100b is disposed to be orthogonal to the first electrode e1 and the second electrode e2 (the p-electrodes) of the first stacked body 100a; and the seventh electrode e7 and the eighth electrode e8 (the p-electrodes) of the third stacked body 100c are disposed to be parallel to the third electrode e3 (the n-electrode) of the first stacked body 100a. Further, the twelfth electrode e12 (the n-electrode) of the fourth stacked body 100d is disposed to be orthogonal to the fourth electrode e4 and the fifth electrode e5 (the p-electrodes) of the second stacked body 100b. The p-electrode and the n-electrode are connected in series via the first inter-element interconnect section 12 from the first stacked body 100a to the second stacked body 100b. The p-electrode and the n-electrode are connected in series via the second inter-element interconnect section 16 from the third stacked body 100c to the first stacked body 100a. Further, the p-electrode and the n-electrode are connected in series via the third inter-element interconnect section 18 from the second stacked body 100b to the fourth stacked body 100d. Thereby, unutilized interconnects can be eliminated. The connection between elements can be made easily.

(Fourth Embodiment)

Figure 12:
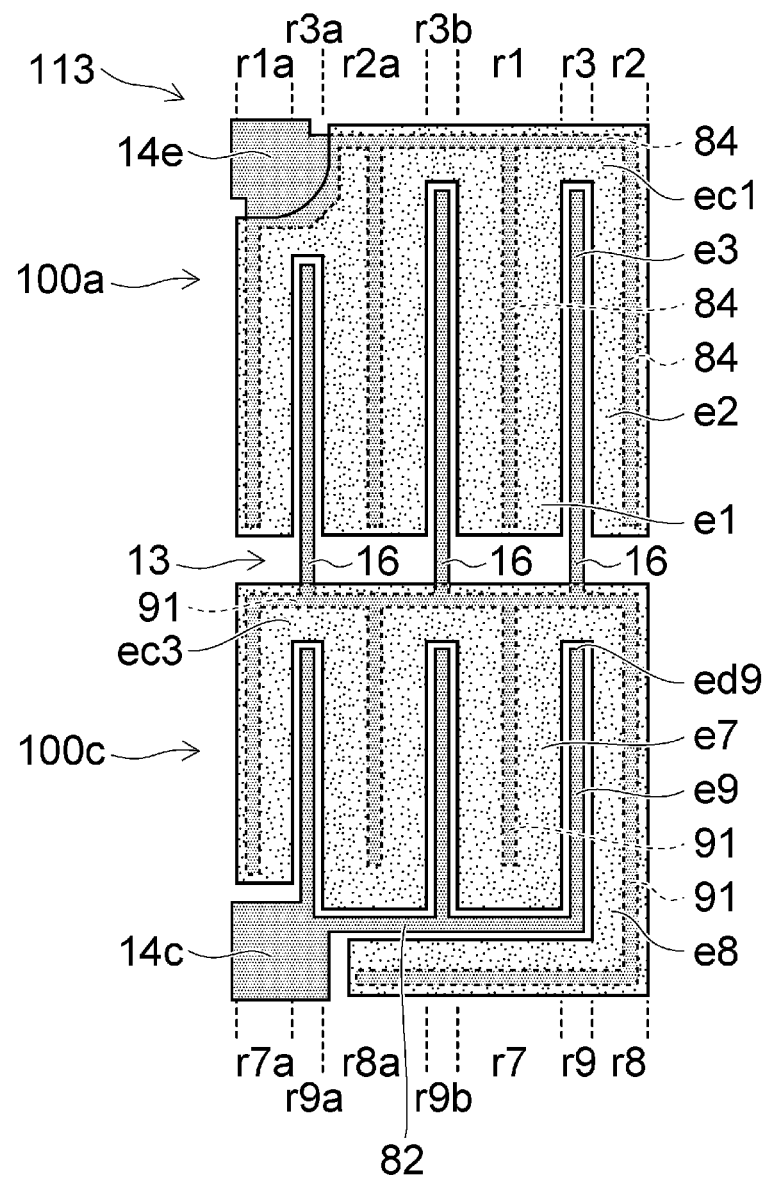
FIG. 12 is a schematic perspective plan view showing a semiconductor light emitting element according to a fourth embodiment.

FIG. 12 is a schematic perspective plan view showing a semiconductor light emitting element according to a fourth embodiment.

The semiconductor light emitting element 113 according to the embodiment includes the metal layer 40, the first semiconductor layer 10a, the second semiconductor layer 20a, the first light emitting layer 30a, and the first to third electrodes e1 to e3. The semiconductor light emitting element 113 further includes the fifth semiconductor layer 10c, the sixth semiconductor layer 20c, the third light emitting layer 30c, the seventh to ninth electrodes e7 to e9, the third linking electrode ec3, and the second inter-element interconnect section 16. The cross-sectional structure of the semiconductor light emitting element 113 is similar to those of the semiconductor light emitting element 111 described in the second embodiment and the semiconductor light emitting element 112 described in the third embodiment. Here, the description refers to FIG. 2, FIG. 6, FIG. 7, and FIG. 12.

The first semiconductor layer 10a is separated from the metal layer 40 in the first direction D1.

The first stacked body 100a includes the first semiconductor layer 10a, the second semiconductor layer 20a, and the first light emitting layer 30a. The first semiconductor layer 10a includes the first region r1, the second region r2, and the third region r3. The second region r2 is separated from the first region r1 in the second direction D2. The second direction D2 intersects the first direction D1. In the example, the second direction D2 is aligned with the X-axis direction. The third region r3 is provided between the first region r1 and the second region r2. The first semiconductor layer 10a has the first conductivity type. The first region r1, the second region r2, and the third region r3 extend in the third direction D3. The third direction D3 intersects the first direction D1 and the second direction D2. In the example, the third direction D3 is the Y-axis direction.

The second semiconductor layer 20a is provided between the first region r1 and the metal layer 40 and between the second region r2 and the metal layer 40. The second semiconductor layer 20a has the second conductivity type. The first light emitting layer 30a is provided between the first region r1 and the second semiconductor layer 20a and between the second region r2 and the second semiconductor layer 20a.

The fifth semiconductor layer 10c is separated from the metal layer 40 in the first direction D1 and is arranged with the first semiconductor layer 10a in the third direction D3. In the example, the separation trench 13 is provided between the first semiconductor layer 10a and the fifth semiconductor layer 10c. The separation trench 13 may not be between the first semiconductor layer 10a and the fifth semiconductor layer 10c.

The first direction D1 from the metal layer 40 toward the fifth semiconductor layer 10c is parallel to the Z-axis direction. One direction perpendicular to the Z-axis direction is taken as the X-axis direction. A direction perpendicular to the Z-axis direction and the X-axis direction is taken as the Y-axis direction.

The third stacked body 100c includes the fifth semiconductor layer 10c, the sixth semiconductor layer 20c, and the third light emitting layer 30c. The fifth semiconductor layer 10c includes the seventh region r7, the eighth region r8, and the ninth region r9. The eighth region r8 is separated from the seventh region r7 in the second direction D2. The second direction D2 intersects the first direction D1. In the example, the second direction D2 is aligned with the X-axis direction. The ninth region r9 is provided between the seventh region r7 and the eighth region r8. The fifth semiconductor layer 10c has the first conductivity type. The seventh region r7, the eighth region r8, and the ninth region r9 extend in the third direction D3. The third direction D3 intersects the first direction D1 and the second direction D2. In the example, the third direction D3 is the Y-axis direction.

The sixth semiconductor layer 20c is provided between the seventh region r7 and the metal layer 40 and between the eighth region r8 and the metal layer 40. The sixth semiconductor layer 20c has the second conductivity type. The third light emitting layer 30c is provided between the seventh region r7 and the sixth semiconductor layer 20c and between the eighth region r8 and the sixth semiconductor layer 20c.

The first electrode e1 is provided between the second semiconductor layer 20a and the metal layer 40 in the first region r1 and is electrically connected to the second semiconductor layer 20a. The second electrode e2 is provided between the second semiconductor layer 20a and the metal layer 40 in the second region r2 and is electrically connected to the second semiconductor layer 20a. The third electrode e3 is provided between the third region r3 and the metal layer 40 and is electrically connected to the third region r3. The first electrode e1 and the second electrode e2 are, for example, p-electrodes. The third electrode e3 is, for example, an n-electrode.

The seventh electrode e7 is provided between the sixth semiconductor layer 20c and the metal layer 40 in the seventh region r7 and is electrically connected to the sixth semiconductor layer 20c. The eighth electrode e8 is provided between the sixth semiconductor layer 20c and the metal layer 40 in the eighth region r8 and is electrically connected to the sixth semiconductor layer 20c. The ninth electrode e9 is provided between the ninth region r9 and the metal layer 40 and is electrically connected to the ninth region r9. The seventh electrode e7 and the eighth electrode e8 are, for example, p-electrodes. The ninth electrode e9 is, for example, an n-electrode.

The third linking electrode ec3 is provided between the sixth semiconductor layer 20c and the metal layer 40 and links the seventh electrode e7 to the eighth electrode e8. Similarly to the seventh electrode e7 and the eighth electrode e8, the third linking electrode ec3 is electrically connected to the sixth semiconductor layer 20c. Similarly to the seventh electrode e7 and the eighth electrode e8, the third linking electrode ec3 is, for example, a p-electrode.

The second inter-element interconnect section 16 is provided between the third electrode e3 and the metal layer 40 and between the third linking electrode ec3 and the metal layer 40 and electrically connects the third electrode e3 to the third linking electrode ec3.

The semiconductor light emitting element 113 further includes the second supplemental interconnect section 91. The second supplemental interconnect section 91 is provided between the seventh electrode e7 and the metal layer 40, between the eighth electrode e8 and the metal layer 40, and between the third linking electrode ec3 and the metal layer 40 and is electrically connected to the seventh electrode e7, the eighth electrode e8, and the third linking electrode ec3. Further, the second supplemental interconnect section 91 is electrically connected to the second inter-element interconnect section 16.

The semiconductor light emitting element 113 further includes the first pad section 14c and the first pad interconnect section 82. The first pad section 14c overlaps the metal layer 40 and does not overlap the fifth semiconductor layer 10c when projected onto the plane perpendicular to the first direction D1. The first pad interconnect section 82 electrically connects the first pad section 14c to the ninth electrode e9. The first pad section 14c is, for example, an n-side pad.

The semiconductor light emitting element 113 further includes the first linking electrode ec1. The first linking electrode ec1 is provided between the second semiconductor layer 20a and the metal layer 40 and links the first electrode e1 to the second electrode e2. Similarly to the first electrode e1 and the second electrode e2, the first linking electrode ec1 is electrically connected to the second semiconductor layer 20a. Similarly to the first electrode e1 and the second electrode e2, the first linking electrode ec1 is, for example, a p-electrode.

The semiconductor light emitting element 113 further includes a second pad section 14e and a second pad interconnect section 84. The second pad section 14e overlaps the metal layer 40 and does not overlap the first semiconductor layer 10a when projected onto the plane perpendicular to the first direction D1. The second pad interconnect section 84 electrically connects the second pad section 14e to the first electrode e1, the second pad section 14e to the second electrode e2, and the second pad section 14e to the first linking electrode ec1. The second pad section 14e is, for example, a p-side pad.

As shown in FIG. 12, the seventh electrode e7, the eighth electrode e8, and the ninth electrode e9 are provided to extend in the third direction D3. The ninth electrode e9 is provided between the seventh electrode e7 and the eighth electrode e8. The third linking electrode ec3 is provided to extend in the second direction D2. The third linking electrode ec3 is linked to the seventh electrode e7 and the eighth electrode e8. The third linking electrode ec3 is disposed to oppose the open end ed9 of the ninth electrode e9. The seventh electrode e7, the eighth electrode e8, and the ninth electrode e9 are provided between the first pad section 14c and the third linking electrode ec3. The second inter-element interconnect section 16 is provided between the third linking electrode ec3 and the first to third electrodes e1 to e3.

According to the embodiment, at least two stacked bodies are connected in series. Thereby, high light emission uniformity can be obtained. A high light extraction efficiency can be obtained. Thereby, a highly efficient semiconductor light emitting element can be provided.

FIG. 13A to FIG. 13E are schematic plan views showing electrodes and interconnects of the semiconductor light emitting element according to the embodiment.

FIG. 13A to FIG. 13E show the state in which the semiconductor light emitting element 112 according to the third embodiment is disassembled into each layer and are drawings showing the disposition of the electrodes and the interconnects in the case where four (two by two) stacked bodies are connected in series.

FIG. 13A shows the disposition of the p-electrodes. As shown in FIG. 13A, the first electrode e1, the second electrode e2, and the first linking electrode ec1 are disposed in the first stacked body 100a. The fourth electrode e4, the fifth electrode e5, and the second linking electrode ec2 are disposed in the second stacked body 100b. The seventh electrode e7, the eighth electrode e8, and the third linking electrode ec3 are disposed in the third stacked body 100c. The tenth electrode e10, the eleventh electrode e11, and the fourth linking electrode ec4 are disposed in the fourth stacked body 100d.

FIG. 13B shows the disposition of the n-electrodes. As shown in FIG. 13B, the third electrode e3 is disposed in the first stacked body 100a. The sixth electrode e6 is disposed in the second stacked body 100b. The ninth electrode e9 is disposed in the third stacked body 100c. The twelfth electrode e12 is disposed in the fourth stacked body 100d.

FIG. 13C shows the disposition of the interconnects. As shown in FIG. 13C, the second inter-element interconnect section 16 and the first supplemental interconnect section 90 are disposed in the first stacked body 100a. The first inter-element interconnect section 12 and the third supplemental interconnect section 92 are disposed in the second stacked body 100b. The second supplemental interconnect section 91 and the first pad interconnect section 82 are disposed in the third stacked body 100c. The third inter-element interconnect section 18 and the second pad interconnect section 83 are disposed in the fourth stacked body 100d.

FIG. 13D shows the disposition of a mesa. As shown in FIG. 13D, the mesa 19 is formed in the element electrode plane.

FIG. 13E shows the disposition of the separation trench. As shown in FIG. 13E, the separation trench 13 is formed in the element front surface.

FIG. 14A to FIG. 14E are schematic plan views showing electrodes and interconnects of one other semiconductor light emitting element according to the embodiment.

FIG. 14A to FIG. 14E show the state in which the one other semiconductor light emitting element according to the embodiment is disassembled into each layer and are drawings showing the disposition of the electrodes and the interconnects in the case where nine (three by three) stacked bodies are connected in series.

Figure 14B:
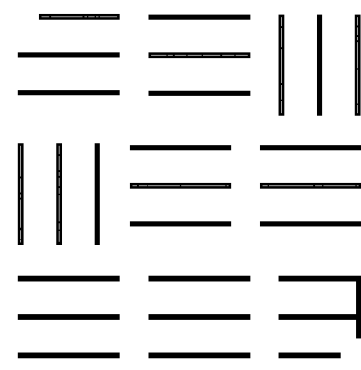
FIG. 14A to FIG. 14E are schematic plan views showing electrodes and interconnects of one other semiconductor light emitting element according to the embodiment.
Figure 14E:
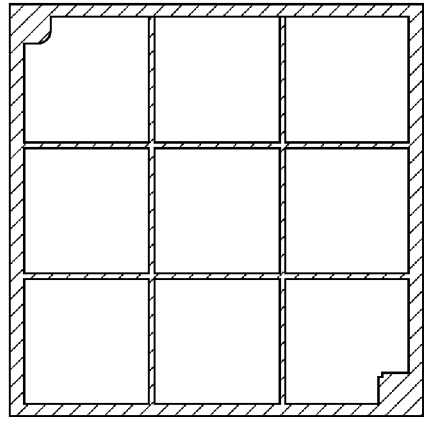
Figure 14A:
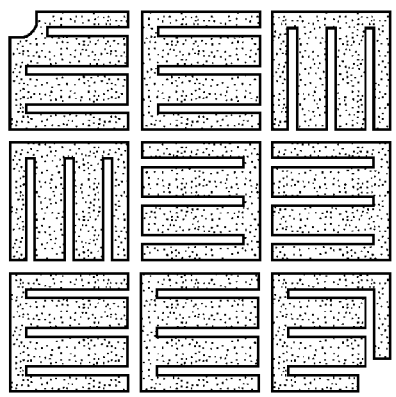
Figure 14D:
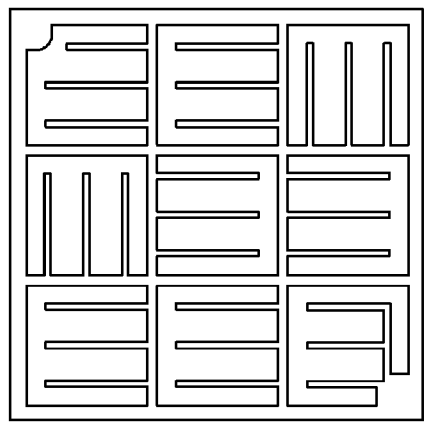
Figure 14C:
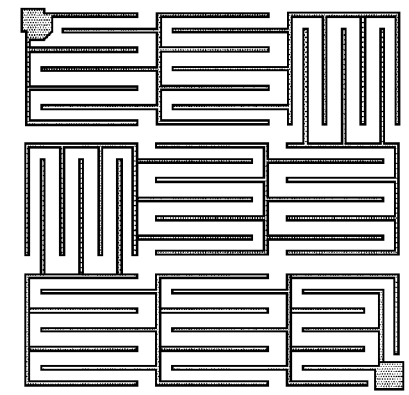

Similarly to the example of FIG. 13A to FIG. 13E recited above, FIG. 14A shows the disposition of the p-electrodes. FIG. 14B shows the disposition of the n-electrodes. FIG. 14C shows the disposition of the interconnects. FIG. 14D shows the disposition of the mesa. FIG. 14E shows the disposition of the separation trench.

Thus, in the semiconductor light emitting element of the embodiment, the basic disposition is similar to the case of four stacked bodies even in the case where nine stacked bodies are connected in series. Therefore, the number of stacked bodies is not particularly limited.

FIG. 15A and FIG. 15B are schematic plan views showing the interconnect structure of another semiconductor light emitting element according to the embodiment.

FIG. 15A is a drawing showing the interconnect structure of the semiconductor light emitting element including nine (three by three) stacked bodies.

FIG. 15B is a drawing in which portion W of FIG. 15A is enlarged.

As shown in FIG. 15A and FIG. 15B, the first stacked body 100a and the third stacked body 100c are arranged in the third direction D3. In the first stacked body 100a, an electrode pa that is on the p-side includes the first electrode e1, the second electrode e2, and the first linking electrode ec1. The first electrode e1 and a second electrode ep2 extend in the third direction D3. The first linking electrode ec1 extends in the second direction D2 and links the first electrode e1 to the second electrode e2.

An electrode na that is on the n-side includes the two third electrodes e3 and e3b and a fifth linking electrode ec5. The two third electrodes e3 and e3b extend in the third direction D3. The fifth linking electrode ec5 extends in the second direction D2 and links the two third electrodes e3 and e3b.

Similarly, in the third stacked body 100c, an electrode pb that is on the p-side includes the seventh electrode e7, the eighth electrode e8, and the third linking electrode ec3. The seventh electrode e7 and the eighth electrode e8 extend in the third direction D3. The third linking electrode ec3 extends in the second direction D2 and links the seventh electrode e7 to the eighth electrode e8.

An electrode nb that is on the n-side includes the two ninth electrodes e9 and e9b and a sixth linking electrode ec6. The two ninth electrodes e9 and e9b extend in the third direction D3. The sixth linking electrode ec6 extends in the second direction D2 and links the two ninth electrodes e9 and e9b.

In the case of the example, a supplemental interconnect section is not provided for the p-electrodes pa and pb. An inter-element interconnect section 21 is used as the inter-element connection between the first stacked body 100a and the third stacked body 100c. The inter-element interconnect section 21 does not have a line configuration such as that of the second inter-element interconnect section 16 described above (FIG. 5) but has a broad plate configuration. Thereby, the resistance can be reduced. The inter-element interconnect section 21 is provided to extend in the second direction D2 between the first stacked body 100a and the third stacked body 100c when projected onto the plane perpendicular to the first direction D1.

The fifth linking electrode ec5 and the inter-element interconnect section 21 are electrically connected. The third linking electrode ec3 and the inter-element interconnect section 21 are electrically connected. Thus, the n-electrode of the first stacked body 100a and the p-electrode of the third stacked body 100c are connected in series. The number of stacked bodies to which the interconnect structure of the example is applicable is not limited to nine (three by three). The basic cross-sectional structure is as described in the first to fourth embodiments described above.

Figure 16A:
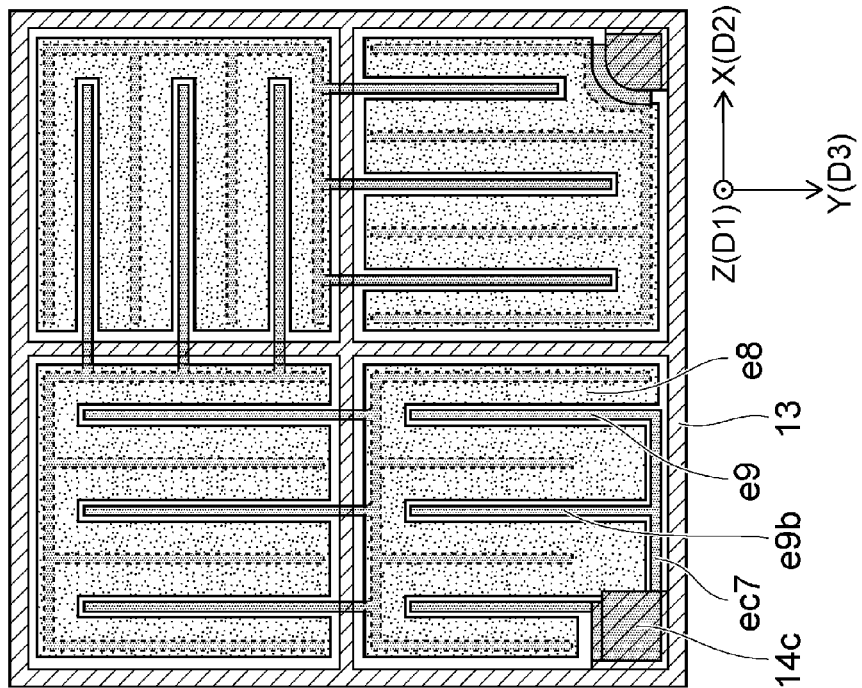
FIG. 16A and FIG. 16B are schematic plan views showing interconnect structures of another semiconductor light emitting element according to the embodiment.
Figure 16B:
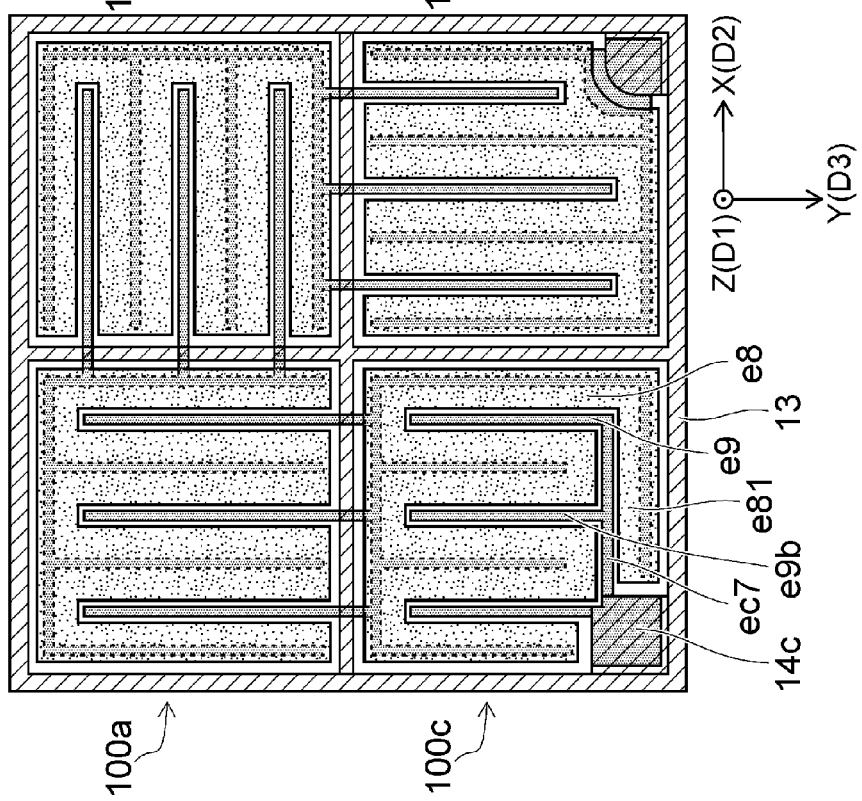

FIG. 16A and FIG. 16B are schematic plan views showing interconnect structures of another semiconductor light emitting element according to the embodiment.

FIG. 16A is a drawing showing an interconnect structure of the semiconductor light emitting element including four (two by two) stacked bodies.

FIG. 16B is a drawing showing another interconnect structure of the semiconductor light emitting element including four (two by two) stacked bodies.

The interconnect structure shown in FIG. 16A is similar to the interconnect structure described in the third embodiment described above (FIG. 9). In other words, the first stacked body 100a and the third stacked body 100c are arranged in the third direction D3. In the third stacked body 100c, the eighth electrode e8 that is on the p-side extends in the third direction D3. The eighth electrode e8 includes an extension portion e81 extending in the second direction D2. The two ninth electrodes e9 and e9b that are on the n-side extend in the third direction D3. The ninth electrode e9 and the ninth electrode e9b are linked by a seventh linking electrode ec7. The seventh linking electrode ec7 extends in the second direction and is connected to the first pad section 14c. The extension portion e81 is provided between the separation trench 13 and the seventh linking electrode ec7 when projected onto the plane perpendicular to the first direction D1. In other words, in the third direction D3, the n-electrode (the seventh linking electrode ec7) is disposed inside the p-electrode (the extension portion e81 of the eighth electrode e8).

On the other hand, in the interconnect structure shown in FIG. 16B, the n-electrode (the seventh linking electrode ec7) is disposed on the outside. In other words, in the third stacked body 100c, the eighth electrode e8 that is on the p-side extends in the third direction D3 but does not extend in the second direction D2. The two ninth electrodes e9 and e9b that are on the n-side extend in the third direction D3. The ninth electrode e9 and the ninth electrode e9b are linked by the seventh linking electrode ec7. The seventh linking electrode ec7 extends in the second direction and is connected to the first pad section 14c. When projected onto the plane perpendicular to the first direction D1, the seventh linking electrode ec7 is disposed to be arranged with the separation trench 13, and the extension portion e81 of the eighth electrode e8 does not exist between the separation trench 13 and the seventh linking electrode ec7. In the third direction D3, the n-electrode (the seventh linking electrode ec7) is disposed outside the p-electrode (the eighth electrode e8). The embodiment may have the interconnect structure of either FIG. 16A or FIG. 16B. Compared to the interconnect structure of FIG. 16A, the interconnect structure of FIG. 16B is favorable in that there are few unutilized interconnects.

FIG. 17A to FIG. 17H and FIG. 18A to FIG. 18E are schematic cross-sectional views showing a method for manufacturing the semiconductor light emitting element according to the embodiment.

Here, the D1-D2 cross section of FIG. 5 (referring to FIG. 6) is shown in the description.

Figure 17A:
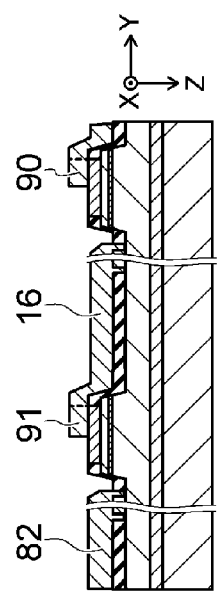
FIG. 17A to FIG. 17H are schematic cross-sectional views showing a method for manufacturing the semiconductor light emitting element according to the embodiment.

As shown in FIG. 17A, a buffer layer 52 is formed on a growth substrate 51; and a first semiconductor film 10f, a light emitting film 30f, and a second semiconductor film 20f are sequentially formed in this order on the buffer layer 52. For example, metal-organic chemical vapor deposition (Metal-Organic Chemical Vapor Deposition: MOCVD), metal-organic vapor phase epitaxy (Metal-Organic Vapor Phase Epitaxy: MOVPE), molecular beam epitaxy (Molecular Beam Epitaxy: MBE), hydride vapor phase epitaxy (HVPE), etc., can be used to form these films. These films are epitaxially grown. The growth substrate 51 includes, for example, a substrate of silicon, sapphire, spinel, GaAs, InP, ZnO, Ge, SiGe, SiC, etc.

Figure 17B:
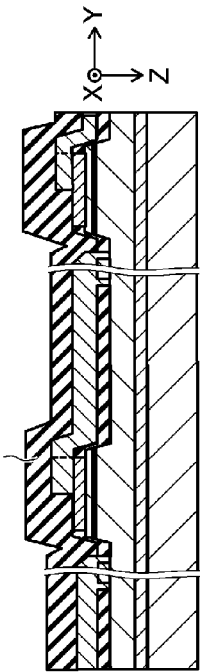

As shown in FIG. 17B, the first stacked body 100a and the third stacked body 100c are formed by removing a portion of the first semiconductor film 10f, a portion of the light emitting film 30f, and a portion of the second semiconductor film 20f. The first stacked body 100a includes the first semiconductor layer 10a, the second semiconductor layer 20a, and the first light emitting layer 30a. The third stacked body 100c includes the fifth semiconductor layer 10c, the sixth semiconductor layer 20c, and the third light emitting layer 30c. For example, RIE (Reactive Ion Etching) is used in the patterning of the removal. For example, a gas that includes chlorine is used in the RIE. The first semiconductor layer 10a and the fifth semiconductor layer 10c are continuous at this time and are separated in a process described below.

Figure 17C:
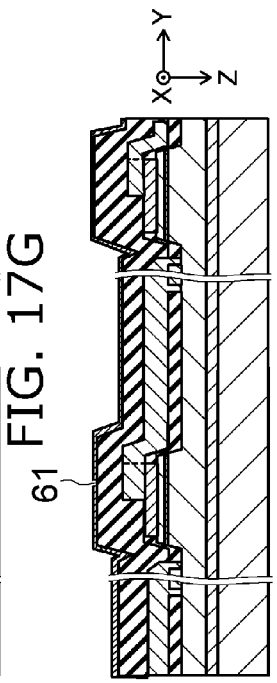

As shown in FIG. 17C, an insulating film 15f is formed on the stacked body. For example, CVD (Chemical Vapor Deposition), sputtering, SOG (Spin On Glass), or the like is used for the insulating film 15f. The insulating film 15f includes, for example, silicon oxide such as $SiO_2$, etc.

Figure 17D:
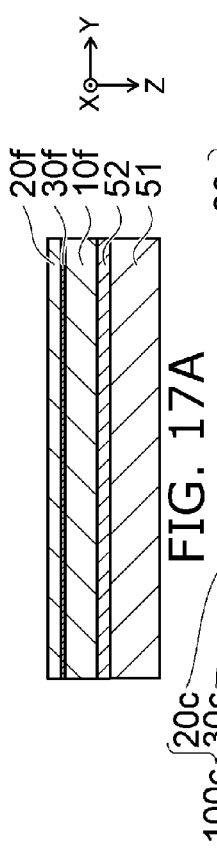

The insulating film 15f is patterned as shown in FIG. 17D. The second inter-element insulation layer 15 is formed from the insulating film 15f. A portion of the insulating film 15f is removed; and the first linking electrode ec1 and the third linking electrode ec3 that are on the p-side are formed respectively on the second semiconductor layer 20a and the sixth semiconductor layer 20c that are exposed. The protective metal layer 70 (not shown) may be formed for the first linking electrode ec1 and the third linking electrode ec3 as necessary.

Figure 17E:
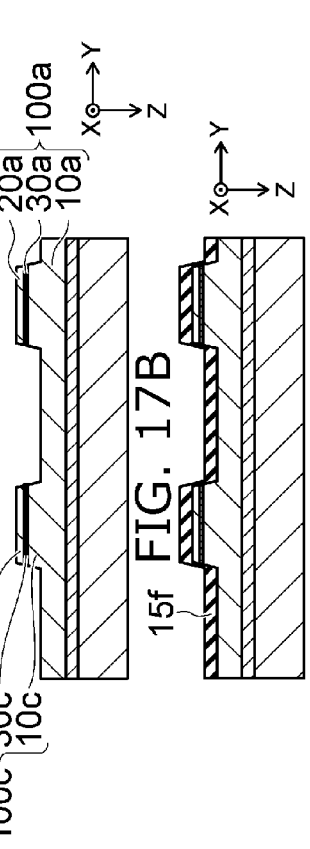

As shown in FIG. 17E, a portion of the insulating film 15f is removed; and the third electrode e3 and the ninth electrode e9 that are on the n-side are formed respectively on the first semiconductor layer 10a and the fifth semiconductor layer 10c that are exposed.

Figure 17F:
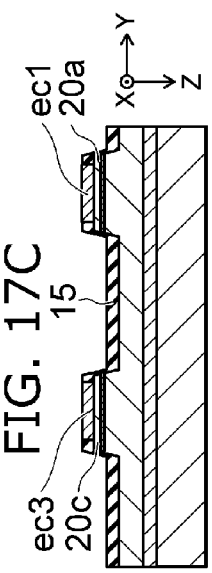

As shown in FIG. 17F, the first supplemental interconnect section 90, the second supplemental interconnect section 91, the first pad interconnect section 82, and the second inter-element interconnect section 16 are formed. These interconnect sections may be formed simultaneously with the n-side electrodes (the third electrode e3 and the ninth electrode e9) recited above.

Figure 17G:
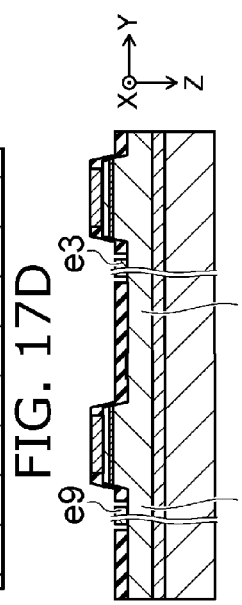

The insulating layer 60 is formed as shown in FIG. 17G. For example, CVD, sputtering, SOG, or the like is used for the insulating layer 60. The insulating layer 60 includes, for example, silicon oxide such as $SiO_2$, etc.

Figure 17H:

As shown in FIG. 17H, the reflective layer 61 that is made of a metal is formed on the insulating layer 60. The reflective layer 61 includes, for example, Ag or a Ag alloy.

As shown in FIG. 18A, a support unit 50u is prepared. The support unit 50u includes the base body 50 and the metal layer 40. The metal layer 40 is disposed between the base body 50 and the stacked body. The reflective layer 61 and the base body 50 are bonded by the metal layer 40 by heating.

The growth substrate 51 and the buffer layer 52 are removed as shown in FIG. 18B.

An unevenness 10p is formed in the upper surface of the first semiconductor film 10f as shown in FIG. 18C.

As shown in FIG. 18D, the first semiconductor layer 10a and the fifth semiconductor layer 10c are formed by dividing the first semiconductor film 10f. Thereby, the separation trench 13 is made.

As shown in FIG. 18E, the first pad section 14c is formed. Thereby, the semiconductor light emitting element 111 is formed.

(Fifth Embodiment)

FIG. 19 to FIG. 22 are schematic cross-sectional views showing a semiconductor light emitting element according to a fifth embodiment.

Figure 19:
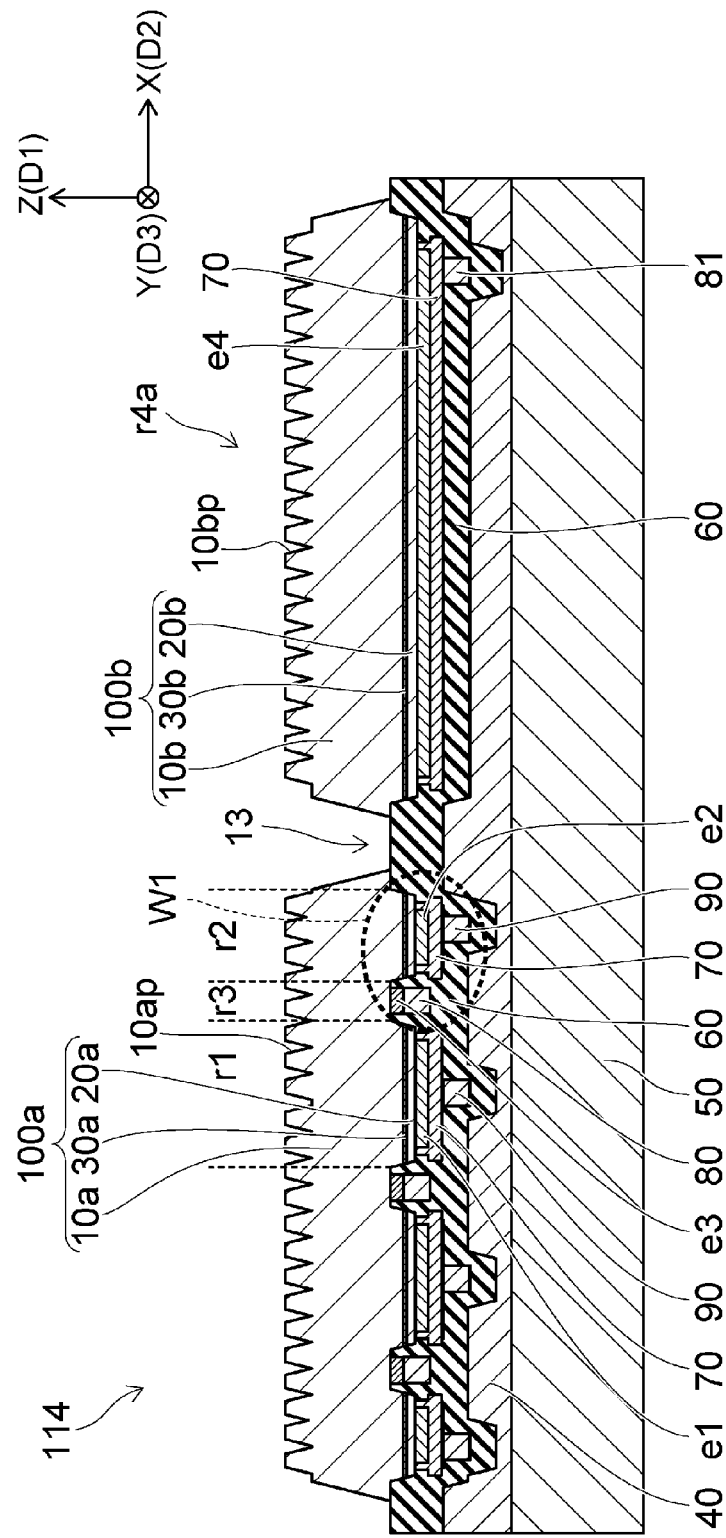
FIG. 19 is a schematic cross-sectional view showing a semiconductor light emitting element according to a fifth embodiment.

FIG. 19 shows another example of the A1-A2 cross section of FIG. 1.

Figure 20:
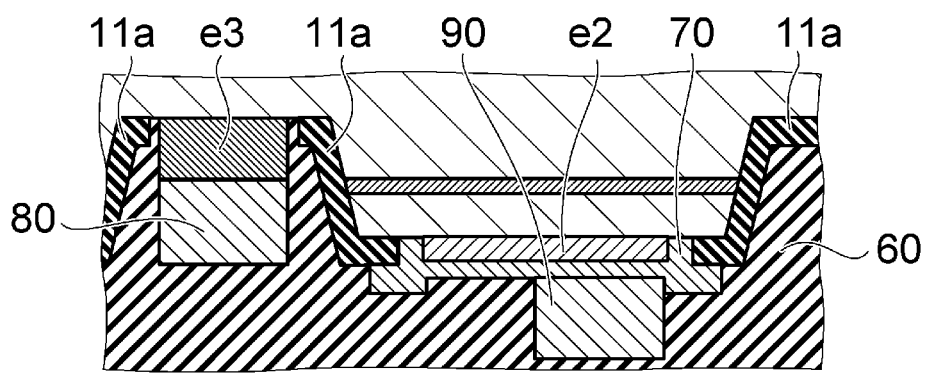
FIG. 20 is a schematic cross-sectional view showing a semiconductor light emitting element according to a fifth embodiment.

FIG. 20 is a drawing in which portion W1 of FIG. 19 is enlarged.

Figure 21:
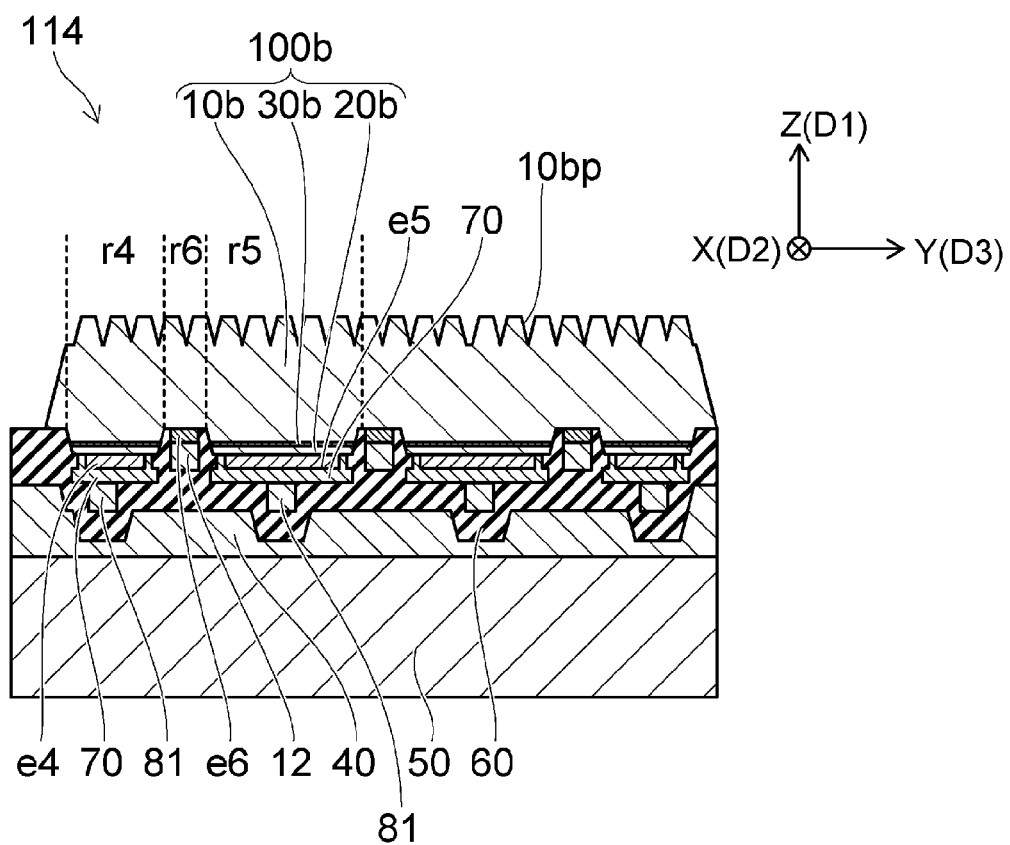
FIG. 21 is a schematic cross-sectional view showing a semiconductor light emitting element according to a fifth embodiment.

FIG. 21 shows another example of the B1-B2 cross section of FIG. 1.

Figure 22:
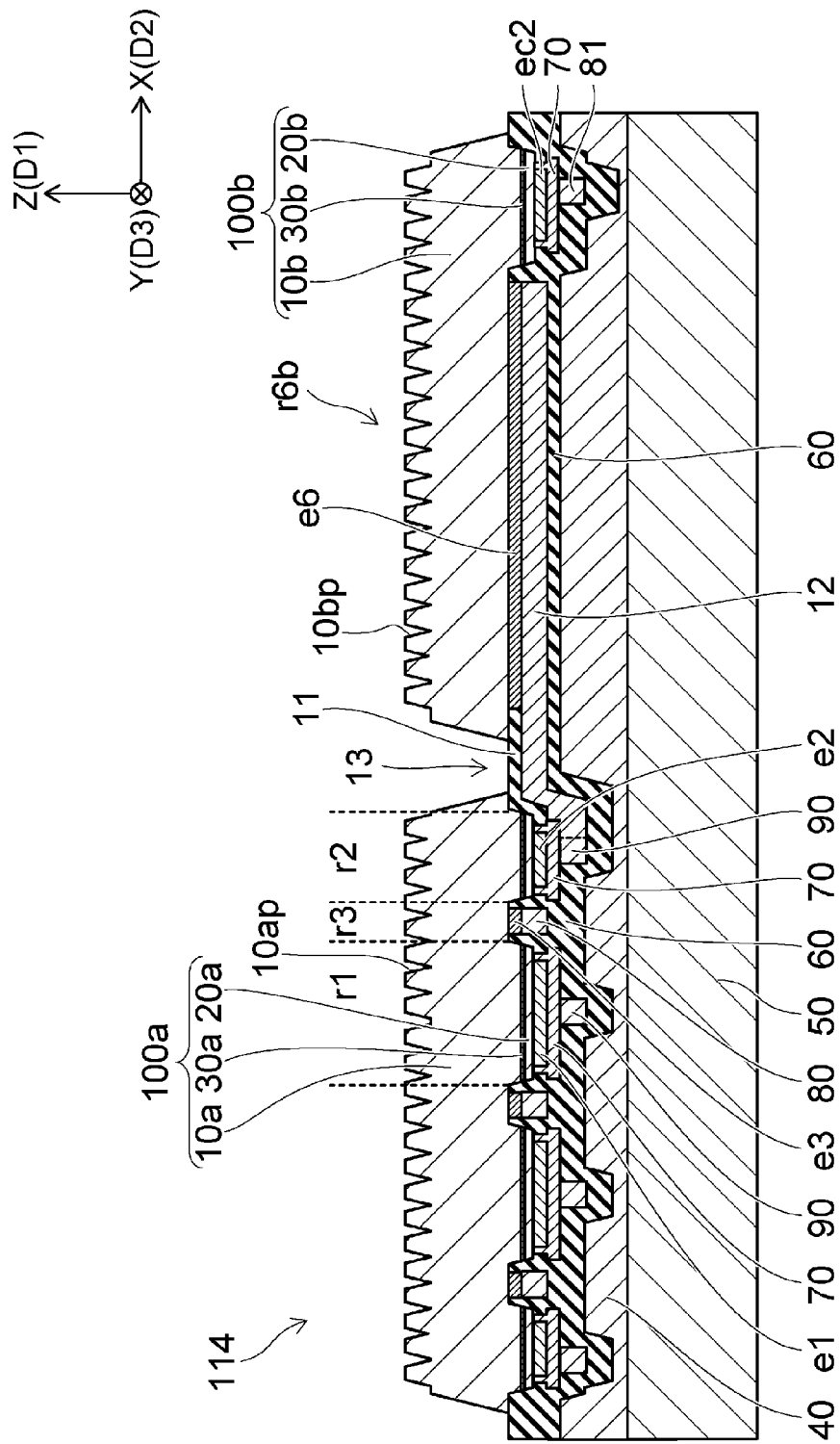
FIG. 22 is a schematic cross-sectional view showing a semiconductor light emitting element according to a fifth embodiment.

FIG. 22 shows another example of the C1-C2 cross section of FIG. 1.

As shown in the example of FIG. 19 to FIG. 22, the cross-sectional structure of the p-electrode periphery of the semiconductor light emitting element 114 is different from that of the semiconductor light emitting element 110. The first supplemental interconnect section 90 and a portion of the first electrode e1 overlap when projected onto the plane perpendicular to the first direction D1. Similarly, the first supplemental interconnect section 90 and a portion of the second electrode e2 overlap. The first supplemental interconnect section 90 and a portion of the first linking electrode ec1 overlap. The width of the first supplemental interconnect section 90 is narrower than the width of each of these electrodes. For example, the first supplemental interconnect section 90 is provided in a line configuration.

As shown in FIG. 20, the protective metal layer 70 covers the second electrode e2. Each of the end portions of the protective metal layer 70 is provided on an insulating layer 11a. The insulating layer 11a is the insulating layer formed at the mesa portion. For example, silicon oxide (SiFt, etc.) is used as the material of the insulating layer 11a. The material is applicable to each of the embodiments. The peripheral structures of the first electrode e1, the first linking electrode ec1, the fourth electrode e4, the fifth electrode e5, and the second linking electrode ec2 are similar to the peripheral structure of the second electrode e2 shown in FIG. 20.

The second pad interconnect section 81 and a portion of the fourth electrode e4 overlap when projected onto the plane perpendicular to the first direction D1. Similarly, the second pad interconnect section 81 and a portion of the fifth electrode e5 overlap. The second pad interconnect section 81 and a portion of the second linking electrode ec2 overlap. The width of the second pad interconnect section 81 is narrower than the width of each of these electrodes. For example, the second pad interconnect section 81 is provided in a line configuration.

As shown in FIG. 22, the protective metal layer 70 covers the second electrode e2. One end of the two end portions of the protective metal layer 70 is provided on the insulating layer 11a; and the other end is provided on the first inter-element insulation layer 11.

(Sixth Embodiment)

Figure 23:
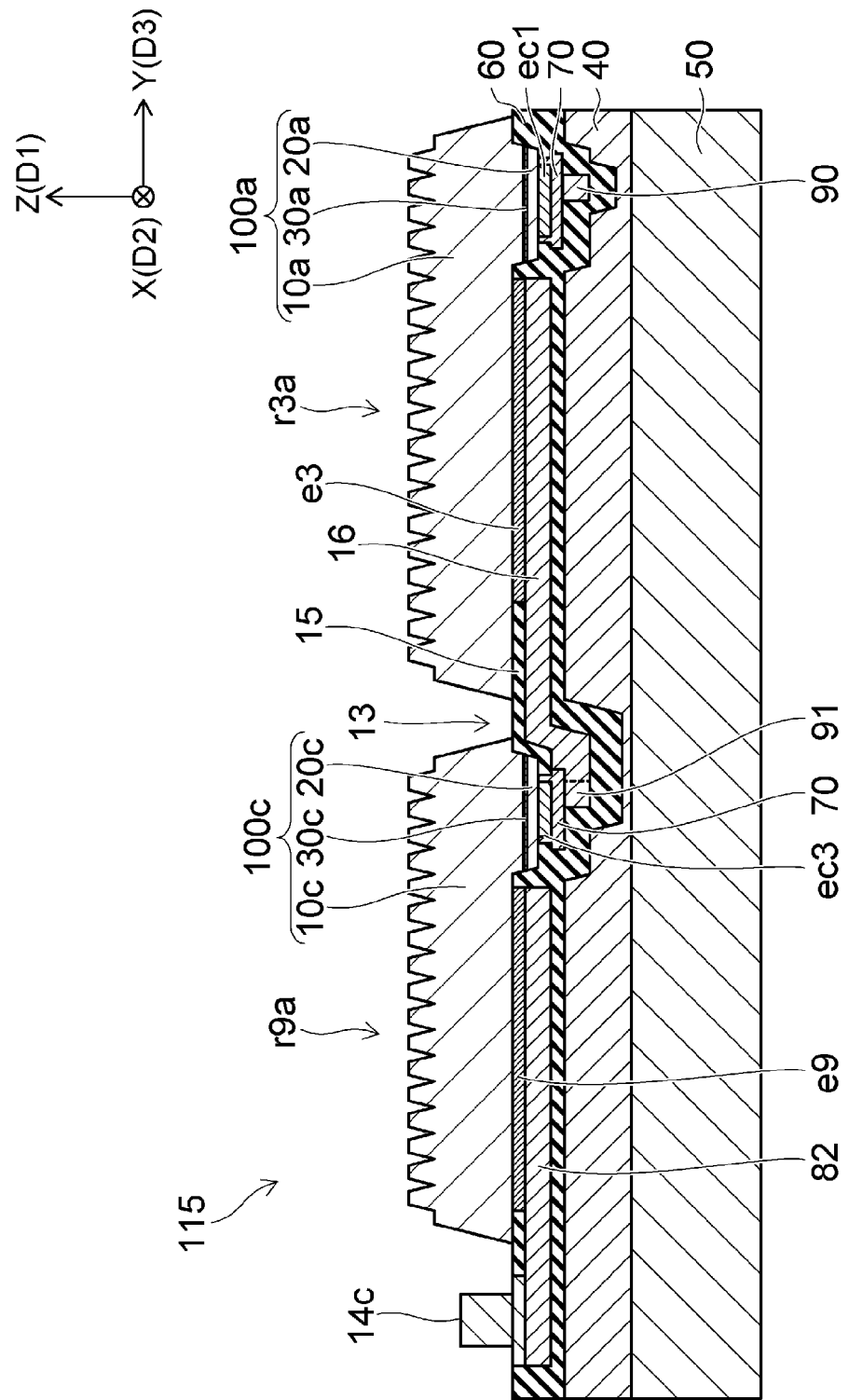
FIG. 23 is a schematic cross-sectional view showing a semiconductor light emitting element according to a sixth embodiment.
Figure 24:
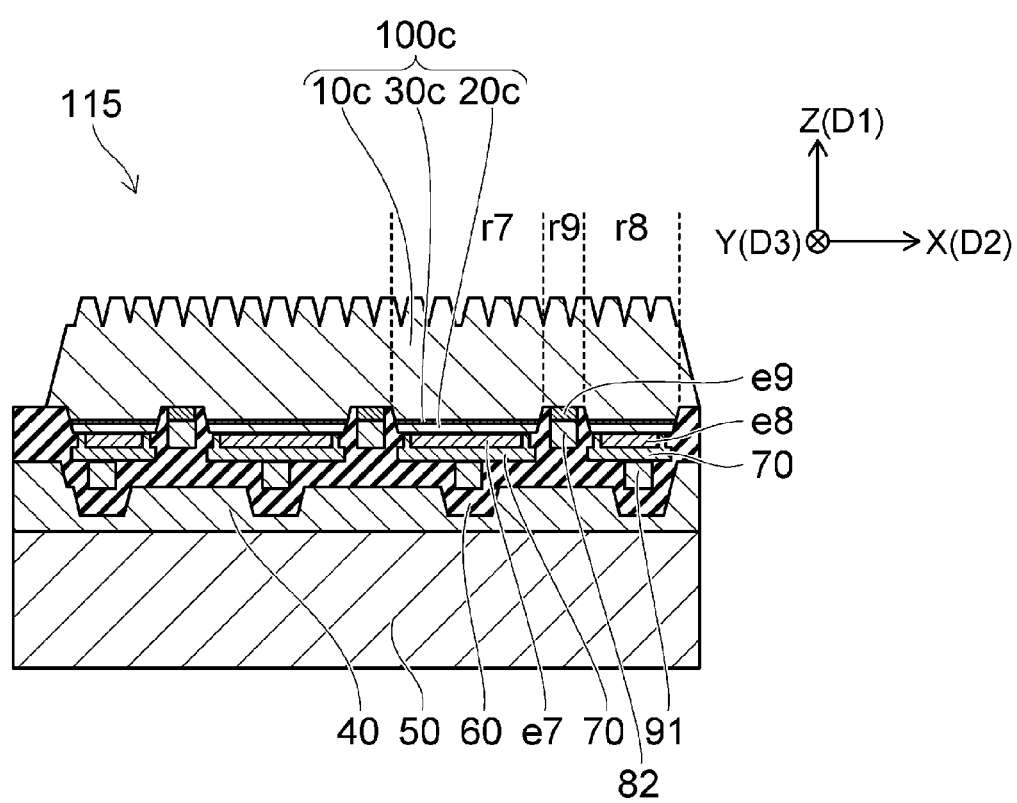
FIG. 24 is a schematic cross-sectional view showing a semiconductor light emitting element according to a sixth embodiment.

FIG. 23 and FIG. 24 are schematic cross-sectional views showing a semiconductor light emitting element according to a sixth embodiment.

FIG. 23 shows another example of the D1-D2 cross section of FIG. 5.

FIG. 24 shows another example of the E1-E2 cross section of FIG. 5.

As shown in the example of FIG. 23 and FIG. 24, the cross-sectional structure of the p-electrode periphery of the semiconductor light emitting element 115 is different from that of the semiconductor light emitting element 111. The second supplemental interconnect section 91 and a portion of the seventh electrode e7 overlap when projected onto the plane perpendicular to the first direction D1. Similarly, the second supplemental interconnect section 91 and a portion of the eighth electrode e8 overlap. The second supplemental interconnect section 91 and a portion of the third linking electrode ec3 overlap. The width of the second supplemental interconnect section 91 is narrower than the width of each of these electrodes. For example, the second supplemental interconnect section 91 is provided in a line configuration.

The peripheral structures of the seventh electrode e7, the eighth electrode e8, and the third linking electrode ec3 are similar to the peripheral structure of the second electrode e2 shown in FIG. 20.

FIG. 25A to FIG. 25D are drawings showing a portion of the semiconductor light emitting element according to the sixth embodiment.

Figure 25:
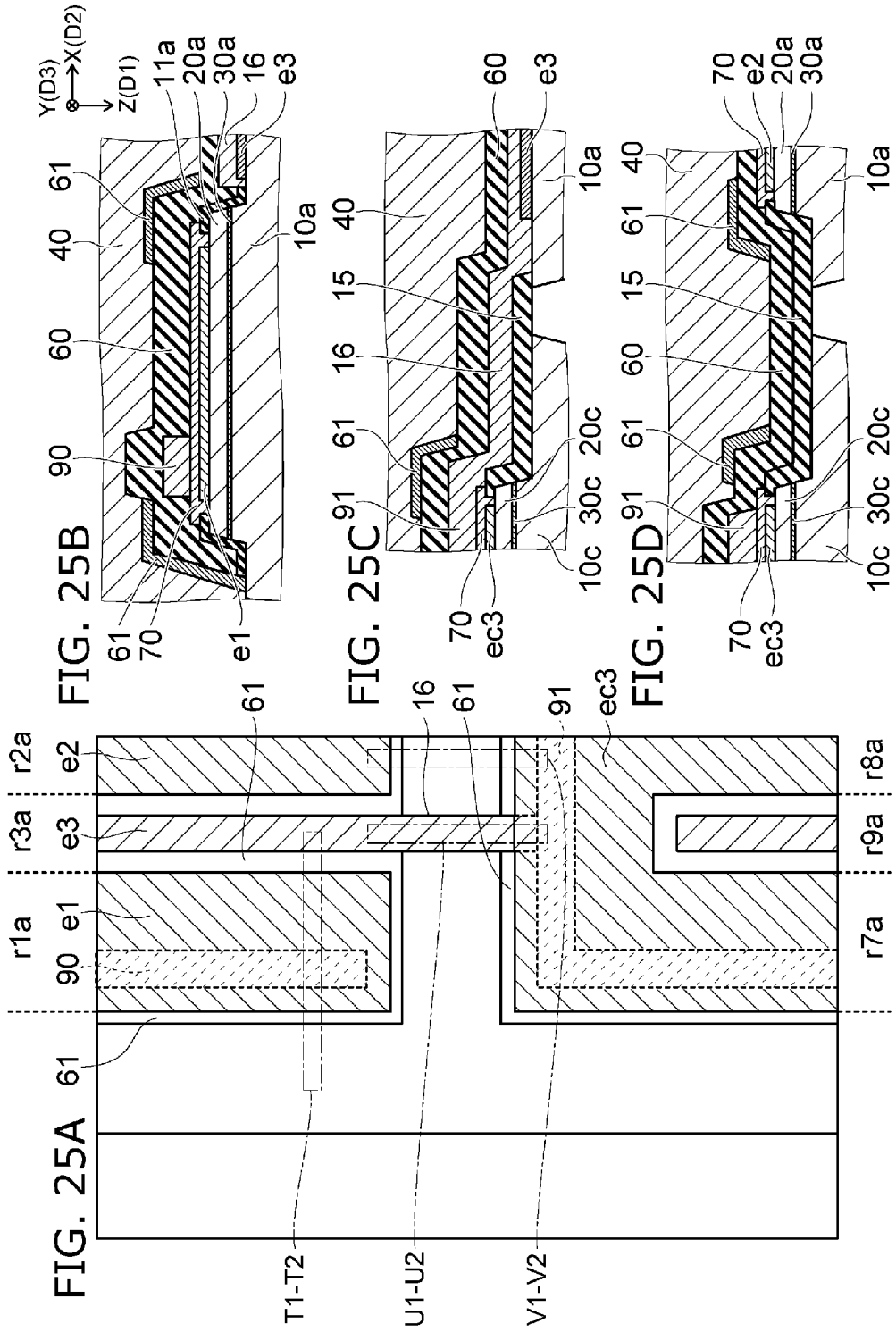
FIG. 25A to FIG. 25D are drawings showing a portion of the semiconductor light emitting element according to the sixth embodiment.

FIG. 25A is a schematic perspective plan view in which portion S of FIG. 5 is enlarged.

FIG. 25B is a schematic cross-sectional view showing another example of the T1-T2 cross section of FIG. 25A.

FIG. 25C is a schematic cross-sectional view showing another example of the U1-U2 cross section of FIG. 25A.

FIG. 25D is a schematic cross-sectional view showing another example of the V1-V2 cross section of FIG. 25A.

(Seventh Embodiment)

Figure 26:
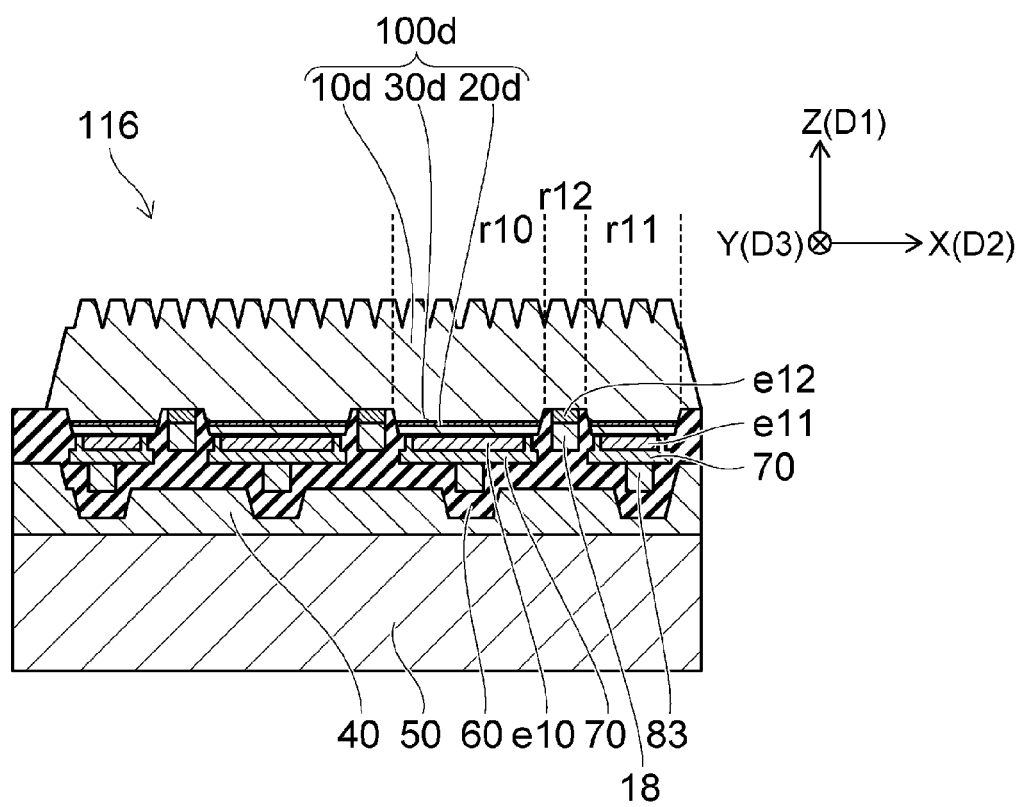
FIG. 26 is a schematic cross-sectional view showing a semiconductor light emitting element according to a seventh embodiment.
Figure 27:
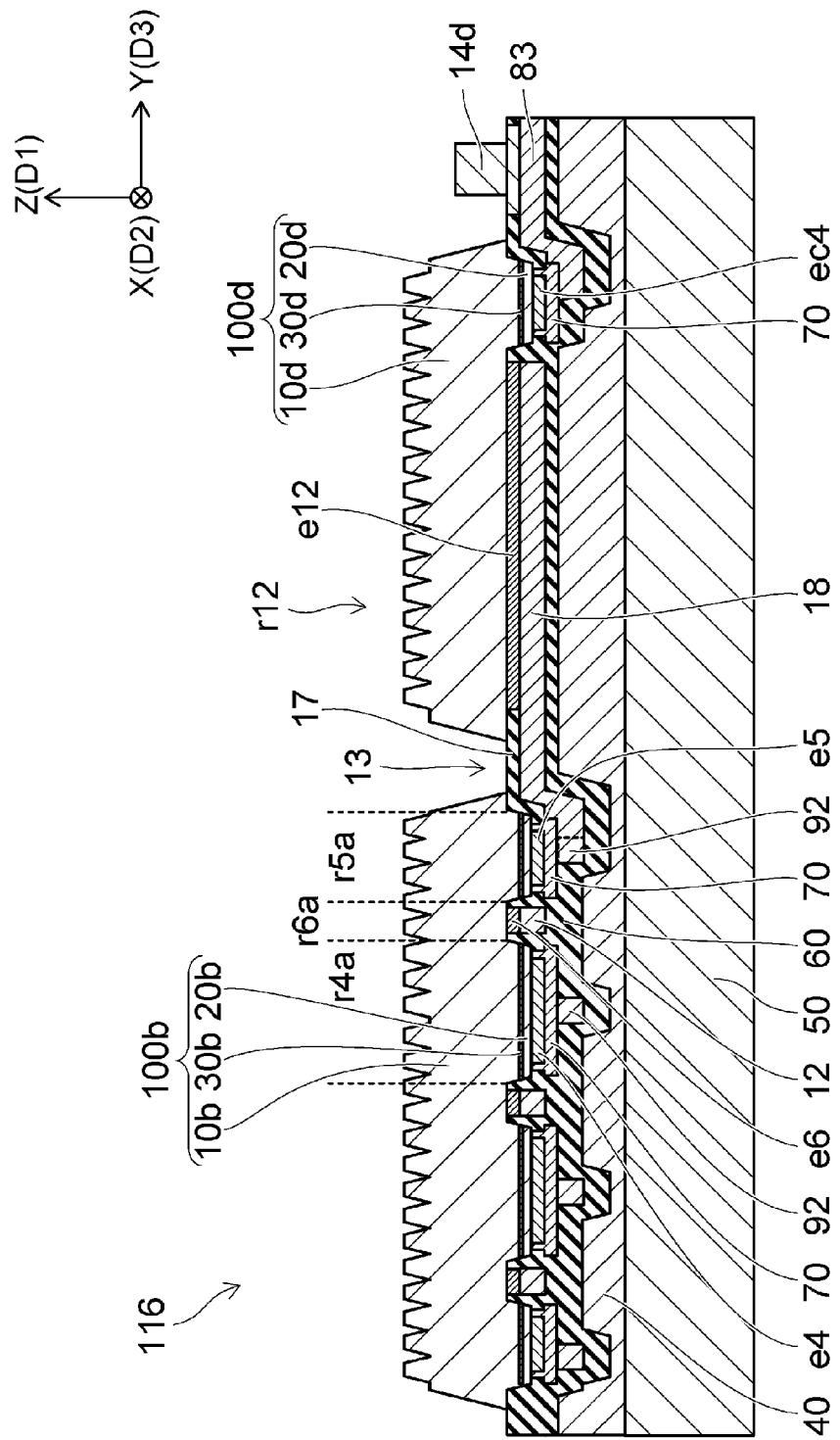
FIG. 27 is a schematic cross-sectional view showing a semiconductor light emitting element according to a seventh embodiment.

FIG. 26 and FIG. 27 are schematic cross-sectional views showing a semiconductor light emitting element according to a seventh embodiment.

FIG. 26 shows another example of the F1-F2 cross section of FIG. 9.

FIG. 27 shows another example of the G1-G2 cross section of FIG. 9.

As shown in the examples of FIG. 26 and FIG. 27, the cross-sectional structure of the p-electrode periphery of the semiconductor light emitting element 116 is different from that of the semiconductor light emitting element 112. The third supplemental interconnect section 92 and a portion of the fourth electrode e4 overlap when projected onto the plane perpendicular to the first direction D1. Similarly, the third supplemental interconnect section 92 and a portion of the fifth electrode e5 overlap. The third supplemental interconnect section 92 and a portion of the second linking electrode ec2 overlap. The width of the third supplemental interconnect section 92 is narrower than the width of each of these electrodes. For example, the third supplemental interconnect section 92 is provided in a line configuration.

The peripheral structures of the tenth electrode e10, the eleventh electrode e11, and the fourth linking electrode ec4 are similar to the peripheral structure of the second electrode e2 shown in FIG. 20.

The second pad interconnect section 83 and a portion of the tenth electrode e10 overlap when projected onto the plane perpendicular to the first direction D1. Similarly, the second pad interconnect section 83 and a portion of the eleventh electrode e11 overlap. The second pad interconnect section 83 and a portion of the fourth linking electrode ec4 overlap. The width of the second pad interconnect section 83 is narrower than the width of each of these electrodes. For example, the second pad interconnect section 83 is provided in a line configuration.

Similarly to the description recited above, the structure of the p-electrode periphery of the semiconductor light emitting element 113 shown in the example of FIG. 12 may be different. The second supplemental interconnect section 91 and a portion of the seventh electrode e7 overlap when projected onto the plane perpendicular to the first direction D1. Similarly, the second supplemental interconnect section 91 and a portion of the eighth electrode e8 overlap. The second supplemental interconnect section 91 and a portion of the third linking electrode ec3 overlap. The width of the second supplemental interconnect section 91 is narrower than the width of each of these electrodes. For example, the second supplemental interconnect section 91 is provided in a line configuration.

The second pad interconnect section 84 and a portion of the first electrode e1 overlap when projected onto the plane perpendicular to the first direction D1. Similarly, the second pad interconnect section 84 and a portion of the second electrode e2 overlap. The second pad interconnect section 84 and a portion of the first linking electrode ec1 overlap. The width of the second pad interconnect section 84 is narrower than the width of each of these electrodes. For example, the second pad interconnect section 84 is provided in a line configuration.

As shown in FIG. 17F, the first supplemental interconnect section 90, the second supplemental interconnect section 91, the first pad interconnect section 82, and the second inter-element interconnect section 16 are formed. For example, vapor deposition and lift-off are used as the method for forming these interconnect sections.

(Eighth Embodiment)

Figure 28:
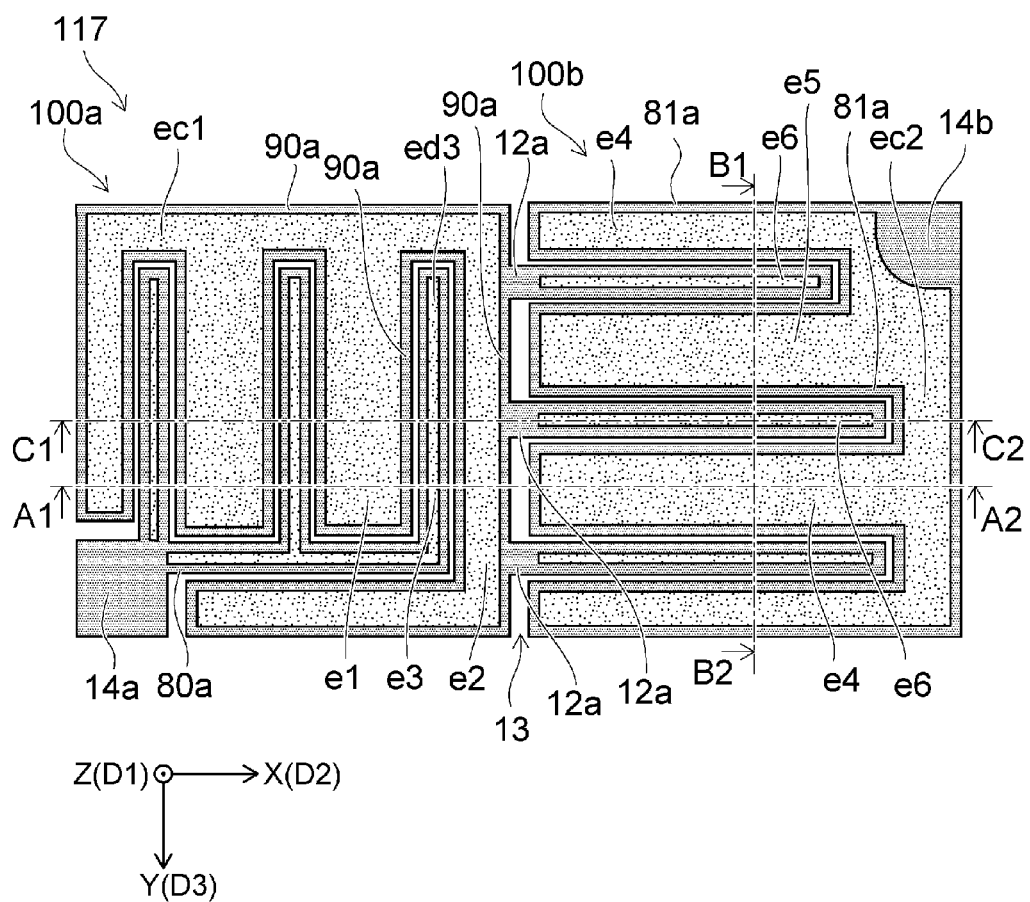
FIG. 28 is a schematic perspective plan view showing a semiconductor light emitting element according to an eighth embodiment.

FIG. 28 is a schematic perspective plan view showing a semiconductor light emitting element according to an eighth embodiment.

FIG. 29A and FIG. 29B are schematic cross-sectional views showing the semiconductor light emitting element according to the eighth embodiment.

FIG. 29A shows an A1-A2 cross section of FIG. 28. FIG. 29B is a drawing in which portion W2 of FIG. 29A is enlarged.

Figure 30:
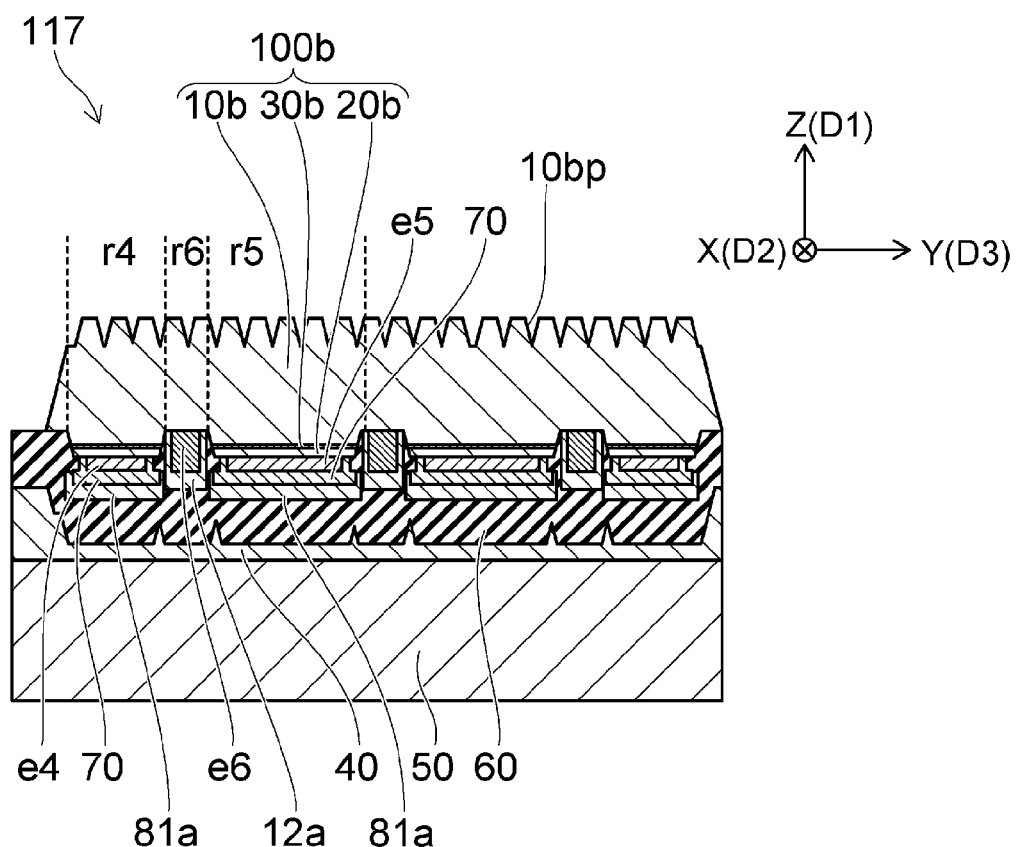
FIG. 30 is a schematic cross-sectional view showing the semiconductor light emitting element according to the eighth embodiment.

FIG. 30 is a schematic cross-sectional view showing the semiconductor light emitting element according to the eighth embodiment.

FIG. 30 shows a B1-B2 cross section of FIG. 28.

FIG. 31A and FIG. 31B are schematic cross-sectional views showing the semiconductor light emitting element according to the eighth embodiment.

FIG. 31A shows a C1-C2 cross section of FIG. 28. FIG. 31B is a drawing in which portion W3 of FIG. 31A is enlarged.

Some of the components shown in the cross-sectional views of FIG. 29A, FIG. 29B, FIG. 30, FIG. 31A, and FIG. 31B are not shown in the perspective plan view of FIG. 28 for easier viewing of the drawing.

The semiconductor light emitting element 117 according to the embodiment includes a first supplemental interconnect section 90a and a second pad interconnect section 81a. In the example, each of these interconnect sections are provided in a planar configuration. In other words, the first supplemental interconnect section 90a and the entire first electrode e1 overlap when projected onto the plane perpendicular to the first direction D1. Similarly, the first supplemental interconnect section 90a and the entire second electrode e2 overlap. The first supplemental interconnect section 90a and the entire first linking electrode ec1 overlap. The width of the first supplemental interconnect section 90a is wider than the width of each of these electrodes. The second pad interconnect section 81a and the entire fourth electrode e4 overlap when projected onto the plane perpendicular to the first direction D1. Similarly, the second pad interconnect section 81a and the entire fifth electrode e5 overlap. The second pad interconnect section 81a and the entire second linking electrode ec2 overlap. The width of the second pad interconnect section 81a is wider than the width of each of these electrodes. The first electrode e1, the second electrode e2, the first linking electrode ec1, the fourth electrode e4, the fifth electrode e5, and the second linking electrode ec2 are p-electrodes.

The semiconductor light emitting element 117 has a structure in which the pad interconnect and the supplemental interconnect on the p-electrode entirely cover the p-electrode and the n-electrode. The unevenness on the p-electrode is eliminated due to the p-electrode being entirely covered. Also, sputtering and etching can be used easily as the method for forming the supplemental interconnect and the pad interconnect due to the p-electrode and the n-electrode being entirely covered.

The semiconductor light emitting element 117 further includes a first pad interconnect section 80a and a first inter-element interconnect section 12a. The first pad interconnect section 80a is formed separately from the third electrode e3 and covers the entire surface (including the side surface) of the third electrode e3. The first inter-element interconnect section 12a is formed separately from the sixth electrode e6 and covers the entire surface of the sixth electrode e6. The third electrode e3 and the sixth electrode e6 are n-electrodes. In the embodiment, it is favorable for the thickness of the n-electrode to be controlled. Thereby, it is possible to planarize the unevenness of the bonding surface with the metal layer 40.

In the example, as shown in FIG. 29B, the protective metal layer 70 covers the second electrode e2. Each of the end portions of the protective metal layer 70 is provided on the insulating layer 11a. The insulating layer 11a is an insulating layer formed at the mesa portion. The first supplemental interconnect section 90a covers the protective metal layer 70. Each of the end portions of the first supplemental interconnect section 90a is provided on the insulating layer 11a. The peripheral structures of the first electrode e1, the first linking electrode ec1, the fourth electrode e4, the fifth electrode e5, and the second linking electrode ec2 are similar to the peripheral structure of the second electrode e2 shown in FIG. 21B. The first pad interconnect section 80a covers the third electrode e3. Each of the end portions of the first pad interconnect section 80a is provided on the insulating layer 11a.

As shown in FIG. 31B, the protective metal layer 70 covers the second electrode e2. One end of the two end portions of the protective metal layer 70 is provided on the insulating layer 11a; and the other end is provided on the first inter-element insulation layer 11. The first supplemental interconnect section 90a is linked to the first inter-element interconnect section 12a. The first supplemental interconnect section 90a covers the protective metal layer 70. One end of the two end portions of the first supplemental interconnect section 90a is provided on the insulating layer 11a; and the other end is provided on the first inter-element insulation layer 11.

In the embodiment, it is possible to form the protective metal layer 70 and the first supplemental interconnect section 90a as a single body.

(Ninth Embodiment)

Figure 32:
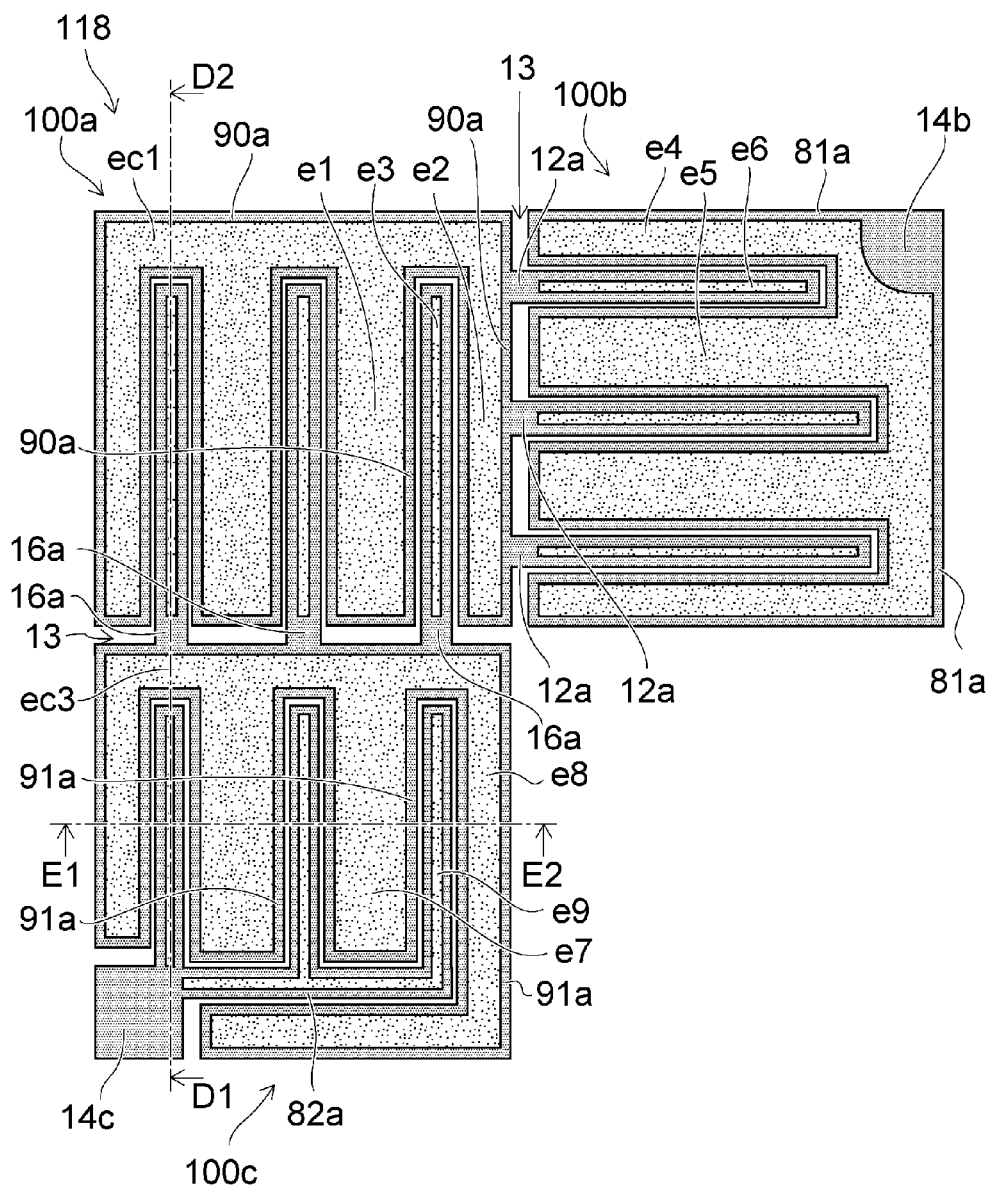
FIG. 32 is a schematic perspective plan view showing a semiconductor light emitting element according to a ninth embodiment.

FIG. 32 is a schematic perspective plan view showing a semiconductor light emitting element according to a ninth embodiment.

Figure 33:
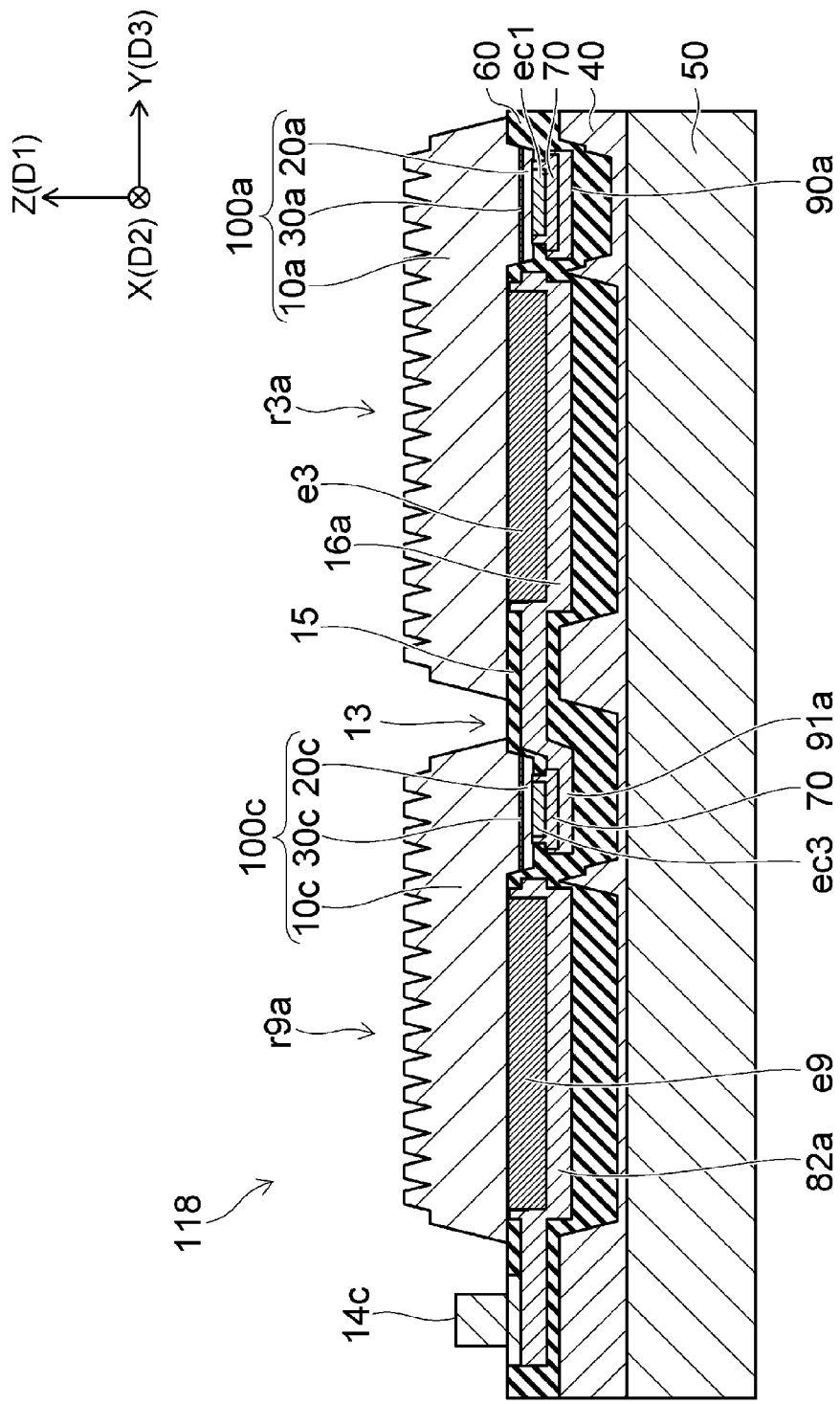
FIG. 33 is a schematic cross-sectional view showing the semiconductor light emitting element according to the ninth embodiment.
Figure 34:
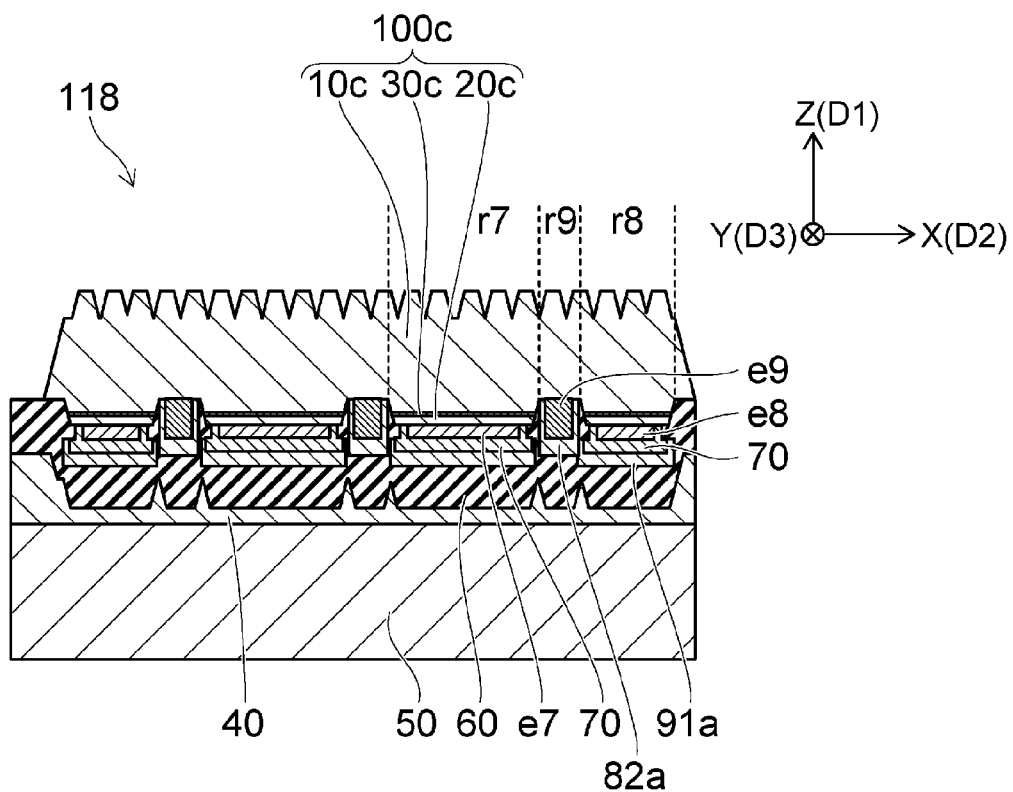
FIG. 34 is a schematic cross-sectional view showing the semiconductor light emitting element according to the ninth embodiment.

FIG. 33 and FIG. 34 are schematic cross-sectional views showing the semiconductor light emitting element according to the ninth embodiment.

FIG. 33 shows a D1-D2 cross section of FIG. 32.

FIG. 34 shows an E1-E2 cross section of FIG. 32.

Some of the components shown in the cross-sectional views of FIG. 33 and FIG. 34 are not shown in the perspective plan view of FIG. 32 for easier viewing of the drawing.

The semiconductor light emitting element 118 according to the embodiment includes the first supplemental interconnect section 90a, a second supplemental interconnect section 91a, and the second pad interconnect section 81a. In the example, each of these interconnect sections is provided in a planar configuration. The first supplemental interconnect section 90a and the second pad interconnect section 81a are as described in the eighth embodiment. The second supplemental interconnect section 91a and the entire seventh electrode e7 overlap when projected onto the plane perpendicular to the first direction D1. Similarly, the second supplemental interconnect section 91a and the entire eighth electrode e8 overlap. The second supplemental interconnect section 91a and the entire third linking electrode ec3 overlap. The width of the second supplemental interconnect section 91a is wider than the width of each of these electrodes. The seventh electrode e7, the eighth electrode e8, and the third linking electrode ec3 are p-electrodes.

The semiconductor light emitting element 118 has a structure in which the pad interconnect and the supplemental interconnect on the p-electrode entirely cover the p-electrode and the n-electrode. The unevenness on the p-electrode is eliminated due to the p-electrode being entirely covered. Also, sputtering and etching can be used easily as the method for forming the supplemental interconnect and the pad interconnect due to the p-electrode and the n-electrode being entirely covered.

The semiconductor light emitting element 118 further includes a first pad interconnect section 82a, the first inter-element interconnect section 12a, and a second inter-element interconnect section 16a. The first inter-element interconnect section 12a is as described in the fifth embodiment. The first pad interconnect section 82a is formed separately from the ninth electrode e9 and covers the entire surface of the ninth electrode e9. The second inter-element interconnect section 16a is formed separately from the third electrode e3 and covers the entire surface of the third electrode e3. The ninth electrode e9 and the third electrode e3 are n-electrodes. In the embodiment, it is favorable for the thickness of the n-electrode to be controlled. Thereby, it is possible to planarize the unevenness of the bonding surface with the metal layer 40.

(Tenth Embodiment)

Figure 35:
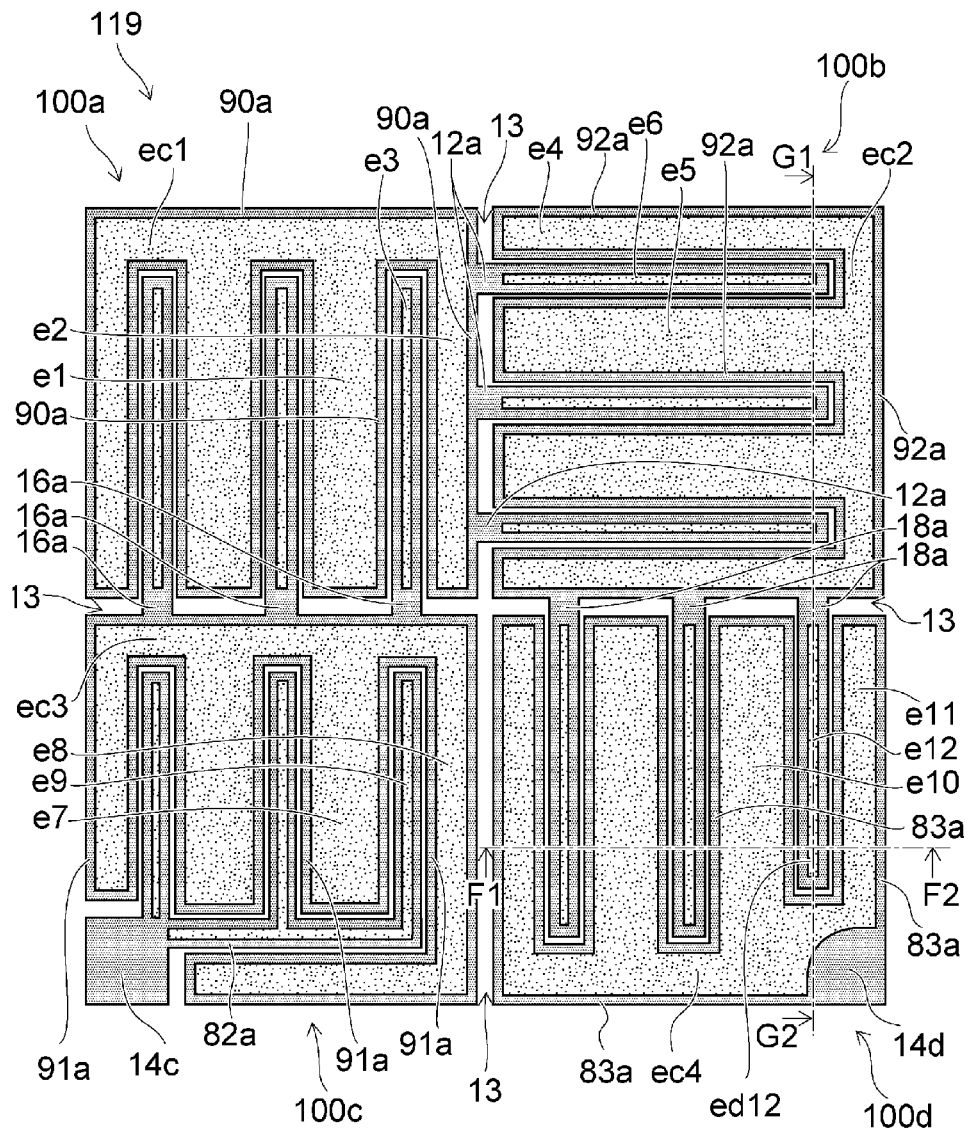
FIG. 35 is a schematic perspective plan view showing a semiconductor light emitting element according to a tenth embodiment.

FIG. 35 is a schematic perspective plan view showing a semiconductor light emitting element according to a tenth embodiment.

Figure 36:
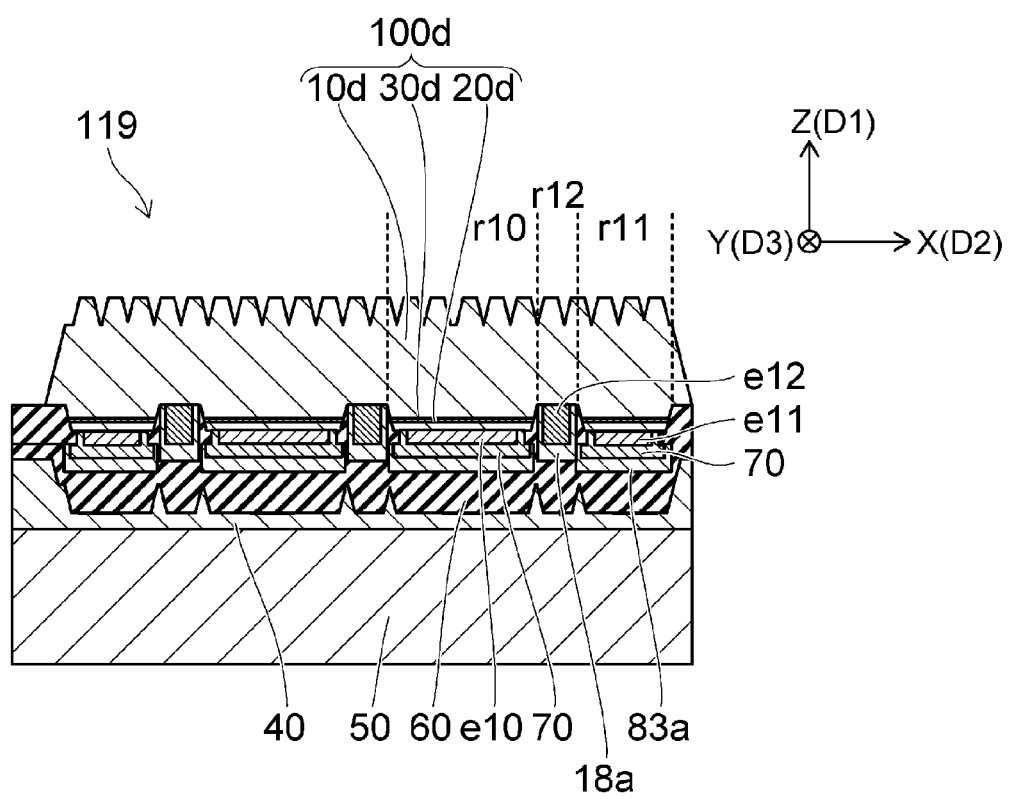
FIG. 36 is a schematic cross-sectional view showing the semiconductor light emitting element according to the tenth embodiment.
Figure 37:
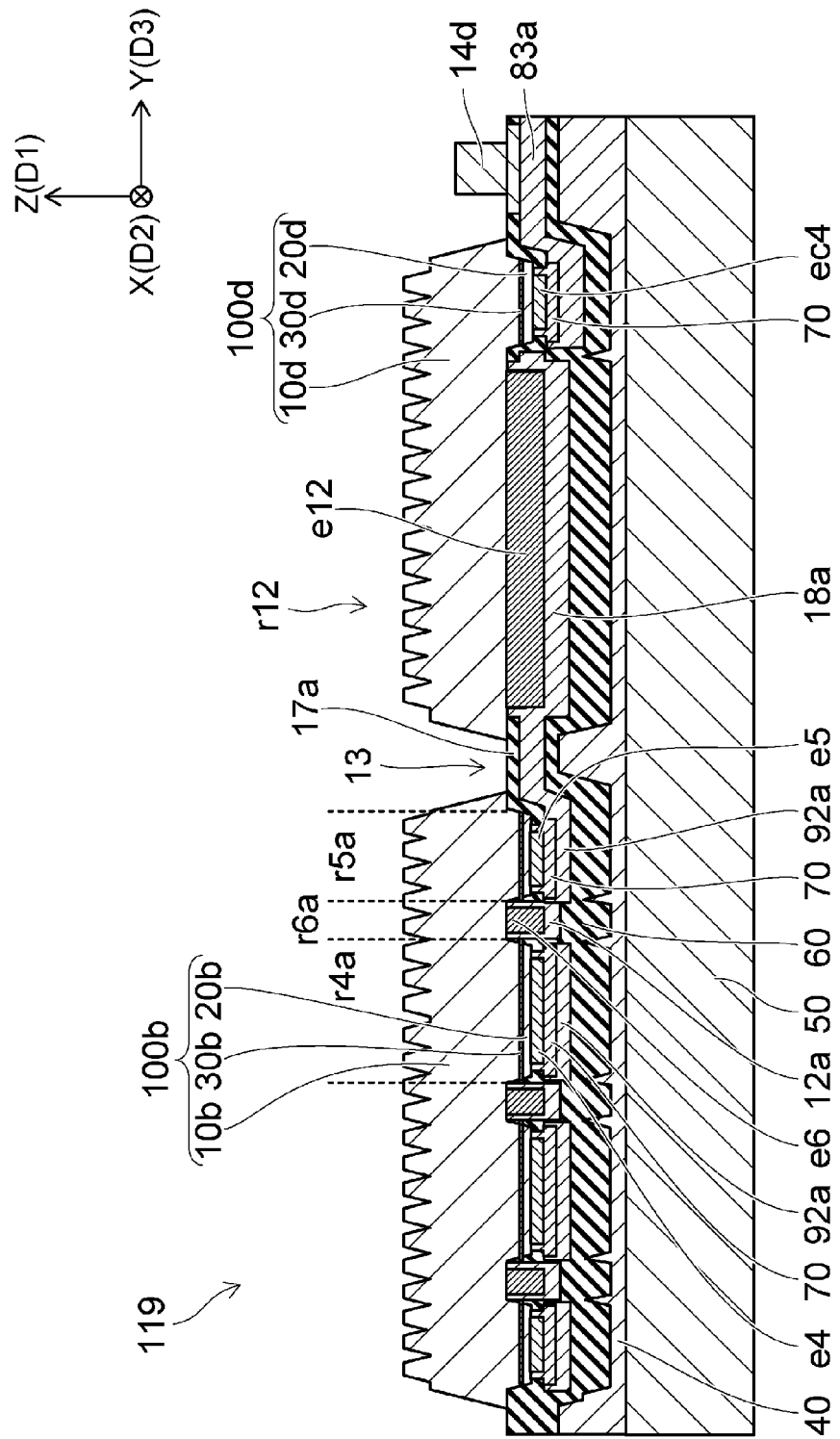
FIG. 37 is a schematic cross-sectional view showing the semiconductor light emitting element according to the tenth embodiment.

FIG. 36 and FIG. 37 are schematic cross-sectional views showing the semiconductor light emitting element according to the tenth embodiment.

FIG. 36 shows an F1-F2 cross section of FIG. 35.

FIG. 37 shows a G1-G2 cross section of FIG. 35.

Some of the components shown in the cross-sectional views of FIG. 36 and FIG. 37 are not shown in the perspective plan view of FIG. 35 for easier viewing of the drawing.

The semiconductor light emitting element 119 according to the embodiment includes the first supplemental interconnect section 90a, the second supplemental interconnect section 91a, a third supplemental interconnect section 92a, and a second pad interconnect section 83a. In the example, each of these interconnect sections is provided in a planar configuration. The first supplemental interconnect section 90a and the second supplemental interconnect section 91a are as described in the eighth and ninth embodiments. The third supplemental interconnect section 92a and the entire fourth electrode e4 overlap when projected onto the plane perpendicular to the first direction D1. Similarly, the third supplemental interconnect section 92a and the entire fifth electrode e5 overlap. The third supplemental interconnect section 92a and the entire second linking electrode ec2 overlap. The width of the third supplemental interconnect section 92a is wider than the width of each of these electrodes. The second pad interconnect section 83a and the entire tenth electrode e10 overlap when projected onto the plane perpendicular to the first direction D1. Similarly, the second pad interconnect section 83a and the entire eleventh electrode e11 overlap. The second pad interconnect section 83a and the entire fourth linking electrode ec4 overlap. The width of the second pad interconnect section 83a is wider than the width of each of these electrodes. The tenth electrode e10, the eleventh electrode e11, and the fourth linking electrode ec4 are p-electrodes.

The semiconductor light emitting element 119 has a structure in which the pad interconnect and the supplemental interconnect on the p-electrode entirely cover the p-electrode and the n-electrode. The unevenness on the p-electrode is eliminated due to the p-electrode being entirely covered. Also, sputtering and etching can be used easily as the method for forming the supplemental interconnect and the pad interconnect due to the p-electrode and the n-electrode being entirely covered.

The semiconductor light emitting element 119 further includes the first pad interconnect section 82a, the first inter-element interconnect section 12a, the second inter-element interconnect section 16a, and a third inter-element interconnect section 18a. The first pad interconnect section 82a, the first inter-element interconnect section 12a, and the second inter-element interconnect section 16a are as described in the eighth and ninth embodiments. The third inter-element interconnect section 18a is formed separately from the twelfth electrode e12 and covers the entire surface of the twelfth electrode e12. The twelfth electrode e12 is an n-electrode. In the embodiment, it is favorable for the thickness of the n-electrode to be controlled. Thereby, it is possible to planarize the unevenness of the bonding surface with the metal layer 40.

(Eleventh Embodiment)

Figure 38:
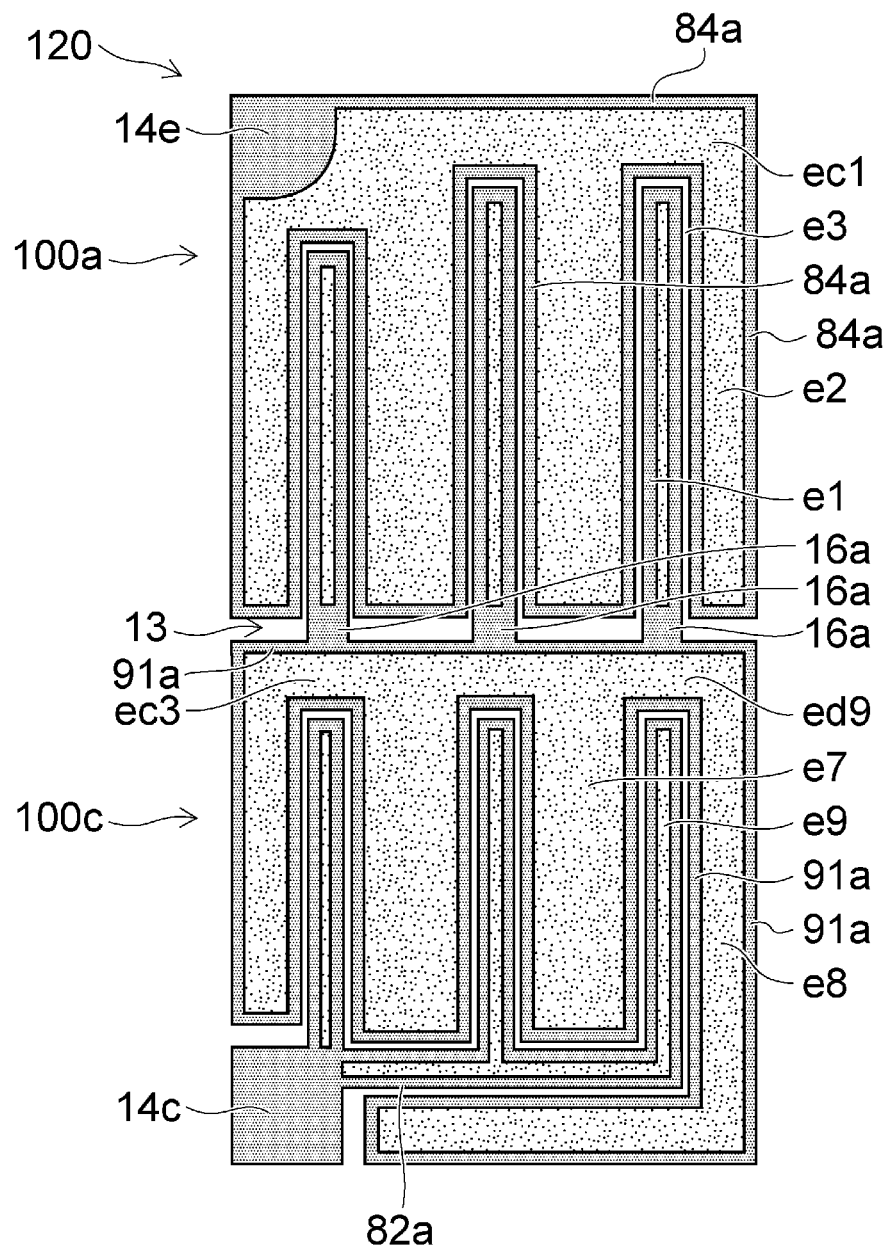
FIG. 38 is a schematic perspective plan view showing a semiconductor light emitting element according to an eleventh embodiment.

FIG. 38 is a schematic perspective plan view showing a semiconductor light emitting element according to an eleventh embodiment.

The semiconductor light emitting element 120 according to the embodiment includes the second supplemental interconnect section 91a and a second pad interconnect section 84a. Each of these interconnect sections is provided in a planar configuration. In other words, the second supplemental interconnect section 91a and the entire seventh electrode e7 overlap when projected onto the plane perpendicular to the first direction D1. Similarly, the second supplemental interconnect section 91a and the entire eighth electrode e8 overlap. The second supplemental interconnect section 91a and the entire third linking electrode ec3 overlap. The width of the second supplemental interconnect section 91a is wider than the width of each of these electrodes. The second pad interconnect section 84a and the entire first electrode e1 overlap when projected onto the plane perpendicular to the first direction D1. Similarly, the second pad interconnect section 84a and the entire second electrode e2 overlap. The second pad interconnect section 84a and the entire first linking electrode ec1 overlap. The width of the second pad interconnect section 84a is wider than the width of each of these electrodes. The seventh electrode e7, the eighth electrode e8, the third linking electrode ec3, the first electrode e1, the second electrode e2, and the first linking electrode ec1 are p-electrodes.

The semiconductor light emitting element 120 has a structure in which the pad interconnect and the supplemental interconnect on the p-electrode entirely cover the p-electrode and the n-electrode. The unevenness on the p-electrode is eliminated due to the p-electrode being entirely covered. Also, sputtering and etching can be used easily as the method for forming the supplemental interconnect and the pad interconnect due to the p-electrode and the n-electrode being entirely covered.

The semiconductor light emitting element 120 further includes the first pad interconnect section 82a and the second inter-element interconnect section 16a. The first pad interconnect section 82a is formed separately from the ninth electrode e9 and covers the entire surface of the ninth electrode e9. The second inter-element interconnect section 16a is formed separately from the third electrode e3 and covers the entire surface of the third electrode e3. The ninth electrode e9 and the third electrode e3 are n-electrodes. In the embodiment, it is favorable for the thickness of the n-electrode to be controlled. Thereby, it is possible to planarize the unevenness of the bonding surface with the metal layer 40.

According to the embodiments, a highly efficient semiconductor light emitting element can be provided.

In the specification, "nitride semiconductor" includes all compositions of semiconductors of the chemical formula $B_xIn_yAl_zGa_{1-x-y-z}N$ (0 ≦ x ≦ 1, 0 ≦ y ≦ 1, 0 ≦ z ≦ 1, and x+y+z ≦ 1) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting element such as the metal layers, the semiconductor layers, the light emitting layers, the electrodes, the inter-element interconnect section, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting elements practicable by an appropriate design modification by one skilled in the art based on the semiconductor light emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

REFERENCE SIGNS LIST

10a . . . first semiconductor layer, 10b . . . third semiconductor layer, 10c . . . fifth semiconductor layer, 10d . . . seventh semiconductor layer, 10f . . . first semiconductor film, 10ap,10bp,10p . . . unevenness, 11 . . . first inter-element insulation layer, 11a . . . insulating layer, 12, 12a . . . first inter-element interconnect section, 13 . . . separation trench, 14a,14c . . . first pad section, 14b,14d, 14e . . . second pad section, 15 . . . second inter-element insulation layer, 15f . . . insulating film, 16,16a . . . second inter-element interconnect section, 17 . . . third inter-element insulation layer, 18,18a . . . third inter-element interconnect section, 19 . . . mesa, 20a . . . second semiconductor layer, 20b . . . fourth semiconductor layer, 20c . . . sixth semiconductor layer, 20d . . . eighth semiconductor layer, 20f . . . second semiconductor film, 21 . . . inter-element interconnect section, 30a to 30d . . . first to fourth light emitting layer, 30f . . . light emitting film, 40 . . . metal layer, 50 . . . base body 50u . . . support unit, 51 . . . growth substrate, 52 . . . buffer layer, 60 . . . insulating layer, 61 . . . reflective layer, 70 . . . protective metal layer, 80,80a,82,82a . . . first pad interconnect section, 81,81a,83, 83a,84,84a . . . second pad interconnect section, 90, 90a . . . first supplemental interconnect section, 91,91a . . . second supplemental interconnect section, 92,92a . . . third supplemental interconnect section, 100a to 100d . . . first to fourth stacked body, 110 to 113,114 to 120 . . . semiconductor light emitting element, e1 to e12 . . . first to twelfth electrode, ec1 to ec7 . . . first to seventh linking electrode, r1 to r12 . . . first to twelfth region

The invention claimed is:
1. A semiconductor light emitting element, comprising:
a metal layer;
a first semiconductor layer of a first conductivity type separated from the metal layer in the first direction, the first semiconductor layer including a first region, a second region, and a third region, the second region being separated from the first region in a second direction intersecting the first direction, the first region, the second region, and the third region extending in a third direction intersecting the first direction and the second direction, the third region being provided between the first region and the second region;
a second semiconductor layer of a second conductivity type provided between the first region and the metal layer and between the second region and the metal layer;
a first light emitting layer provided between the first region and the second semiconductor layer and between the second region and the second semiconductor layer;
a third semiconductor layer of the first conductivity type separated from the metal layer in the first direction and arranged with the first semiconductor layer in the second direction, the third semiconductor layer including a fourth region, a fifth region, and a sixth region, the fifth region being separated from the fourth region in the third direction, the fourth region, the fifth region, and the sixth region extending in the second direction, the sixth region being provided between the fourth region and the fifth region;
a fourth semiconductor layer of the second conductivity type provided between the fourth region and the metal layer and between the fifth region and the metal layer;
a second light emitting layer provided between the fourth region and the fourth semiconductor layer and between the fifth region and the fourth semiconductor layer;
a first electrode provided between the second semiconductor layer and the metal layer in the first region and electrically connected to the second semiconductor layer;
a second electrode provided between the second semiconductor layer and the metal layer in the second region and electrically connected to the second semiconductor layer;
a third electrode provided between the third region and the metal layer and electrically connected to the third region;

a fourth electrode provided between the fourth semiconductor layer and the metal layer in the fourth region and electrically connected to the fourth semiconductor layer;
a fifth electrode provided between the fourth semiconductor layer and the metal layer in the fifth region and electrically connected to the fourth semiconductor layer;
a sixth electrode provided between the sixth region and the metal layer and electrically connected to the sixth region; and
a first inter-element interconnect section provided between the second electrode and the metal layer and between the sixth electrode and the metal layer, the first inter-element interconnect section electrically connecting the second electrode to the sixth electrode.

2. The semiconductor light emitting element according to claim 1, further comprising a first linking electrode provided between the second semiconductor layer and the metal layer, the first linking electrode linking the first electrode to the second electrode.

3. The semiconductor light emitting element according to claim 2, further comprising a first supplemental interconnect section provided between the first electrode and the metal layer, between the second electrode and the metal layer, and between the first linking electrode and the metal layer, the first supplemental interconnect section being electrically connected to the first electrode, the second electrode, and the first linking electrode.

4. The semiconductor light emitting element according to claim 1, further comprising:
a first pad section overlapping the metal layer and not overlapping the first semiconductor layer when projected onto a plane perpendicular to the first direction; and
a first pad interconnect section electrically connecting the first pad section to the third electrode.

5. The semiconductor light emitting element according to claim 1, further comprising a second linking electrode provided between the fourth semiconductor layer and the metal layer, the second linking electrode linking the fourth electrode to the fifth electrode.

6. The semiconductor light emitting element according to claim 5, further comprising:
a second pad section overlapping the metal layer and not overlapping the third semiconductor layer when projected onto a plane perpendicular to the first direction; and
a second pad interconnect section electrically connecting the second pad section to the fourth electrode, the second pad section to the fifth electrode, and the second pad section to the second linking electrode.

7. The semiconductor light emitting element according to claim 1, further comprising:
a fifth semiconductor layer of the first conductivity type separated from the metal layer in the first direction and arranged with the first semiconductor layer in the third direction, the fifth semiconductor layer including a seventh region, an eighth region, and a ninth region, the eighth region being separated from the seventh region in the second direction, the seventh region, the eighth region, and the ninth region extending in the third direction, the ninth region being provided between the seventh region and the eighth region;
a sixth semiconductor layer of the second conductivity type provided between the seventh region and the metal layer and between the eighth region and the metal layer;
a third light emitting layer provided between the seventh region and the sixth semiconductor layer and between the eighth region and the sixth semiconductor layer;
a seventh electrode provided between the sixth semiconductor layer and the metal layer in the seventh region, the seventh electrode being electrically connected to the sixth semiconductor layer;
an eighth electrode provided between the sixth semiconductor layer and the metal layer in the eighth region and electrically connected to the sixth semiconductor layer;
a ninth electrode provided between the ninth region and the metal layer and electrically connected to the ninth region;
a third linking electrode provided between the sixth semiconductor layer and the metal layer, the third linking electrode linking the seventh electrode to the eighth electrode; and
a second inter-element interconnect section provided between the third electrode and the metal layer and between the third linking electrode and the metal layer, the second inter-element interconnect section electrically connecting the third electrode to the third linking electrode.

8. The semiconductor light emitting element according to claim 7, further comprising a second supplemental interconnect section provided between the seventh electrode and the metal layer, between the eighth electrode and the metal layer, and between the third linking electrode and the metal layer, the second supplemental interconnect section being electrically connected to the seventh electrode, the eighth electrode, and the third linking electrode.

9. The semiconductor light emitting element according to claim 7, further comprising:
a first pad section overlapping the metal layer and not overlapping the fifth semiconductor layer when projected onto a plane perpendicular to the first direction; and
a first pad interconnect section electrically connecting the first pad section to the ninth electrode.

10. The semiconductor light emitting element according to claim 7, further comprising:
a second linking electrode provided between the fourth semiconductor layer and the metal layer, the second linking electrode linking the fourth electrode to the fifth electrode;
a second pad section overlapping the metal layer and not overlapping the third semiconductor layer when projected onto a plane perpendicular to the first direction; and
a second pad interconnect section electrically connecting the second pad section to the fourth electrode, the second pad section to the fifth electrode, and the second pad section to the second linking electrode.

11. The semiconductor light emitting element according to claim 7, further comprising:
a seventh semiconductor layer of the first conductivity type separated from the metal layer in the first direction and arranged with the third semiconductor layer in the third direction, the seventh semiconductor layer including a tenth region, an eleventh region, and a twelfth region, the eleventh region being separated from the tenth region in the second direction, the tenth region, the eleventh region, and the twelfth region extending in the third direction, the twelfth region being provided between the tenth region and the eleventh region;

an eighth semiconductor layer of the second conductivity type provided between the tenth region and the metal layer and between the eleventh region and the metal layer;

a fourth light emitting layer provided between the tenth region and the eighth semiconductor layer and between the eleventh region and the eighth semiconductor layer;

a tenth electrode provided between the eighth semiconductor layer and the metal layer in the tenth region and electrically connected to the eighth semiconductor layer;

an eleventh electrode provided between the eighth semiconductor layer and the metal layer in the eleventh region and electrically connected to the eighth semiconductor layer;

a twelfth electrode provided between the twelfth region and the metal layer and electrically connected to the twelfth region; and a third inter-element interconnect section provided between the fifth electrode and the metal layer and between the twelfth electrode and the metal layer, the third inter-element interconnect section electrically connecting the fifth electrode to the twelfth electrode.

12. The semiconductor light emitting element according to claim 11, further comprising:

a second linking electrode provided between the fourth semiconductor layer and the metal layer, the second linking electrode linking the fourth electrode to the fifth electrode; and a third supplemental interconnect section provided between the fourth electrode and the metal layer, between the fifth electrode and the metal layer, and between the second linking electrode and the metal layer, the third supplemental interconnect section being electrically connected to the fourth electrode, the fifth electrode, and the second linking electrode.

13. The semiconductor light emitting element according to claim 11, further comprising:

a first pad section overlapping the metal layer and not overlapping the fifth semiconductor layer when projected onto a plane perpendicular to the first direction; and a first pad interconnect section electrically connecting the first pad to the ninth electrode.

14. The semiconductor light emitting element according to claim 11, further comprising a fourth linking electrode provided between the eighth semiconductor layer and the metal layer, the fourth linking electrode linking the tenth electrode to the eleventh electrode.

15. The semiconductor light emitting element according to claim 14, further comprising:

a second pad section overlapping the metal layer and not overlapping the seventh semiconductor layer when projected onto a plane perpendicular to the first direction; and a second pad interconnect section electrically connecting the second pad section to the tenth electrode, the second pad section to the eleventh electrode, and the second pad section to the fourth linking electrode.

16. The semiconductor light emitting element according to claim 1, further comprising:

a base body; and an insulating layer provided between the metal layer and the first inter-element interconnect section, the metal layer being provided between the base body and the insulating layer.

17. The semiconductor light emitting element according to claim 16, further comprising a reflective layer provided partially between the metal layer and the insulating layer.

18. The semiconductor light emitting element according to claim 1, further comprising a first inter-element insulation layer provided between the first inter-element interconnect section and a portion of the first semiconductor layer.

19. The semiconductor light emitting element according to claim 1, wherein a light reflectance of the first inter-element interconnect section is higher than the light reflectance of the metal layer.

20. A semiconductor light emitting element, comprising:

a metal layer;

a first semiconductor layer of a first conductivity type separated from the metal layer in a first direction, the first semiconductor layer including a first region, a second region, and a third region, the second region being separated from the first region in a second direction intersecting the first direction, the first region, the second region, and the third region extending in a third direction intersecting the first direction and the second direction, the third region being provided between the first region and the second region;

a second semiconductor layer of a second conductivity type provided between the first region and the metal layer and between the second region and the metal layer;

a first light emitting layer provided between the first region and the second semiconductor layer and between the second region and the second semiconductor layer;

a fifth semiconductor layer of the first conductivity type separated from the metal layer in the first direction and arranged with the first semiconductor layer in the third direction, the fifth semiconductor layer including a seventh region, an eighth region, and a ninth region, the eighth region being separated from the seventh region in the second direction, the seventh region, the eighth region, and the ninth region extending in the third direction, the ninth region being provided between the seventh region and the eighth region;

a sixth semiconductor layer of the second conductivity type provided between the seventh region and the metal layer and between the eighth region and the metal layer;

a third light emitting layer provided between the seventh region and the sixth semiconductor layer and between the eighth region and the sixth semiconductor layer;

a first electrode provided between the second semiconductor layer and the metal layer in the first region and electrically connected to the second semiconductor layer;

a second electrode provided between the second semiconductor layer and the metal layer in the second region and electrically connected to the second semiconductor layer;

a third electrode provided between the third region and the metal layer and electrically connected to the third region;

a seventh electrode provided between the sixth semiconductor layer and the metal layer in the seventh region and electrically connected to the sixth semiconductor layer;

an eighth electrode provided between the sixth semiconductor layer and the metal layer in the eighth region and electrically connected to the sixth semiconductor layer;
a ninth electrode provided between the ninth region and the metal layer and electrically connected to the ninth region;
a third linking electrode provided between the sixth semiconductor layer and the metal layer, the third linking electrode linking the seventh electrode to the eighth electrode; and
a second inter-element interconnect section provided between the third electrode and the metal layer and between the third linking electrode and the metal layer, the second inter-element interconnect section electrically connecting the third electrode to the third linking electrode.

* * * * *